(12) United States Patent
Yamazaki et al.

(10) Patent No.: US 8,592,814 B2
(45) Date of Patent: Nov. 26, 2013

(54) DEVICE WITH OXIDE SEMICONDUCTOR THIN FILM TRANSISTOR

(75) Inventors: Shunpei Yamazaki, Setagaya (JP); Hideaki Shishido, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 318 days.

(21) Appl. No.: 12/887,606

(22) Filed: Sep. 22, 2010

(65) Prior Publication Data

US 2011/0068334 A1    Mar. 24, 2011

(30) Foreign Application Priority Data

Sep. 24, 2009   (JP) ................................. 2009-218998

(51) Int. Cl.
  *H01L 29/04*   (2006.01)
(52) U.S. Cl.
  USPC .................. 257/59; 257/43; 438/49
(58) Field of Classification Search
  USPC ........................................................... 257/59
  See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,489,952 B1 | 12/2002 | Tanaka et al. | |
| 6,563,174 B2 | 5/2003 | Kawasaki et al. | |
| 6,635,505 B2 | 10/2003 | Tanaka et al. | |
| 6,727,522 B1 | 4/2004 | Kawasaki et al. | |
| 6,847,422 B2 | 1/2005 | Zhang et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,198,967 B2 | 4/2007 | Tanaka et al. | |
| 7,211,825 B2 | 5/2007 | Shih et al | |

(Continued)

FOREIGN PATENT DOCUMENTS

| | | |
|---|---|---|
| EP | 1737044 A | 12/2006 |
| EP | 1 770 788 | 4/2007 |

(Continued)

OTHER PUBLICATIONS

Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.

(Continued)

*Primary Examiner* — Ajay K Arora
(74) *Attorney, Agent, or Firm* — Eric J. Robinson; Robinson Intellectual Property Law Office, P.C.

(57) ABSTRACT

Disclosed is a semiconductor device which consumes low power and has high reliability and tolerance for electrostatic discharge. The semiconductor device includes, over a first substrate, a pixel portion and a driver circuit portion both of which have a thin film transistor having an oxide semiconductor layer. The semiconductor device further possesses a second substrate to which a first counter electrode layer and a second counter electrode layer are provided, and a liquid crystal layer is interposed between the first and second substrates. The first and second counter electrode layers are provided over the pixel portion and the driver circuit portion, respectively, and the second counter electrode layer has the same potential as the first counter electrode layer.

35 Claims, 20 Drawing Sheets

(56) References Cited

U.S. PATENT DOCUMENTS

| | | | |
|---|---|---|---|
| 7,282,782 B2 | 10/2007 | Hoffman et al. |
| 7,297,977 B2 | 11/2007 | Hoffman et al. |
| 7,298,437 B2 | 11/2007 | Edwards et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,544,981 B2 | 6/2009 | Tanaka et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0137621 A1 | 7/2003 | Zhang et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0088589 A1 * | 4/2005 | Edwards et al. ............. 349/110 |
| 2005/0199959 A1 | 9/2005 | Chiang et al. |
| 2006/0012729 A1 * | 1/2006 | Tanaka et al. ................... 349/54 |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0239335 A1 | 9/2009 | Akimoto et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0051937 A1 | 3/2010 | Kaji et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0136743 A1 | 6/2010 | Akimoto et al. |
| 2011/0102697 A1 | 5/2011 | Koyama et al. |

FOREIGN PATENT DOCUMENTS

| | | |
|---|---|---|
| EP | 1 995 787 | 11/2008 |
| EP | 1 998 373 | 12/2008 |
| EP | 1 998 374 | 12/2008 |
| EP | 1 998 375 | 12/2008 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 | 9/1993 |
| JP | 06-258661 A | 9/1994 |
| JP | 08-264794 | 10/1996 |
| JP | 11-505377 | 5/1999 |
| JP | 11-202366 A | 7/1999 |
| JP | 2000-044236 A | 2/2000 |
| JP | 2000-150900 | 5/2000 |
| JP | 2002-076356 A | 3/2002 |
| JP | 2002-289859 A | 10/2002 |
| JP | 2003-086000 | 3/2003 |
| JP | 2003-086808 | 3/2003 |
| JP | 2003-202589 | 7/2003 |
| JP | 2004-004526 A | 1/2004 |
| JP | 2004004526 A * | 1/2004 |
| JP | 2004-103957 | 4/2004 |
| JP | 2004-273614 A | 9/2004 |
| JP | 2004-273732 A | 9/2004 |
| JP | 2006-261493 | 9/2006 |
| JP | 2007-096055 | 4/2007 |
| JP | 2007-123861 | 5/2007 |
| JP | 2008-218495 | 9/2008 |
| WO | WO 2004/114391 | 12/2004 |
| WO | 2008/105250 | 9/2008 |

OTHER PUBLICATIONS

International Search Report (Application No. PCT/JP2010/064854) dated Nov. 9, 2010.

Written Opinion Application No. PCT/JP2010/064854) dated Nov. 9, 2010.

Fortunato.E et al., "Wide-Bandgap High-Mobility ZnO Thin-Film Transistors Produced at Room Temperature,", Appl. Phys. Lett. (Applied Physics Leters), Sep. 27, 2004, vol. 85, No. 13, pp. 2541-2543.

Park.J et al., "Improvements in the Device Characteristics of Amorphous Indium Gallium Zinc Oxide Thin-Film Transistors by Ar

(56) References Cited

OTHER PUBLICATIONS

Plasma Treatment,", Appl. Phys. Lett. (Applied Physics Letters), Jun. 26, 2007, vol. 90, No. 26, pp. 262106-1-262106-3.
Hayashi.R et al., "42.1: Invited Paper: Improved Amorphous In—Ga—Zn—O TFTs,", SID Digest '08: SID International Symposium Digest of Technical Papers, May 20, 2008, vol. 39, pp. 621-624.
Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.
Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.
Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.
Son.K et al., "42.4L: Late-News Paper: 4 Inch QVGA AMOLED Driven by the Threshold Voltage Controlled Amorphous GIZO (Ga2O3-In2O3-ZnO)TFT,", SID Digest '08: SID International Symposium Digest of Technical Papers, May 20, 2008, vol. 39, pp. 633-636.
Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.
Nakamura, M., "Synthesis of Homologous Compound with New Long-Period Structure,", NIRIM Newsletter, Mar. 1, 1995, vol. 150, pp. 1-4.
Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.
Orita.M et al., "Mechanism of Electrical Conductivity of Transparent InGaZnO4,", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.
Janotti.A et al., "Native Point Defects in ZnO,", Phys. Rev. B (Physical Review. B), 2007, vol. 76, pp. 165202-1-165202-22.
Park.J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.
Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.
Janotti.A et al., "Oxygen Vacancies in ZnO,", Appl. Phys. Lett. (Applied Physics Letters), 2005, vol. 87, pp. 122102-1-122102-3.
Oba.F et al., "Defect energetics in ZnO: A hybrid Hartree-Fock density functional study,", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor,", Philosophical Magazine, 2001, vol. 81, No. 5, pp. 501-515.
Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317.
Clark.S et al., "First Principles Methods Using CASTEP,", Zeitschrift fur Kristallographie, 2005, vol. 220, pp. 567-570.
Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.
Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.
Ueno.K et al., "Field-Effect Transistor on SrTiO3 with Sputtered Al2O3 Gate Insulator,", Appl. Phys. Lett. (Applied Physics Letters), Sep. 1, 2003, vol. 83, No. 9, pp. 1755-1757.
Kimizuka et al., "Spinel, $YbFe_2O_4$, and $Yb_2Fe_3O_7$ Types of Structures for Compounds in the $In_2O_3$ and $Sc_2O_3$-$A_2O_3$-BO Systems [A: Fe, Ga, or Al; B: Mg, Mn, Fe, Ni, Cu, or Zn] at Temperatures Over 1000° C." Journal of Solid State Chemistry, 1985, vol. 60, pp. 382-384.
Kimizuka et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$(m=7, 8, 9, and 16) in the $In_2O_3$—$ZnGa_2O_4$—ZnO System," Journal of Solid State Chemistry, Apr. 1, 1995, vol. 116, No. 1, pp. 170-178.
Nakamura et al., "The Phase Relations in the $In_2O_3$—$Ga_2ZnO_4$—ZnO System at 1350° C.," Journal of Solid State Chemistry, Aug. 1, 1991, vol. 93, No. 2, pp. 298-315.
Li et al., "Modulated Structures of Homologous Compounds $InMO_3(ZnO)_m$ (M=In,Ga; m=Integer) Described by Four-Dimensional Superspace Group," Journal of Solid State Chemistry, 1998, vol. 139, pp. 347-355.
Nomura et al., "Room-Temperature Fabrication of Transparent Flexible Thin-Film Transistors Using Amorphous Oxide Semiconductors," Nature, Nov. 25, 2004, vol. 432, pp. 488-492.
Nomura et al., "Thin-Film Transistor Fabricated in Single-Crystalline Transparent Oxide Semiconductor," Science, May 23, 2003, vol. 300, No. 5623, pp. 1269-1272.
Lee et al., "Current Status of, Challenges to, and Perspective View of AM-OLED," IDW '06: Proceedings of the 13th International Display Workshops, Dec. 7, 2006, pp. 663-666.
Jeong et al., "3.1: Distinguished Paper: 12.1-Inch WXGA AMOLED Display Driven by Indium-Gallium-Zinc Oxide TFTs Array," SID Digest '08: SID International Symposium Digest of Technical Papers, May 20, 2008, vol. 39, No. 1, pp. 1-4.
Asaoka et al., "29.1: Polarizer-Free Reflective LCD Combined With Ultra Low-Power Driving Technology," SID Digest '09: SID International Symposium Digest of Technical Papers, 2009, pp. 395-398.
Tsuda et al., "Ultra Low Power Consumption Technologies for Mobile TFT-LCDs," IDW '02: Proceedings of the 9th International Display Workshops, Dec. 4, 2002, pp. 295-298.
Kanno et al., "White Stacked Electrophosphorecent Organic Light-Emitting Devices Employing $MoO_3$ as a Charge-Generation Layer," Adv. Mater. (Advanced Materials), 2006, vol. 18, No. 3, pp. 339-342.
Nowatari et al., "60.2: Intermediate Connector with Suppressed Voltage Loss for White Tandem OLEDs," SID Digest '09: SID International Symposium Digest of Technical Papers, May 31, 2009, vol. 40, pp. 899-902.
Ikeda et al., "Full-Functional System Liquid Crystal Display using CG-Silicon Technology," SID Digest '04: SID International Symposium Digest of Technical Papers, 2004, vol. 35, pp. 860-863.
Kurokawa et al., "UHF RFCPUs on Flexible and Glass Substrates for Secure RFID Systems," Journal of Solid-State Circuits, 2008, vol. 43, No. 1, pp. 292-299.
Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.

(56) References Cited

OTHER PUBLICATIONS

Hirao et al., "Novel Top-Gate Zinc Oxide Thin-Film Transistors (ZnO TFTs) for AMLCDs," Journal of the SID, 2007, vol. 15, No. 1, pp. 17-22.

Lee et al., "World's Largest (15-inch) XGA AMLCD Panel using IGZO Oxide TFT," SID Digest '08: SID International Symposium Digest of Technical Papers, May 20, 2008, vol. 39, pp. 625-628.

Park et al., "Challenge to Future Displays: Transparent AM-OLED Driven by PEALD Grown ZnO TFT," IMID '07 Digest, 2007, pp. 1249-1252.

Park et al., "Amorphous Indium-Gallium-Zinc Oxide TFTs and their Application for Large Size AMOLED," AM-FPD '08 Digest of Technical Papers, Jul. 2, 2008, pp. 275-277.

Jin et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Lee et al., "15.4: Excellent Performance of Indium-Oxide-Based Thin-Film Transistors by DC Sputtering," SID Digest '09: SID International Symposium Digest of Technical Papers, May 31, 2009, pp. 191-193.

Cho et al., "21.2: Al and Sn-doped Zinc Indium Oxide Thin Film Transistors for AMOLED Back-Plane," SID Digest '09: SID International Symposium Digest of Technical Papers, May 31, 2009, pp. 280-283.

Coates et al., "Optical Studies of the Amorphous Liquid-Cholesteric Liquid Crystal Transition: The "Blue Phase"," Physics Letters, Sep. 10, 1973, vol. 45A, No. 2, pp. 115-116.

Meiboom et al., "Theory of the Blue Phase of Cholesteric Liquid Crystals," Phys. Rev. Lett. (Physical Review Letters), May 4, 1981, vol. 46, No. 18, pp. 1216-1219.

Costello et al., "Electron Microscopy of a Cholesteric Liquid Crystal and Its Blue Phase," Phys. Rev. A (Physical Review. A), May 1, 1984, vol. 29, No. 5, pp. 2957-2959.

Kitzerow et al., "Observation of Blue Phases in Chiral Networks," Liquid Crystals, 1993, vol. 14, No. 3, pp. 911-916.

Kikuchi et al., "Polymer-Stabilized Liquid Crystal Blue Phases," Nature Materials, Sep. 2, 2002, vol. 1, pp. 64-68.

Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Kikuchi et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.

Park et al., "High performance amorphous oxide thin film transistors with self-aligned top-gate structure," IEDM 09: Technical Digest of International Electron Devices Meeting, Dec. 7, 2009, pp. 191-194.

Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Miyasaka, "58.2: Invited Paper: Suftla Flexible Microelectronics on their Way to Business," SID Digest '07: SID International Symposium Digest of Technical Papers, 2007, vol. 38, pp. 1673-1676.

Dembo et al., "RFCPUs on Glass and Plastic Substrates Fabricated by TFT Transfer Technology," IEDM 05: Technical Digest of International Electron Devices Meeting, Dec. 5, 2005, pp. 1067-1069.

Prins et al., "A Ferroelectric Transparent Thin-Film Transistor," Appl. Phys. Lett. (Applied Physics Letters), Jun. 17, 1996, vol. 68, No. 25, pp. 3650-3652.

Takahashi et al., "Theoretical Analysis of IGZO Transparent Amorphous Oxide Semiconductor," IDW '08: Proceedings of the 15th International Display Workshops, Dec. 3, 2008, pp. 1637-1640.

Osada et al., "15.2: Development of Driver-Integrated Panel using Amorphous In—Ga—Zn-Oxide TFT," SID Digest '09: SID International Symposium Digest of Technical Papers, May 31, 2009, pp. 184-187.

Ohara et al., "21.3: 4.0 In. QVGA AMOLED Display Using In—Ga—Zn-Oxide TFTs with a Novel Passivation Layer," SID Digest '09: SID International Symposium Digest of Technical Papers, May 31, 2009, pp. 284-287.

Godo et al., "P-9: Numerical Analysis on Temperature Dependence of Characteristics of Amorphous In—Ga—Zn-Oxide TFT," SID Digest '09: SID International Symposium Digest of Technical Papers, May 31, 2009, pp. 1110-1112.

Osada et al., "Development of Driver-Integrated Panel using Amorphous In—Ga—Zn-Oxide TFT," AM-FPD '09 Digest of Technical Papers, Jul. 1, 2009, pp. 33-36.

Godo et al., "Temperature Dependence of Characteristics and Electronic Structure for Amorphous In—Ga—Zn-Oxide TFT," AM-FPD '09 Digest of Technical Papers, Jul. 1, 2009, pp. 41-44.

Ohara et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Sakata et al., "Development of 4.0-In. AMOLED Display with Driver Circuit Using Amorphous In—Ga—Zn-Oxide TFTs," IDW '09: Proceedings of the 16th International Display Workshops, 2009, pp. 689-692.

\* cited by examiner light transmittance light transmittance

DEVICE WITH OXIDE SEMICONDUCTOR THIN FILM TRANSISTOR

TECHNICAL FIELD

The present invention relates to a semiconductor device including an oxide semiconductor and a manufacturing method thereof.

In this specification, a semiconductor device generally means a device which can function by utilizing semiconductor characteristics, and an electro-optical device, a semiconductor circuit, and an electronic device are all semiconductor devices.

BACKGROUND ART

In recent years, a technique for forming a thin film transistor (TFT) by using a thin semiconductor film (having a thickness of approximately several nanometers to several hundred nanometers) formed over a substrate having an insulating surface has attracted attention. Thin film transistors have been applied to a wide range of electronic devices like integrated circuits (ICs) and electro-optical devices, and development of thin film transistors as switching elements in image display devices, in particular, has been hastened.

Metal oxides have been known as materials having semiconductor characteristics. The examples of such metal oxides having semiconductor characteristics include tungsten oxide, tin oxide, indium oxide, zinc oxide, and the like. A thin film transistor in which a channel formation region is formed using such metal oxides having semiconductor characteristics has been already known (for example, see Patent Documents 1 and 2).

In a semiconductor device like the thin film transistor, a breakdown (electrostatic breakdown) of the semiconductor device due to electrostatic discharge from the outside is a serious problem which causes reduction in reliability or productivity from the time of a manufacturing process and inspection of the semiconductor devices to the time of using them as products.

As electronic devices in which a thin film transistor is used, there are mobile devices such as a mobile phone or a notebook computer, and the like. For such a portable electronic device, power consumption which affects continuous operating time is a big problem. Also for a television set which is increasing in size, it is important to suppress the increase in power consumption associated with the increase in size.

REFERENCE

Patent Document

[Patent Document 1] Japanese Published Patent Application No. 2007-123861
[Patent Document 2] Japanese Published Patent Application No. 2007-096055

DISCLOSURE OF INVENTION

An object is to provide a semiconductor device including a thin film transistor having an oxide semiconductor layer, which consumes low power.

An object is to provide a highly reliable semiconductor device including a thin film transistor having an oxide semiconductor layer, which has tolerance for electrostatic discharge.

An embodiment of the present invention is a semiconductor device which includes, over one substrate, a pixel portion having a pixel electrode layer and a driver circuit portion. A counter electrode layer facing the pixel electrode layer with a liquid crystal layer interposed therebetween is provided in the pixel portion and the driver circuit portion. A region of the counter electrode layer over the pixel portion and a region of the counter electrode layer over the driver circuit portion may be formed using one continuous conductive film. Alternatively, the region of the counter electrode layer over the pixel portion and the region of the counter electrode layer over the driver circuit portion may be separated, and the same potential may be applied thereto.

A pixel thin film transistor which includes an oxide semiconductor layer is provided in the pixel portion. A driver circuit thin film transistor which includes an oxide semiconductor layer is provided in the driver circuit portion. The pixel thin film transistor and the driver circuit thin film transistor are provided over the one substrate.

In the driver circuit portion, the driver circuit thin film transistor has a structure in which a conductive layer is provided over the driver circuit thin film transistor, and the oxide semiconductor layer is sandwiched between a gate electrode layer and the conductive layer. With such a structure, variation in threshold voltage of the driver circuit thin film transistor can be reduced; accordingly, a semiconductor device including the driver circuit thin film transistor with stable electric characteristics can be provided. The conductive layer may be at the same potential as the gate electrode layer or may be at a floating potential or a fixed potential such as GND potential or 0 V. By setting the potential of the conductive layer to an appropriate value, the threshold voltage of the thin film transistor can be controlled.

The conductive layer is provided in a region overlapping with the gate electrode layer and the oxide semiconductor layer; therefore, it is preferred that, in the region over the driver circuit portion, the counter electrode layer be patterned to have approximately the same shape as the conductive layer and to overlap with the conductive layer.

The counter electrode layer is provided over the driver circuit portion; accordingly, the counter electrode layer diffuses static electricity applied by electrostatic discharge and prevents local electric charges (localization of electric charges) (prevents local potential difference), so that an electrostatic breakdown of the semiconductor device can be prevented.

The counter electrode layer may have an opening in a region between the driver circuit portion and the pixel portion, by which parasitic capacitance to be formed between the counter electrode layer and the oxide semiconductor layer or the conductive layer in the driver circuit portion can be reduced. Thus, reduction in power consumption of the semiconductor device can be realized.

In the driver circuit portion, the counter electrode may have a branching comb-like shape.

Specifically, one embodiment of the invention disclosed in this specification is a semiconductor device including, over one substrate, a driver circuit portion including a driver circuit thin film transistor and a pixel portion including a pixel thin film transistor. The driver circuit thin film transistor and the pixel thin film transistor each include a gate electrode layer; a gate insulating layer over the gate electrode layer; an oxide semiconductor layer over the gate insulating layer; a source electrode layer and a drain electrode layer over the oxide semiconductor layer; and an oxide insulating layer over the oxide semiconductor layer, the oxide insulating layer being in contact with part of the oxide semiconductor layer, the source electrode layer, and the drain electrode layer. In the pixel portion, a pixel electrode layer electrically connected to the source electrode layer or the drain electrode layer is provided. In the driver circuit portion, a conductive layer overlapping with the gate electrode layer and the oxide semiconductor layer is provided over the oxide insulating layer. In the pixel portion and the driver circuit portion, a liquid crystal layer is provided over the pixel electrode layer and the conductive layer, and a counter electrode layer which overlaps with the pixel portion and the driver circuit portion is provided over the liquid crystal layer.

Another embodiment of the invention disclosed in this specification is a semiconductor device including, over one substrate, a driver circuit portion including a driver circuit thin film transistor and a pixel portion including a pixel thin film transistor. The driver circuit thin film transistor and the pixel thin film transistor each include a gate electrode layer; a gate insulating layer over the gate electrode layer; an oxide semiconductor layer over the gate insulating layer; a source electrode layer and a drain electrode layer over the oxide semiconductor layer; and an oxide insulating layer over the oxide semiconductor layer, the oxide insulating layer being in contact with part of the oxide semiconductor layer, the source electrode layer, and the drain electrode layer. In the pixel portion, a pixel electrode layer electrically connected to the source electrode layer or the drain electrode layer is provided. In the driver circuit portion, a conductive layer which overlaps with the gate electrode layer and the oxide semiconductor layer is provided over the oxide insulating layer. In the pixel portion and the driver circuit portion, a liquid crystal layer is provided over the pixel electrode layer and the conductive layer. In the pixel portion, a first counter electrode layer is provided over the liquid crystal layer. In the driver circuit portion, a second counter electrode layer which is at the same potential as the first counter electrode layer is provided over the liquid crystal layer. The second counter electrode layer may have an opening.

In the above-described structure, the counter electrode layer provided in the pixel portion may have a flat shape, and further, a third counter electrode layer may be provided. In this specification, the counter electrode layer provided in the pixel portion is also referred to as a first counter electrode layer, and the counter electrode layer provided in the driver circuit portion is also referred to as a second counter electrode layer.

The counter electrode layers (first counter electrode layer and second counter electrode layer) may be at a fixed potential. Furthermore, the first counter electrode layer and the second counter electrode layer may be electrically connected to each other.

Regarding the effect of preventing an electrostatic breakdown, it is preferable that a width of the second counter electrode layer be larger than a width of the conductive layer or the oxide semiconductor layer in the driver circuit portion. Note that the width is a width in a channel direction of the oxide semiconductor layer.

With each of the above structures, at least one of the objects is achieved.

As the oxide semiconductor layer, a thin film of $InMO_3(ZnO)_m$ (m>0) is formed. The thin film is used as an oxide semiconductor layer to fabricate a thin film transistor in the embodiments of the present invention. Note that M denotes one metal element or a plurality of metal elements selected from Ga, Fe, Ni, Mn, and Co. As an example, M may be Ga or may include the above metal element in addition to Ga, for example, M may be Ga and Ni or Ga and Fe. Moreover, in the above oxide semiconductor, in some cases, a transition metal element such as Fe or Ni or an oxide of the transition metal is contained as an impurity element in addition to a metal element contained as M. In this specification, an oxide semiconductor layer whose composition formula is represented as $InMO_3(ZnO)_m$ (m>0) where Ga is included as M is referred to as an In—Ga—Zn—O-based oxide semiconductor, and a thin film thereof is also referred to as an In—Ga—Zn—O-based non-single-crystal film.

As other examples of the metal oxide applicable to the oxide semiconductor layer, any of the following metal oxides can be applied: an In—Sn—O-based metal oxide; an In—Sn—Zn—O-based metal oxide; an In—Al—Zn—O-based metal oxide; a Sn—Ga—Zn—O-based metal oxide; an Al—Ga—Zn—O-based metal oxide; a Sn—Al—Zn—O-based metal oxide; an In—Zn—O-based metal oxide; a Sn—Zn—O-based metal oxide; an Al—Zn—O-based metal oxide; an In—O-based metal oxide; a Sn—O-based metal oxide; and a Zn—O-based metal oxide. Silicon oxide may be contained in the oxide semiconductor layer formed using any of the above metal oxides.

In the embodiments of the present invention, it is preferred to perform dehydration or dehydrogenation on the oxide semiconductor layer. Dehydration or dehydrogenation is heat treatment of the oxide semiconductor layer in an atmosphere of an inert gas such as nitrogen or a rare gas (such as argon or helium) at a temperature greater than or equal to 400° C. and less than or equal to 750° C., preferably greater than or equal to 425° C. and less than the strain point of the substrate, so that impurities such as moisture included in the oxide semiconductor layer is reduced. Further, water ($H_2O$) can be prevented from being contained in the oxide semiconductor layer again later.

The heat treatment for dehydration or dehydrogenation is preferably performed in a nitrogen atmosphere with an $H_2O$ concentration of 20 ppm or lower. Alternatively, the heat treatment may be performed in ultra-dry air with an $H_2O$ concentration of 20 ppm or lower.

As the heat treatment for dehydration or dehydrogenation, an instantaneous heating method can be employed, such as a heating method using an electric furnace, a GRTA (gas rapid thermal annealing) method using a heated gas, or an LRTA (lamp rapid thermal annealing) method using lamp light.

Conditions of the heat treatment are used such that, even when the oxide semiconductor layer is measured at up to 450° C. by TDS after the dehydration or dehydrogenation, two peaks originating from water, or at least one of the two peaks at around 300° C. is not detected. Therefore, even if TDS is performed at up to 450° C. on a thin film transistor including a dehydrated or dehydrogenated oxide semiconductor layer, at least the peak of water at around 300° C. is not detected.

It is important not to allow the oxide semiconductor layer to contact with water or hydrogen, which is achieved by performing the cooling in a furnace used for dehydration or dehydrogenation without exposure of the oxide semiconductor layer to the air. When a thin film transistor is formed using an oxide semiconductor layer obtained by changing an oxide semiconductor layer into a low-resistant oxide semiconductor layer, i.e., an n-type (e.g., $n^-$-type or $n^+$-type) oxide semiconductor layer by dehydration or dehydrogenation and then by changing the oxide semiconductor layer into a high-resistant oxide semiconductor layer so as to be an i-type oxide semiconductor layer, the threshold voltage of the thin film transistor can be positive voltage, so that a so-called normally-off switching element can be realized. It is desirable for a display device that a channel be formed with a threshold voltage that is a positive value and as close to 0 V as possible. Note that if the threshold voltage of the thin film transistor is negative, the thin film transistor tends to be normally on; in other words, current flows between a source electrode layer and a drain electrode layer even when gate voltage is 0V. In an active-matrix display device, electric characteristics of thin film transistors included in a circuit are important and performance of the display device is dependent on the electric characteristics of thin film transistors. Among the electric characteristics of thin film transistors, in particular, a threshold voltage (Vth) is important. When the threshold voltage value is high or negative even when the field effect mobility is high, it is difficult to control the circuit. When a thin film transistor has a high threshold voltage value and a large absolute value of its threshold voltage, the thin film transistor cannot perform switching function and may be a load when the transistor is driven at low voltage. In the case of an n-channel thin film transistor, it is preferable that a channel is formed and drain current begins to flow after the positive voltage is applied as a gate voltage. A transistor in which a channel is not formed unless the driving voltage is increased and a transistor in which a channel is formed and drain current flows even in the case of the negative voltage state are unsuitable for a thin film transistor used in a circuit.

Cooling after the heat treatment may be carried out after switching the gas used in the heat treatment to a different gas. For example, cooling may be performed after the furnace used for dehydration or dehydrogenation is filled with a high-purity oxygen gas, a high-purity $N_2O$ gas, or an ultra-dry air (with a dew point of $-40°$ C. or lower, preferably $-60°$ C. or lower) without exposure of the oxide semiconductor layer to the air.

The electric characteristics of a thin film transistor are improved using an oxide semiconductor layer cooled slowly (or cooled) in an atmosphere (with a dew point of $-40°$ C. or lower, preferably $-60°$ C. or lower) which does not include moisture after moisture which is included in the film is reduced by heat treatment for dehydration or dehydrogenation, and high-performance thin film transistors which can be mass-produced are realized.

As mentioned above, in this specification, heat treatment for an oxide semiconductor layer in an inert gas atmosphere of nitrogen or a rare gas (e.g., argon or helium) is referred to as dehydration or dehydrogenation. In this specification, "dehydrogenation" does not indicate elimination of only $H_2$ by heat treatment. For convenience, elimination of H, OH, and the like is referred to as "dehydration or dehydrogenation".

As mentioned above, in the case where heat treatment for dehydration or dehydrogenation is performed, an oxide semiconductor layer is changed into an oxygen-deficient oxide semiconductor layer to be a low-resistance oxide semiconductor layer, i.e., an n-type (e.g., $n^-$-type) oxide semiconductor layer.

Therefore, the formation of a drain electrode layer over the low-resistant oxide semiconductor layer allows a region underneath the drain electrode layer to be a high-resistance drain region (also referred to as an HRD region) which is an oxygen-deficient region. In addition, the formation of source electrode layer over the low-resistant oxide semiconductor layer allows a region underneath the source electrode layer to be a high-resistance source region (also referred to as an HRS region) which is an oxygen-deficient region.

The carrier concentration of the high-resistance drain region is greater than or equal to $1 \times 10^{18}/cm^3$ and is at least higher than the carrier concentration of the channel formation region (less than $1 \times 10^{18}/cm^3$). Note that the carrier concentration in this specification refers to a value of carrier concentration obtained by Hall effect measurement at room temperature.

The channel formation region is formed by placing at least part of the dehydrated or dehydrogenated oxide semiconductor layer in an oxygen excess state to have higher resistance, i.e., to become an i-type region. Note that as the treatment for placing the dehydrated or dehydrogenated oxide semiconductor layer in an oxygen excess state, any of the following treatments is given, for example: deposition of an oxide insulating film by sputtering over and in contact with the dehydrated or dehydrogenated oxide semiconductor layer; heat treatment of the oxide insulating film formed over and in contact with the dehydrated or dehydrogenated oxide semiconductor layer; heat treatment of the oxide insulating film formed over and in contact with the dehydrated or dehydrogenated oxide semiconductor layer in an atmosphere containing oxygen; heat treatment of the oxide insulating film formed over and in contact with the dehydrated or dehydrogenated oxide semiconductor layer in an inert gas atmosphere, which is followed by the cooling treatment in an oxygen atmosphere; and heat treatment of the oxide insulating film formed over and in contact with the dehydrated or dehydrogenated oxide semiconductor layer in an inert gas atmosphere, which is followed by cooling treatment in ultra-dry air (having a dew point of $-40°$ C. or lower, preferably $-60°$ C. or lower).

Further, at least part of the dehydrated or dehydrogenated oxide semiconductor layer (a portion overlapping with a gate electrode layer) can be selectively made to be in an oxygen-excess state, which allows the part to be a high-resistant oxide semiconductor layer, i.e., an i-type oxide semiconductor layer. Hence, the channel formation region can be formed. For example, the channel formation region can be formed in such a manner that a source electrode layer and a drain electrode layer formed using metal electrodes of Ti or the like are formed on and in contact with the dehydrated or dehydrogenated oxide semiconductor layer and then the exposure regions that do not overlap with at least one of the source electrode layer and the drain electrode layer are selectively made to be in an oxygen excess state. In the case where the exposure regions are selectively made to be in an oxygen excess state, a high-resistance source region overlapping with the source electrode layer and a high-resistance drain region overlapping with the drain electrode layer are formed, and the channel formation region is formed between the high-resistance source region and the high-resistance drain region. That is, the channel formation region is formed between the source electrode layer and the drain electrode layer in a self-aligned manner.

In this manner, a semiconductor device including a thin film transistor having high electric characteristics and high reliability can be manufactured and provided.

Note that by forming the high-resistance drain region in the oxide semiconductor layer overlapping with the drain electrode layer, the reliability of a drive circuit can be improved. Specifically, by forming the high-resistance drain region, the conductivity can vary from the drain electrode layer to the high-resistance drain region and the channel formation region. Therefore, in the case where operation is performed with the drain electrode layer connected to a wiring for supplying a high power supply potential VDD, the high-resistance drain regions serves as buffers and a high electric field is not applied locally even if the high electric field is applied between the gate electrode layer and the drain electrode layer; thus, the withstand voltage of the thin film transistor can be increased.

In addition, the high-resistance drain region and the high-resistance source region are formed in the oxide semiconductor layer overlapping with the drain electrode layer and the source electrode layer, respectively, so that reduction in leakage current can be achieved in the channel formation region in the formed driver circuit. In particular, by forming the high-resistance drain region, leakage current between the drain electrode layer and the source electrode layer of the transistor flows through the drain electrode layer, the high-resistance drain region on the drain electrode layer side, the channel formation region, the high-resistance source region on the source electrode layer side, and the source electrode layer in the order presented. In this case, in the channel formation region, leakage current flowing from the high-resistance drain region on the drain electrode layer side to the channel formation region can be localized in the vicinity of an interface between the channel formation region and a gate insulating layer which has high resistance when the transistor is off. Thus, the amount of leakage current in a back channel portion (part of a surface of the channel formation region, which is apart from the gate electrode layer) can be reduced.

Further, the high-resistance source region overlapping with the source electrode layer and the high-resistance drain region overlapping with the drain electrode layer are formed so as to overlap with part of the gate electrode layer, which allows the intensity of an electric field in the vicinity of an end portion of the drain electrode layer to be reduced more effectively.

Note that an oxide conductive layer may be formed between the oxide semiconductor layer and the source and drain electrode layers. The oxide conductive layer preferably contains zinc oxide as a component and preferably does not contain indium oxide. For example, zinc oxide, zinc aluminum oxide, zinc aluminum oxynitride, gallium zinc oxide, or the like can be used. The oxide conductive layer also functions as a low-resistance drain (LRD, also referred to as an LRN (low-resistance n-type conductivity)) region. In particular, the carrier concentration of the low-resistance drain region is higher than that of the high-resistance drain region (HRD region), and preferably in the range of $1\times10^{20}/cm^3$ to $1\times10^{21}/cm^3$ inclusive. The oxide conductive layer provided between the oxide semiconductor layer and the source and drain electrode layers can reduce contact resistance and realizes higher speed operation of the transistor. Accordingly, frequency characteristics of a peripheral circuit (a driver circuit) can be improved.

The oxide conductive layer and a metal layer for forming the source and drain electrode layers can be formed in succession.

Further, the above-described source and drain electrode layers may be formed as a wiring formed by stacking the same material as that of the oxide conductive layer functioning as an LRN region or an LRD region and a metal material. By stacking the metal and the oxide conductive layer, wiring resistance can be lowered and coverage at the step such as an overlapping portion of wirings or an opening can be improved; thus, the disconnection of the wiring can be prevented. Furthermore, effects of preventing local increase in resistance of a wiring due to migration or the like can be expected; accordingly, a highly reliable semiconductor device can be provided.

Regarding the above-described connection between the oxide semiconductor layer, and the source and drain electrode layers, when the oxide conductive layer is sandwiched therebetween, it is expected to prevent increase in contact resistance which is caused by formation of an insulating oxide on a metal surface in the connection portion (contact portion); accordingly, a highly reliable semiconductor device can be provided.

A protective circuit for protecting the thin film transistor for the pixel portion may be provided over the same substrate as a gate line or a source line. The protective circuit is preferably formed with a non-linear element including an oxide semiconductor layer.

Note that the ordinal numbers such as "first" and "second" in this specification are used for convenience and do not denote the order of steps and the stacking order of layers. In addition, the ordinal numbers in this specification do not denote particular names which specify the present invention.

The parasitic capacitance is reduced in a semiconductor device including a thin film transistor formed using an oxide semiconductor layer and thus, low power consumption of a semiconductor device can be achieved.

The semiconductor device including a thin film transistor formed using an oxide semiconductor layer can have high reliability.

BEST MODE FOR CARRYING OUT THE INVENTION

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments.

Embodiment 1

A semiconductor device of this embodiment is described with reference to FIGS. 1A to 1C and FIG. 2. The semiconductor device of this embodiment is a liquid crystal display device.

Figure 1A:
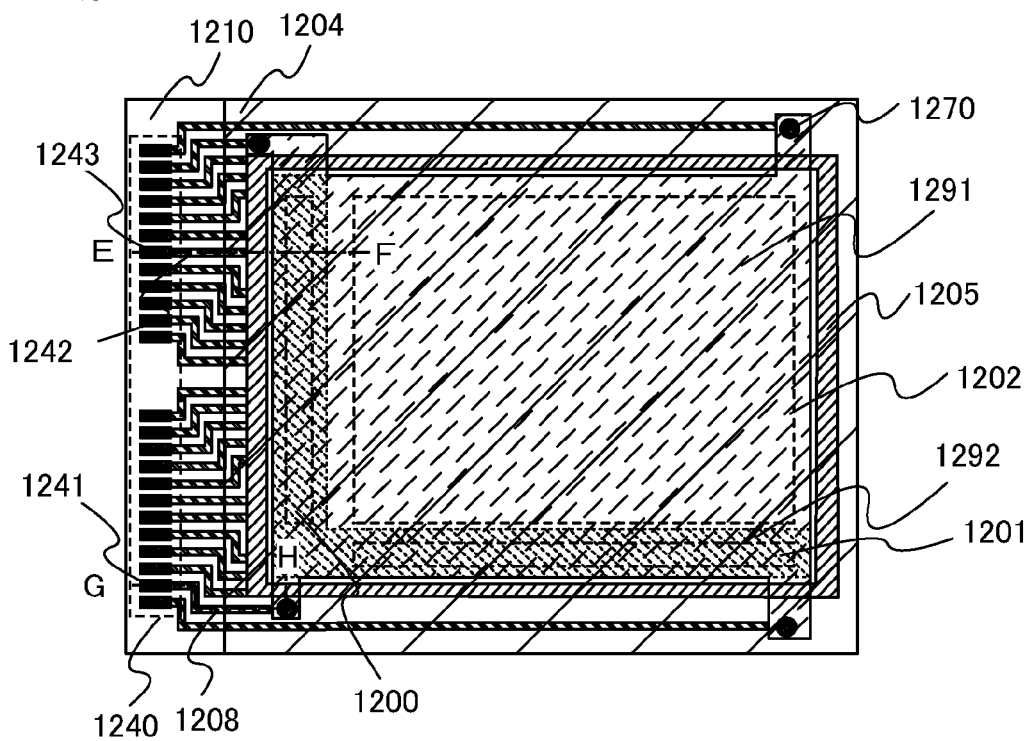
FIGS. 1A to 1C illustrate a semiconductor device.
Figure 1B:
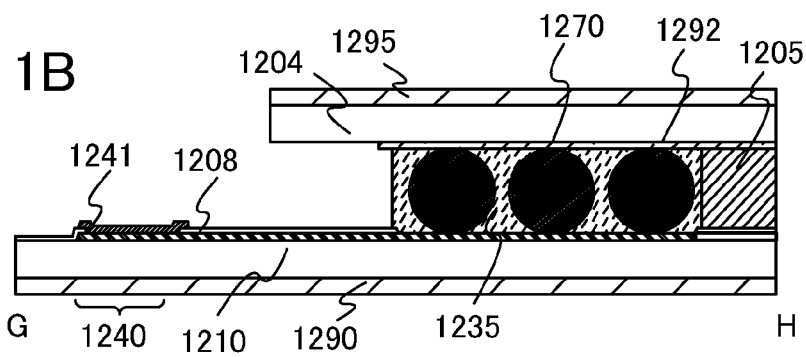
Figure 1C:
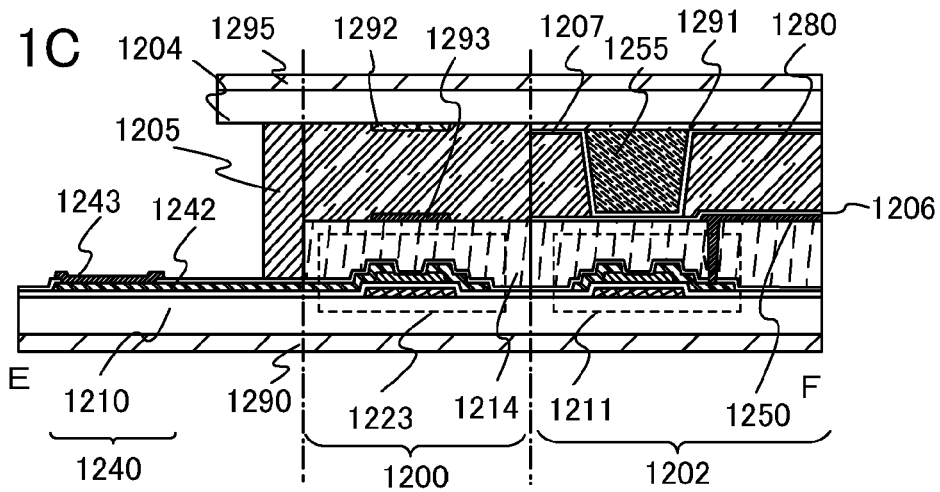

FIG. 1A is a top view of a semiconductor device of the present invention. FIG. 1A is a top view of a liquid crystal display device in which an FPC (flexible printed circuit) has not been attached to a first substrate 1210. FIG. 1B is a cross-sectional view taken along line G-H of FIG. 1A, which shows a connection region of a conductive particle and a connection wiring. FIG. 1C is a cross-sectional view taken along line E-F of FIG. 1A, which shows a connection region of a pixel portion and a connection wiring.

The first substrate 1210 which serves as an active matrix substrate and is provided with pixel electrode layers, and a second substrate 1204 provided with a first counter electrode layer 1291 and a second counter electrode layer 1292 are attached to each other with a sealing material 1205, and the interior space surrounded by the sealing material 1205 is filled with a liquid crystal 1280. A signal line driver circuit portion 1200, a scan line driver circuit portion 1201, and a pixel portion 1202 in which pixel electrode layers are formed in a matrix form are formed over the first substrate 1210.

The second counter electrode layer 1292 provided over the driver circuit portion is at the same potential as the first counter electrode layer 1291. The first counter electrode layer 1291 provided over the pixel portion 1202 and the second counter electrode layer 1292 provided over the driver circuit portion may be formed using one continuous conductive film. Alternatively, the first counter electrode layer 1291 and the second counter electrode layer 1292 may be separately provided over the pixel portion and the driver circuits, and the same potential may be applied to the first counter electrode layer and the second counter electrode layer so that they are at the same potential.

In the connection region (common connection portion), the first counter electrode layer 1291 and the second counter electrode layer 1292 which are provided on the same substrate (i.e., the second substrate 1204) are electrically connected to the connection wiring 1208 (common potential line), through a conductive particle 1270 disposed between the first substrate 1210 and the second substrate 1204.

A potential (voltage) applied to the pixel electrode layer is provided through a pixel thin film transistor. Therefore, there is a possibility that the voltage of the pixel electrode layer is smaller than the voltage which is actually applied to the pixel electrode layer through the pixel thin film transistor by several volts. Thus, it is preferable that a potential (voltage) to be applied to the first counter electrode layer 1291 and the second counter electrode layer 1292 be set in consideration of the difference.

The signal line driver circuit portion 1200 provided over the first substrate 1210 includes a circuit comprising a driver circuit thin film transistor 1223.

The pixel portion 1202 includes a pixel thin film transistor 1211. Further, a pixel electrode layer 1250 which is connected to the pixel thin film transistor 1211 is formed over and in an insulating layer 1214.

The pixel thin film transistor 1211 and the driver circuit thin film transistor 1223 are formed using an oxide semiconductor layer, a gate insulating layer, and a gate electrode layer. Over the driver circuit thin film transistor 1223, a conductive layer 1293 is provided which overlaps with the gate electrode layer and the oxide semiconductor layer with an insulating layer 1214 interposed between the conductive layer 1293, and the gate electrode layer and the oxide semiconductor layer.

In the driver circuit thin film transistor 1223, the oxide semiconductor layer is interposed between the gate electrode layer and the conductive layer 1293. With such a structure, a variation in threshold voltage of the driver circuit thin film transistor 1223 can be reduced, so that a semiconductor device provided with the driver circuit thin film transistor 1223, which has stable electric characteristics, can be provided. The conductive layer 1293 may be at the same potential as the gate electrode layer or may be at a floating potential or a fixed potential such as a GND potential or 0 V. By setting the potential of the conductive layer 1293 to an appropriate value, the threshold voltage of the driver circuit thin film transistor 1223 can be controlled.

The conductive layer 1293 is selectively provided in a region overlapping with the gate electrode layer and the semiconductor layer.

Figure 2:
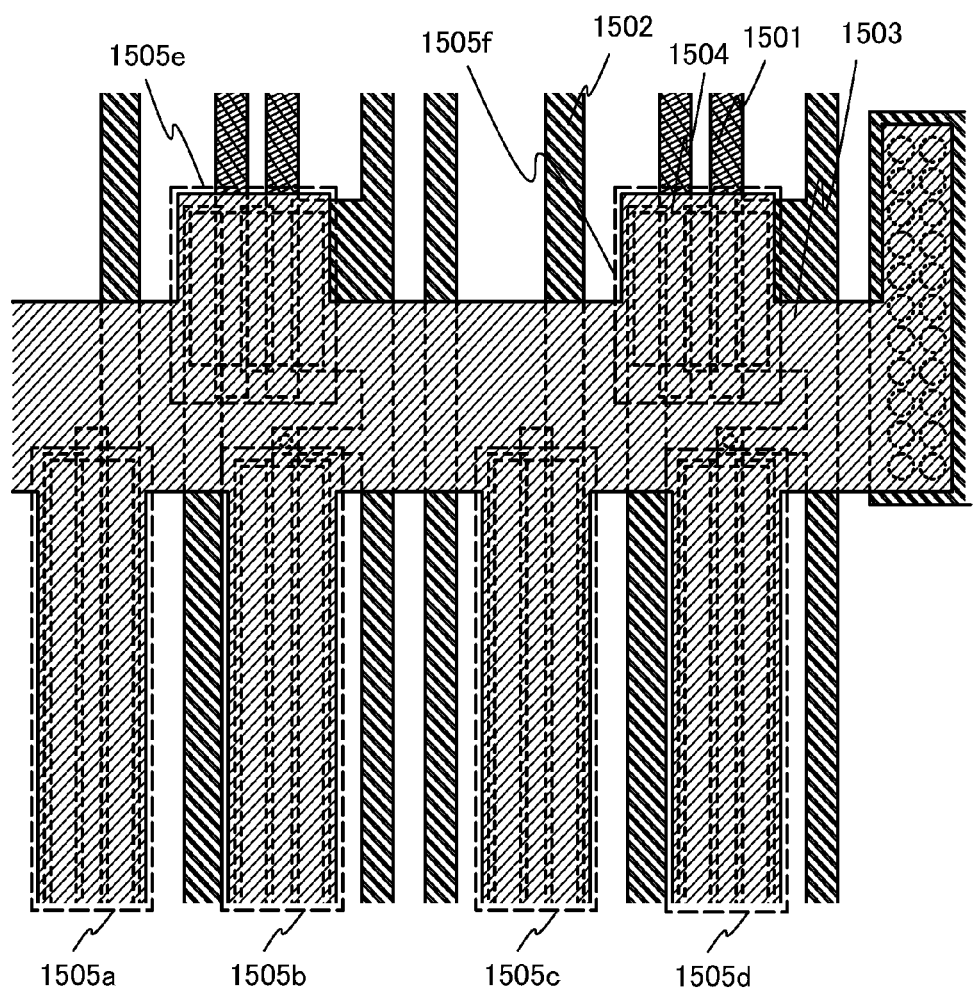
FIG. 2 illustrates a semiconductor device.

FIG. 2 is a plan view illustrating the driver circuit portion in more detail. FIG. 2 is a plan view of the driver circuit portion including thin film transistors 1505*a*, 1505*b*, 1505*c*, 1505*d*, 1505*e*, and 1505*f*; a gate electrode layer 1501; a source wiring layer 1502; a conductive layer 1503; and a semiconductor layer 1504. In FIG. 2, the conductive layer 1503 corresponds to the conductive layer 1293 in FIG. 1C. The conductive layer 1503 is formed to cover at least a channel formation region of the semiconductor layer 1504 of the thin film transistors 1505*a*, 1505*b*, 1505*c*, 1505*d*, 1505*e*, and 1505*f*, and most parts of the gate electrode layer 1501 and the source wiring layer 1502 do not overlap with the conductive layer 1503.

It is preferable that the second counter electrode layer 1292 provided over the driver circuit portion have approximately the same shape as the conductive layer 1293 overlapping with the semiconductor layer of the driver circuit thin film transistor 1223 and overlap with the conductive layer 1293. Thus, the second counter electrode layer 1292 has a shape similar to that of the conductive layer 1293.

The second counter electrode layer 1292 is provided over the driver circuit portion; accordingly, the second counter electrode layer 1292 diffuses static electricity applied by electrostatic discharge and prevents local electric charges (localization of electric charges) (prevents local potential difference), so that an electrostatic breakdown of the semiconductor device can be prevented.

The second counter electrode layer 1292 provided over the driver circuit portion can reduce parasitic capacitance to be formed between the second counter electrode layer, and the semiconductor layer of the thin film transistor in the driver circuit portion and the conductive layer in the driver circuit portion. Thus, reduction in power consumption of the semiconductor device can be realized.

In this specification, the second counter electrode layer 1292 in the driver circuit portion includes may have a branching comb-like shape.

As each of the first substrate 1210 and the second substrate 1204, any glass substrate used in the electronics industry, called a non-alkali glass substrate, such as an aluminosilicate glass substrate, an aluminoborosilicate glass substrate, or a barium borosilicate glass substrate, a quartz substrate, a ceramic substrate, a plastic substrate, or the like can be used as appropriate. By using a flexible plastic substrate as each of the first substrate 1210 and the second substrate 1204, a flexible semiconductor device can be manufactured.

The sealing material 1205 is applied over the first substrate 1210 or the second substrate 1204 by a screen printing method, or with an ink-jet apparatus or a dispensing apparatus. As the sealing material 1205, typically, a material containing a visible light curable resin, an ultraviolet curable resin, or a thermosetting resin can be used. For example, an epoxy resin such as a liquid bisphenol-A resin, a solid bisphenol-A resin, a bromine-containing epoxy resin, a bisphenol-F resin, a bisphenol-AD resin, a phenol-type epoxy resin, a cresol-type epoxy resin, a novolac-type epoxy resin, a cycloaliphatic epoxy resin, an Epi-Bis type epoxy resin, a glycidyl ester resin, a glycidyl amine resin, a heterocyclic epoxy resin, or a modified epoxy resin can be used. As the sealing material 1205, a material having a viscosity in the range of 40 Pa·s to 400 Pa·s is cured and then used. Further, a filler (1 μm to 24 μm in diameter) may be contained. Note that it is preferable to select, as the sealing material, a sealing material which is insoluble in liquid crystals which are in contact with the sealing material later.

As the conductive particle 1270, a conductive particle in which an insulating sphere is covered with a thin metal film can be used. The insulating sphere is formed using silica glass, hard resin, or the like. The thin metal film can be formed to have a single-layer structure or a stacked-layer structure of gold, silver, palladium, nickel, indium tin oxide (ITO), and/or indium zinc oxide (IZO). For example, as the thin metal film, a thin gold film, a stack of a thin nickel film and a thin gold film, or the like can be used. By using the conductive particle 1270, elasticity can be improved so that possibilities of breakdowns due to external pressure can be reduced.

The materials of the pixel electrode layer 1250 are different between a transmissive liquid crystal display device and a reflective liquid crystal display device. In the case of a transmissive liquid crystal display device, the pixel electrode layer 1250 is formed using a light-transmitting material. As examples of the light-transmitting material, indium tin oxide (ITO), zinc oxide (ZnO), indium zinc oxide (IZO), gallium-doped zinc oxide (GZO), and the like can be given.

Further, the pixel electrode layer 1250 can be formed using a conductive composition including a conductive high-molecular weight material (also referred to as a conductive polymer), as well. The pixel electrode layer formed using the conductive composition has preferably a sheet resistance of less than or equal to 10000 Ω/square and a transmittance of greater than or equal to 70% at a wavelength of 550 nm. Further, the resistivity of the conductive high-molecular weight material included in the conductive composition is preferably less than or equal to 0.1 Ω·cm.

As the conductive high-molecular weight material, a so-called π-electron conjugated conductive polymer can be used. For example, polyaniline or a derivative thereof, polypyrrole or a derivative thereof, polythiophene or a derivative thereof, a copolymer of two or more kinds of them, and the like can be given.

On the other hand, in the case of a reflective liquid crystal display device, a metal electrode having high reflectivity is used as the pixel electrode layer 1250. Specifically, aluminum, silver, or the like is used. Further, the reflectivity is increased by making the surface of the pixel electrode layer 1250 rough. Therefore, the insulating layer 1214 under the pixel electrode layer 1250 may be made rough.

Further, in the case of a semi-transmissive liquid crystal display device, a transmissive material and a reflective material are used for the pixel electrode layer 1250.

Further, a terminal portion 1240 is formed in an edge portion of the first substrate 1210. In the terminal portion 1240, a connection terminal 1241 is formed over the connection wiring 1208.

FIG. 1B is a cross-sectional view of a region where the connection terminal 1241 and the conductive particle 1270 are connected to each other. A connection wiring 1208 is formed over the first substrate 1210. A connection terminal 1241 formed at the same time as the pixel electrode layer 1250 is formed over the connection wiring 1208. The connection terminal 1241 is electrically connected to the second counter electrode layer 1292 through the connection wiring 1208 and the conductive particle 1270. Further, the connection terminal 1241 is connected to an FPC (not shown). Note that in FIG. 1B, the conductive particle 1270 is fixed by a resin layer 1235 (not shown). The resin layer 1235 can be formed using an organic resin material like that used for the sealing material 1205.

FIG. 1C is a cross-sectional view of a region where the pixel electrode layer and a connection terminal are connected. A connection wiring 1242 formed at the same time as source electrode layers and drain electrode layers of the pixel thin film transistor 1211 and the driver circuit thin film transistor 1223 are formed over the first substrate 1210. A connection terminal 1243 formed at the same time as the pixel electrode layer 1250 is formed over the connection wiring 1242. The connection terminal 1243 is electrically connected to the pixel electrode layer 1250 through the connection wiring 1242. Note that, since an active matrix liquid crystal display device is used in this embodiment, the pixel electrode layer 1250 and the connection wiring 1242 are not directly connected but are connected through the pixel thin film transistor 1211 or a thin film transistor in the signal line driver circuit portion 1200.

An alignment film 1206 is provided over the pixel electrode layer 1250, and rubbing is performed thereon. The alignment film 1206 and the rubbing are not necessarily required, which depends on the mode of liquid crystals.

For the second substrate 1204 which serves as a counter substrate, a black matrix may be provided at a position overlapping with the signal line driver circuit portion 1200, and a color filter, a protective layer, and the like may be provided at a position overlapping with the pixel portion 1202. In a case where color display is performed by a color sequential method called "field sequential", the color filter is not necessarily provided. The first counter electrode layer 1291 is provided, and an alignment film 1207 is provided on the first counter electrode layer 1291, and rubbing is performed thereon. Similarly to the case of the first substrate 1210, as for the second substrate 1204, an alignment film and rubbing are not necessarily required, which depends on the mode of liquid crystals.

Alternatively, liquid crystals exhibiting a blue phase for which an alignment film is unnecessary may be used. A blue phase is one of liquid crystal phases, which is generated just before a cholesteric phase changes into an isotropic phase while the temperature of cholesteric liquid crystal is increased. Since the blue phase appears within a narrow range of temperatures, a liquid crystal composition containing a chiral agent at 5 wt % or more is used for the liquid crystal 1280 in order to increase the temperature range. The liquid crystal composition which includes a liquid crystal showing a blue phase and a chiral agent has a short response time of 1 msec or less, has optical isotropy, which makes the alignment step unneeded, and has a small viewing angle dependence.

The second substrate 1204 provided with the first counter electrode layer 1291 and the second counter electrode layer 1292 or the first substrate 1210 provided with the pixel electrode layer 1250 is further provided with a pillar spacer 1255. The pillar spacer 1255 is provided to keep a distance between the first substrate 1210 and the second substrate 1204. In this embodiment, an example is described in which the pillar spacer 1255 is provided on the second substrate 1204 side. The pillar spacer 1255 is also called a photolitho spacer, a post spacer, a scallop spacer, or a column spacer. Alternatively, a spherical spacer may be used. In this embodiment, a pillar spacer is used. As for a method for forming the pillar spacer 1255, an organic insulating material such as photosensitive acrylic is applied to an entire surface of the substrate by a spin coating method, and a series of photolithography steps is performed thereon, so that photosensitive acrylic which remains over the substrate serves as the spacer. With this method, a place for disposing a spacer can be exposed to light in accordance with a mask pattern at the time of light exposure; therefore, the pillar spacer 1255 at a portion where the liquid crystal is not driven makes it possible to prevent light of the liquid crystal from leaking as well as to maintain the distance between the upper and lower substrates. Further, the pillar spacer 1255 can be formed by discharging a composition containing an organic insulating material by an inkjet method and performing baking thereon.

The space around the conductive particle 1270 may be filled with a conductive polymer as the resin layer 1235. As typical examples of the conductive polymer, a conductive polyaniline, a conductive polypyrrole, a conductive polythiophene, a mixture of poly(ethylenedioxythiophene) (PEDOT) and poly(styrenesulfonic acid) (PSS), and the like can be given. Further, any of the afore-mentioned examples of the conductive polymer which can be used for the pixel electrode layer 1250 can be used as appropriate, as well. The conductive polymer is formed by applying the conductive polymer with an ink-jet apparatus, a dispensing apparatus, or the like. That is, when the conductive polymer is in contact with the second counter electrode layer 1292 or the connection wiring 1208, the conductive particle 1270 and the conductive polymer are in contact with each other, so that connection resistance between the second counter electrode layer 1292 and the connection wiring 1208 can be reduced.

Note that the connection wiring 1208 and the second counter electrode layer 1292 formed on the second substrate 1204 are electrically connected to each other through the conductive particle 1270.

Further, nanoparticles in each of which a conductive material is covered with a thin organic film may be used as the conductive particle 1270. The thin organic films are decomposed in a heating step for realigning the orientation of liquid crystals and hardening the sealing material after the first substrate 1210 and the second substrate 1204 are attached to each other, so that the conductive materials of the nanoparticles are in contact and fused with one another, thereby a conductive particle can be formed.

The nanoparticles are dispersed by a droplet discharging method. A droplet discharging method is a method for forming a pattern by discharging droplets containing a predetermined substance through a fine opening. In this embodiment, a composition in which nanoparticles in each of which a conductive material is covered with a thin organic film are dispersed in a solvent, is discharged (jetted) as a droplet, and dried so that the solvent is evaporated.

A conductive material for forming nanoparticles may be a metal element selected from gold (Au), silver (Ag), platinum (Pt), nickel (Ni), copper (Cu), palladium (Pd), tantalum (Ta), iridium (Ir), rhodium (Rh), tungsten (W), aluminum (Al), or the like or an alloy material containing such an element as a main component. Further, a metal sulfide of cadmium (Cd) or zinc (Zn), an oxide of iron (Fe), titanium (Ti), germanium (Ge), silicon (Si), zirconium (Zr), barium (Ba), or the like, or one or more silver halides may be mixed. Note that in the case where two or more kinds of elements or compounds are used as conductive materials, the mixture form is not limited in particular, for example, they may be homogeneously mixed, or any one of them may be localized in the core portion. Further, the inside of the nanoparticles may be formed of an insulating material as long as at least the surfaces of the nanoparticles, which is covered by the thin organic film, are formed of a conductive material.

The grain diameter of a nanoparticle is greater than or equal to 1 nm and less than or equal to 200 nm, preferably greater than or equal to 1 nm and less than or equal to 100 nm, and grain diameters of the nanoparticles included in the discharged material are preferably uniform.

Note that when voltage is applied, voids may be generated between particles depending on the kind of the conductive material(s) forming the nanoparticles. This is because crystal growth of the conductive material proceeds very fast, and such void generation can be suppressed by setting a voltage to be applied to a liquid crystal display device to be low or using an alloy material for each nanoparticle. Consequently, a highly reliable liquid crystal display device can be provided.

The thin organic films coating the nanoparticles correspond to a dispersant having functions of preventing nanoparticles from flocculating in a solvent and stably dispersing the particles. Accordingly, the compound forming the thin organic films is formed using a surfactant, a material which can form a coordinate bond with a metal element contained in the conductive material, or the like. Here, as the substance forming a coordinate bond with a metal element, a substance having a lone electron-pair on an atom of nitrogen, sulfur, oxygen, or the like such as an amino group, a thiol group (—SH), a sulfide group (—S—), a hydroxy group (—OH), an ether group (—O—), a carboxyl group (—COOH), a cyano group (—CN), or the like can be given. For example, a hydroxylamine such as ethanolamine, an amine-based compound such as polyethyleneimine, an amide compound such as polyvinylpyrrolidone, an alcohol such as poly(vinyl alcohol), an alkanethiol, a dithiol, a glycol such as ethylene glycol, or diethylene glycol, an ether compound such as polyethylene glycol, poly(acrylic acid), carboxymethylcellulose, or the like can be used. Further, as the surfactant, for example, an anionic surfactant such as sodium bis(2-ethylhexyl)sulfosuccinate or sodium dodecylbenzenesulfonate, a nonionic surfactant such as an alkyl ester of poly(alkyl glycol), alkyl phenyl ether, a fluorosurfactant, a copolymer of ethyleneimine with poly(ethylene oxide), or the like can be used. Note that when a dispersant is 30 wt % or more with respect to nanoparticles, the viscosity of the discharge material becomes high, so that 1.0 wt % to 30 wt % is preferable.

Such nanoparticles in each of which a conductive material is covered with a thin organic film are dispersed in a solvent and discharged. For the solvent, water or an organic solvent can be used, and an organic solvent may be either a water-soluble organic solvent or a water-insoluble organic solvent. For example, as the water-soluble organic solvent, an alcohol such as methanol, ethanol, propanol, butyl alcohol, glycerin, dipropylene glycol, or ethylene glycol, a ketone such as acetone or methyl ethyl ketone, a glycol ether such as ethylene glycol monomethyl ether, ethylene glycol monoethyl ether, ethylene glycol monobutyl ether, or diethylene glycol monobutyl ether, a water-soluble nitrogen-containing organic compound such as 2-pyrrolidone or N-methylpyrrolidone, or the like can be given. Further, as the water-insoluble organic solvent, an ester such as ethyl acetate, a linear alkane such as octane, nonane, or decane, a cycloalkane such as cyclohexane, an aromatic compound such as toluene, xylene, benzene, or dichlorobenzene, or the like can be given. Naturally, not only one solvent is necessarily used but a mixture of a plurality of solvents may be used as long as phase separation does not occur between the solvents.

The sealing material 1205 and the conductive particle 1270 are discharged over the first substrate 1210 or the second substrate 1204, and then liquid crystals are discharged in a space surrounded by the sealing material 1205. After that, the first substrate 1210 and the second substrate 1204 are attached to each other in reduced pressure, UV light irradiation is performed thereon to cure the sealing material 1205, and then heat treatment is performed thereon to further harden the sealing material 1205, so that the first substrate 1210 and the second substrate 1204 are firmly fixed. In addition, the alignment of the liquid crystals is made uniform by the heat treatment.

Consequently, the first substrate 1210 and the second substrate 1204 can be attached to each other.

Then, the first substrate 1210 and the second substrate 1204 are cut to have a panel shape. Furthermore, in order to improve the contrast, a first polarizing plate 1290 and a second polarizing plate 1295 are provided for the outsides of the first substrate 1210 and the second substrate 1204 respectively. Note that the first polarizing plate 1290 is not necessarily provided in the case of a reflective display device.

Although not illustrated in this embodiment, a black matrix (a light-blocking layer), an optical member (an optical substrate) such as a retardation member, or an anti-reflection member, and the like are provided as appropriate. For example, circular polarization obtained by using a polarizing substrate and a retardation substrate may be used. In addition, a backlight, a side light, or the like may be used as a light source.

In an active matrix liquid crystal display device, pixel electrodes arranged in a matrix form are driven to form a display pattern on a screen. Specifically, voltage is applied between a selected pixel electrode and a counter electrode corresponding to the pixel electrode, so that a liquid crystal layer provided between the pixel electrode and the counter electrode is optically modulated and this optical modulation is recognized as a display pattern by an observer.

In displaying moving images, a liquid crystal display device has a problem in that a long response time of liquid crystal molecules themselves causes afterimages or blurring of moving images. In order to improve the moving-image characteristics of a liquid crystal display device, a driving method called black insertion is employed in which black is displayed on the whole screen every other frame period.

Further, there is a driving technique which is so-called double-frame rate driving. In the double-frame rate driving, a vertical synchronizing frequency is set 1.5 times or more, preferably, 2 times or more as high as a usual vertical synchronizing frequency, whereby the response speed is increased, and the grayscale to be written is selected for every plural fields which have been divided in each frame.

Further alternatively, in order to improve the moving-image characteristics of a liquid crystal display device, a driving method may be employed, in which a plurality of LEDs (light-emitting diodes) or a plurality of EL light sources are used to form a surface light source as a backlight, and each light source of the surface light source is independently driven in a pulsed manner in one frame period. As the surface light source, three or more kinds of LEDs may be used and an LED emitting white light may be used. Since a plurality of LEDs can be controlled independently, the light emission timing of LEDs can be synchronized with the timing at which a liquid crystal layer is optically modulated. According to this driving method, LEDs can be partly turned off; therefore, an effect of reducing power consumption can be obtained particularly in the case of displaying an image having a large part on which black is displayed.

By combining these driving methods, the display characteristics of a liquid crystal display device, such as moving-image characteristics, can be improved as compared to those of conventional liquid crystal display devices.

In an embodiment of the present invention, a counter electrode layer is provided over a driving circuit portion, by which the electrostatic breakdown of a semiconductor device such as a thin film transistor can be prevented. However, S a protective circuit may be provided. The protective circuit is preferably formed with a non-linear element including an oxide semiconductor layer. For example, protective circuits are provided between the pixel portion and a scan line input terminal and between the pixel portion and a signal line input terminal. In this embodiment, a plurality of protective circuits are provided so as to prevent breakage of the a pixel transistor and the like which can be caused when a surge voltage due to static electricity or the like is applied to a scan line, a signal line, and a capacitor bus line. Therefore, the protective circuit is formed so as to release charge to a common wiring when a surge voltage is applied to the protective circuit. Further, the protective circuit includes non-linear elements arranged in parallel to each other with the scan line therebetween. The non-linear element includes a two-terminal element such as a diode or a three-terminal element such as a transistor. For example, the non-linear element can also be formed through the same step as the thin film transistor in the pixel portion, and can be made to have the same properties as a diode by connecting a gate terminal to a drain terminal of the non-linear element.

In the above-described manner, the parasitic capacitance can be reduced in a semiconductor device including a thin film transistor having an oxide semiconductor layer; thus, low power consumption of a semiconductor device can be achieved.

Embodiment 2

Another example is described in which, over the first substrate, a common connection portion is formed in the connection region for electrical connection of the counter electrode layers (the first counter electrode layer and the second counter electrode layer) which are provided on the second substrate to the connection wiring, in the semiconductor device including the liquid crystal layer between the first substrate and the second substrate as described in Embodiment 1. Note that a thin film transistor is formed as a switching element over the first substrate, and the common connection portion is manufactured in the same process as the switching element in a pixel portion, thereby avoiding complicating the process.

In this embodiment, an example is described in which the common connection portion is provided in a position overlapping with a sealing material for bonding the first substrate and the second substrate and is electrically connected to the counter electrode layer through a conductive particle in the sealing material. Alternatively, the common connection portion is provided in a position that is outside of the pixel portion and does not overlap with the sealing material and a paste containing conductive particles is provided separately from the sealing material so as to overlap with the common connection portion, whereby the common connection portion is electrically connected to the counter electrode layer.

Figure 3A:
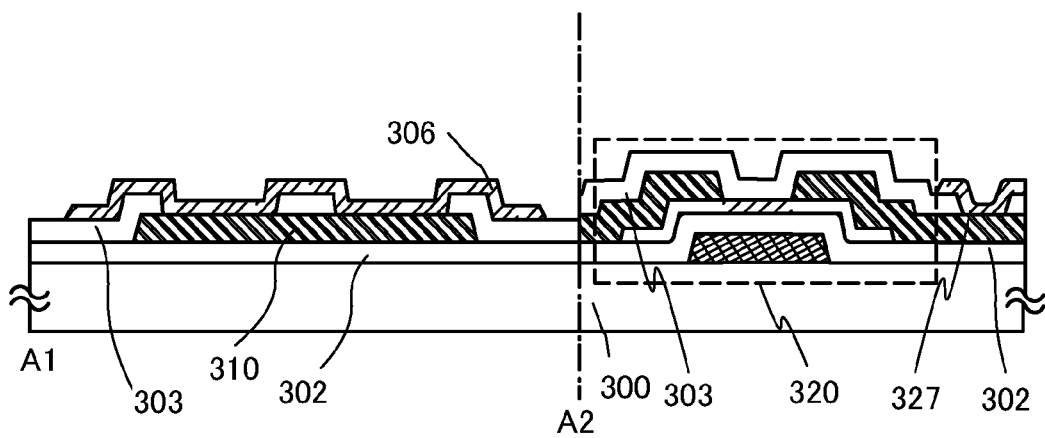
FIGS. 3A and 3B illustrate a semiconductor device.

FIG. 3A is a cross-sectional structural view of a semiconductor device in which a thin film transistor and a common connection portion are formed over one substrate (a first substrate 300).

In FIG. 3A, a thin film transistor 320 which is electrically connected to a pixel electrode layer 327 is a channel-etched thin film transistor provided in a pixel portion.

Figure 3B:
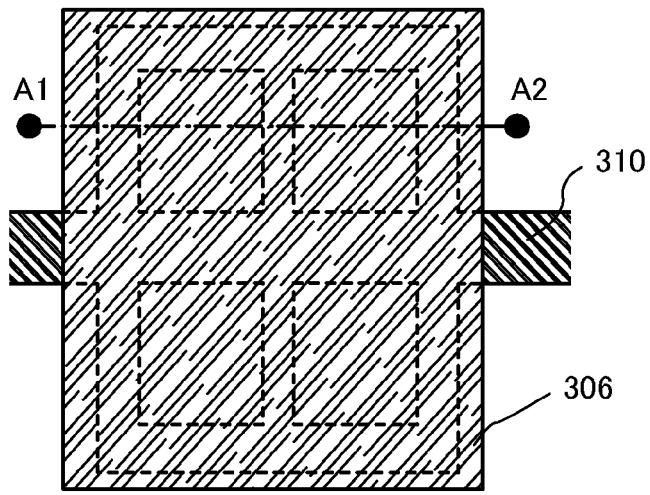

FIG. 3B illustrates an example of a top view of the common connection portion, and dashed line A1-A2 in FIG. 3B corresponds to a cross section of the common connection portion of FIG. 3A. Note that in FIG. 3B, the same portions as in FIG. 3A are denoted by the same reference numerals.

A common potential line 310 is provided over the gate insulating layer 302, and formed by using the same material and the same step as the source electrode layer and the drain electrode layer of the thin film transistor 320.

The common potential line 310 is covered with the protective insulating layer 303. The protective insulating layer 303 has a plurality of opening portions overlapping with the common potential line 310. These opening portions are formed through the same step as a contact hole that connects the drain electrode layer of the thin film transistor 320 to the pixel electrode layer 327.

Note that the contact hole in the pixel portion and the opening portions in the common connection portion are distinctively described because their sizes differ considerably. Further, in FIG. 3A, the pixel portion and the common connection portion are not illustrated on the same scale. For example, the length of the dashed line A1-A2 in the common connection portion is about 500 μm while the width of the thin film transistor is less than 50 μm; thus, the common connection portion actually has greater than or equal to ten times as large area as the thin film transistor. However, for simplicity, the pixel portion and the common connection portion are shown on different scales in FIG. 3A.

A common electrode layer 306 is provided over the protective insulating layer 303 and formed using the same material and the same step as the pixel electrode layer 327 in the pixel portion.

In this manner, the common connection portion is manufactured in the same step as the switching element in the pixel portion.

The first substrate provided with the pixel portion and the common connection portion and the second substrate having the counter electrode layer are fixed with the sealing material.

In the case where the sealing material contains conductive particles, the first and second substrates are aligned so that the sealing material overlaps with the common connection portion. For example, in the case of a small liquid crystal panel, two common connection portions overlap with the sealing material at opposite corners of the pixel portion. In the case of a large liquid crystal panel, four or more common connection portions overlap with the sealing material.

Note that the common electrode layer 306 is an electrode in contact with the conductive particles contained in the sealing material, and is electrically connected to the counter electrode layer of the second substrate.

In the case of using a liquid crystal injection method, the first and second substrates are bonded with a sealing material, and then a liquid crystal is injected between the first and second substrates. In the case of using a liquid crystal dropping method, a sealing material is drawn on the second substrate or the first substrate and a liquid crystal is dropped thereon; then, the first and second substrates are bonded to each other under a reduced pressure.

This embodiment shows an example of the common connection portion electrically connected to the counter electrode layer. However, the present invention is not particularly limited to the connection of the counter electrode layer with the common connection portion and can be applied to a connection portion for the connection of the counter electrode layer to another wiring or to an external connection terminal or the like.

This embodiment can be implemented in appropriate combination with any of the other embodiments.

Embodiment 3

In this embodiment, an example of a thin film transistor which is applicable to the semiconductor device disclosed in this specification is described. Thin film transistors 410 and 420 in this embodiment can be used as the driver circuit thin film transistor 1223 and the pixel thin film transistor 1211 in Embodiment 1, and the thin film transistor 320 in Embodiment 2.

An embodiment of a semiconductor device and a manufacturing method of the semiconductor device of this embodiment is described with reference to FIGS. 4A to 4E and FIG. 11.

FIGS. 4A to 4E illustrate cross-sectional structures of a semiconductor device. The thin film transistors 410 and 420 in FIGS. 4A to 4E each have one of bottom-gate structures called a channel-etched type and are also referred to as an inverted-staggered thin film transistor. In FIGS. 4A to 4E, the thin film transistor 410 is the driver circuit thin film transistor and the thin film transistor 420 is the pixel thin film transistor.

Although description is given using single-gate thin film transistors as the thin film transistors 410 and 420, multi-gate thin film transistors each including a plurality of channel formation regions may be formed as needed.

A process of manufacturing the thin film transistors 410 and 420 over a substrate 400 is described below with reference to FIGS. 4A to 4E.

First, a conductive film is formed over the substrate 400 having an insulating surface, and then, gate electrode layers 411 and 421 are formed in a first photolithography step. Note that a resist mask may be formed by an inkjet method. When the resist mask is formed by an inkjet method, a photomask is not used; therefore, manufacturing costs can be reduced.

There is no particular limitation on a substrate that can be used as the substrate 400 having an insulating surface as long as it has at least heat resistance to withstand heat treatment performed later. A glass substrate formed using barium borosilicate glass, aluminoborosilicate glass, or the like can be used.

When the temperature of the heat treatment performed later is high, a substrate having a strain point of 730° C. or higher is preferably used as the glass substrate. As a material of the glass substrate, a glass material such as aluminosilicate glass, aluminoborosilicate glass, or barium borosilicate glass is used, for example. Note that by containing a larger amount of barium oxide (BaO) than boric acid, a glass substrate is heat-resistant and of more practical use. Therefore, a glass substrate containing a larger amount of BaO than $B_2O_3$ is preferably used.

Note that, instead of the glass substrate described above, a substrate formed using an insulator such as a ceramic substrate, a quartz substrate, or a sapphire substrate may be used as the substrate 400. Alternatively, crystallized glass or the like may be used.

An insulating film serving as a base film may be provided between the substrate 400 and the gate electrode layers 411 and between the substrate 400 and the gate electrode layer 421. The base film has a function of preventing diffusion of an impurity element from the substrate 400, and can be formed to have a single-layer or stacked-layer structure using one or more of a silicon nitride film, a silicon oxide film, a silicon nitride oxide film, and a silicon oxynitride film.

The gate electrode layers 411 and 421 can each be formed to have a single-layer or stacked-layer structure using any of materials such as molybdenum, titanium, chromium, tantalum, tungsten, aluminum, copper, neodymium, and scandium; or an alloy material which contains any of these materials as its main component.

As a two-layer stacked structure of each of the first gate electrode layers 411 and 421, for example, a two-layer stacked structure in which a molybdenum layer is stacked over an aluminum layer, a two-layer structure in which a molybdenum layer is stacked over a copper layer, a two-layer structure in which a titanium nitride layer or a tantalum nitride layer is stacked over a copper layer, or a two-layer structure in which a titanium nitride layer and a molybdenum layer are stacked is preferable. As a three-layer stacked structure, a stacked layer of a tungsten layer or a tungsten nitride layer, an alloy of aluminum and silicon or an alloy of aluminum and titanium, and a titanium nitride layer or a titanium layer is preferable.

Next, a gate insulating layer 402 is formed over the gate electrode layers 411 and 421.

The gate insulating layer 402 can be formed to have a single-layer or stacked-layer structure using a silicon oxide layer, a silicon nitride layer, a silicon oxynitride layer, a silicon nitride oxide layer, or an aluminum oxide layer by a plasma CVD method, a sputtering method, or the like. For example, a silicon oxynitride layer may be formed using $SiH_4$, oxygen, and nitrogen as deposition gases by a plasma CVD method. The thickness of the gate insulating layer 402 is greater than or equal to 100 nm and less than or equal to 500 nm; in the case where the gate insulating layer 402 is formed to have a stacked-layer structure, for example, a first gate insulating layer with a thickness greater than or equal to 50 nm and less than or equal to 200 nm and a second gate insulating layer with a thickness greater than or equal to 5 nm and less than or equal to 300 nm are stacked.

In this embodiment, a silicon oxynitride layer is formed to a thickness of 100 nm by a plasma CVD method as the gate insulating layer 402.

Then, an oxide semiconductor layer 430 is formed to a thickness of from 2 nm to 200 nm over the gate insulating layer 402. In order to maintain the amorphous state even after the heat treatment for dehydration or dehydrogenation of the oxide semiconductor layer 430, the oxide semiconductor layer 430 preferably has a small thickness of less than or equal to 50 nm. A small thickness of the oxide semiconductor layer 430 can suppress crystallization even when the heat treatment is performed on the oxide semiconductor layer.

Note that before the oxide semiconductor layer 430 is formed by a sputtering method, dust attached to a surface of the gate insulating layer 402 is preferably removed by reverse sputtering in which an argon gas is introduced and plasma is generated. The reverse sputtering is a method in which voltage is applied to a substrate side with use of an RF power source in an argon atmosphere and a surface of the substrate is exposed to plasma so that a substrate surface is modified. Note that instead of an argon atmosphere, nitrogen, helium, oxygen, or the like may be used.

Figure 4A:
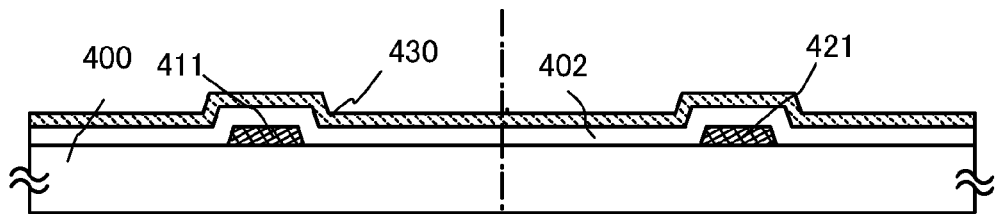
FIGS. 4A to 4E illustrate a method for manufacturing a semiconductor device.
Figure 4B:
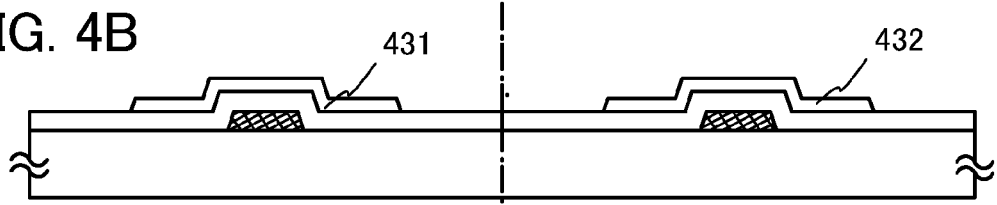
Figure 4C:
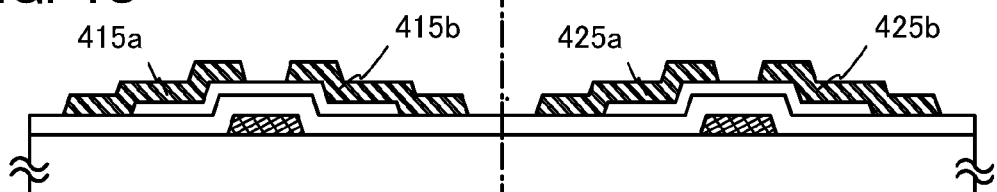
Figure 4D:
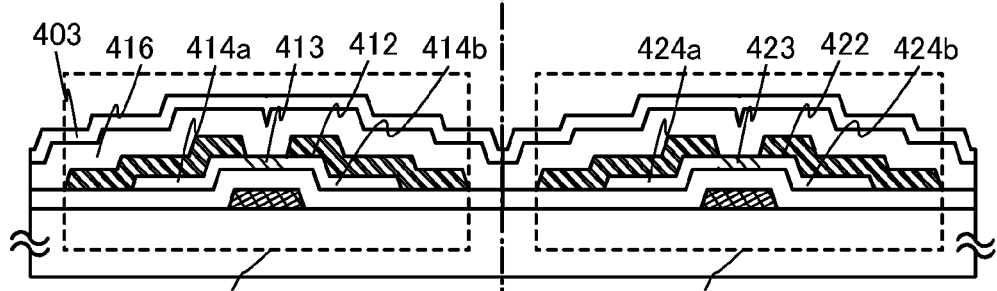

The oxide semiconductor layer 430 is formed as an In—Ga—Zn—O-based non-single-crystal layer, an In—Sn—Zn—O-based oxide semiconductor layer, an In—Al—Zn—O-based oxide semiconductor layer, a Sn—Ga—Zn—O-based oxide semiconductor layer, an Al—Ga—Zn—O-based oxide semiconductor layer, a Sn—Al—Zn—O-based oxide semiconductor layer, an In—Zn—O-based oxide semiconductor layer, a Sn—Zn—O-based oxide semiconductor layer, an Al—Zn—O-based oxide semiconductor layer, an In—O-based oxide semiconductor layer, a Sn—O-based oxide semiconductor layer, or a Zn—O-based oxide semiconductor layer. In this embodiment, the oxide semiconductor layer 430 is formed by a sputtering method with the use of an In—Ga—Zn—O-based metal oxide target. A cross-sectional view of this stage is illustrated in FIG. 4A. Further, the oxide semiconductor layer 430 can be formed by a sputtering method in a rare gas (typically argon) atmosphere, an oxygen atmosphere, or an atmosphere of a rare gas (typically argon) and oxygen. In the case of using a sputtering method, deposition is performed with the use of a target containing $SiO_2$ at greater than or equal to 2 wt % and less than or equal to 10 wt %, so that $SiO_x$ (x>0) which hinders crystallization is contained in the oxide semiconductor layer 430. Thus, it is preferable that the oxide semiconductor layer 430 be prevented from being crystallized in heat treatment for dehydration or dehydrogenation, which is performed later.

Here, film deposition is performed using a metal oxide target containing In, Ga, and Zn ($In_2O_3$:$Ga_2O_3$:ZnO=1:1:1 [mol %] and In:Ga:Zn=1:1:0.5 [at %]). The deposition condition is set as follows: the distant between the substrate 400 and the target is 100 mm, the pressure is 0.2 Pa, the direct current (DC) power supply is 0.5 kW, and the atmosphere is a mixed atmosphere of argon and oxygen (argon:oxygen=30 sccm:20 sccm and the oxygen flow rate is 40%). Note that a pulse direct current (DC) power supply is preferable because dust can be reduced and the film thickness can be uniform. The In—Ga—Zn—O-based non-single-crystal film is formed to a thickness of greater than or equal to 5 nm and less than or equal to 200 nm. In this embodiment, as the oxide semiconductor layer, a 20-nm-thick In—Ga—Zn—O-based non-single-crystal film is formed by a sputtering method with the use of an In—Ga—Zn—O-based metal oxide target. As the metal oxide target containing In, Ga, and Zn, a target having a composition ratio of In:Ga:Zn=1:1:1 (at %) or a target having a composition ratio of In:Ga:Zn=1:1:2 (at %) can also be used.

Examples of a sputtering method include an RF sputtering method in which a high-frequency power source is used as a sputtering power source, a DC sputtering method, and a pulsed DC sputtering method in which a bias is applied in a pulsed manner. An RF sputtering method is mainly used in the case of forming an insulating film, and a DC sputtering method is mainly used in the case of forming a metal film.

In addition, there is a multi-source sputtering apparatus in which a plurality of targets of different materials can be set. With the multi-source sputtering apparatus, films of different materials can be deposited to be stacked in the same chamber, and a film of plural kinds of materials can be deposited by electric discharge at the same time in the same chamber.

In addition, there are a sputtering apparatus provided with a magnet system inside the chamber and used for a magnetron sputtering method, and a sputtering apparatus used for an ECR sputtering method in which plasma generated with the use of microwaves is used without using glow discharge.

Furthermore, as a deposition method using sputtering, there are also a reactive sputtering method in which a target substance and a sputtering gas component are chemically reacted with each other during deposition to form a thin compound film thereof, and a bias sputtering method in which a voltage is also applied to a substrate during deposition.

Then, in a second photolithography step, the oxide semiconductor layer 430 is processed into island-shaped oxide semiconductor layers. The resist mask for forming the island-shaped oxide semiconductor layers may be formed by an inkjet method. When the resist mask is formed by an inkjet method, a photomask is not used; therefore, manufacturing costs can be reduced.

Next, the oxide semiconductor layers are subjected to dehydration or dehydrogenation. The temperature of first heat treatment for dehydration or dehydrogenation is higher than or equal to 400° C. and lower than or equal to 750° C., preferably higher than or equal to 400° C. and lower than the strain point of the substrate. Here, the substrate is introduced into an electric furnace which is one of heat treatment apparatuses, heat treatment is performed on the oxide semiconductor layers in a nitrogen atmosphere at 450° C. for one hour, and then, the oxide semiconductor layer is not exposed to the air so that entry of water and hydrogen into the oxide semiconductor layer is prevented; thus, oxide semiconductor layers 431 and 432 are obtained (see FIG. 4B).

The apparatus for the heat treatment is not limited to the electric furnace and may be the one provided with a device for heating an object to be processed, using heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object to be processed by heat treatment, such as nitrogen or a rare gas such as argon is used.

For example, as the first heat treatment, GRTA may be performed as follows. The substrate is placed in an inert gas which has been heated to a high temperature of 650° C. to 700° C., heated for several minutes, and transferred and taken out from the heated inert gas. GRTA enables a high-temperature heat treatment in a short time.

Note that in the first heat treatment, it is preferable that water, hydrogen, and the like be not included in nitrogen or a rare gas such as helium, neon, or argon. Alternatively, it is preferable that nitrogen or a rare gas such as helium, neon, or argon introduced into an apparatus for the heat treatment have a purity of 6N (99.9999%) or more, preferably, 7N (99.99999%) or more (that is, an impurity concentration is set to 1 ppm or lower, preferably, 0.1 ppm or lower).

The oxide semiconductor layers might be crystallized to be a microcrystalline film or a polycrystalline film depending on a condition of the first heat treatment or a material of the oxide semiconductor layers. For example, the oxide semiconductor layers may be crystallized to become microcrystalline oxide semiconductor layers having a degree of crystallization of 90% or more, or 80% or more. Further, depending on the condition of the first heat treatment and the material of the oxide semiconductor layers, the oxide semiconductor layers may become amorphous oxide semiconductor layers containing no crystalline component. The oxide semiconductor layers might become oxide semiconductor layers in which a microcrystalline portion (with a grain diameter greater than or equal to 1 nm and less than or equal to 20 nm, typically greater than or equal to 2 nm and less than or equal to 4 nm) is mixed in an amorphous oxide semiconductor. A needle-like crystal in a longitudinal direction (the film-thickness direction) might be generated on the surface side of the oxide semiconductor layers in the case where heat treatment at a high temperature is performed using RTA (e.g., GRTA or LRTA).

Alternatively, the first heat treatment may be performed on the oxide semiconductor layer 430 which has not yet been processed into the island-shaped oxide semiconductor layers. In that case, after the first heat treatment, the substrate is taken out of the heating apparatus and a photolithography step is performed.

The heat treatment for dehydration or dehydrogenation of the oxide semiconductor layers may be performed at any of the following timings: after the oxide semiconductor layer is formed; after a source electrode layer and a drain electrode layer are formed over the oxide semiconductor layer; and after a protective insulating film is formed over the source electrode layer and the drain electrode layer.

Further, the step of forming the contact hole in the gate insulating layer 402 may be performed either before or after the oxide semiconductor layer 430 is subjected to dehydration or dehydrogenation treatment.

Note that the etching of the oxide semiconductor layer may be dry etching, without limitation to wet etching.

As the etching gas for dry etching, a gas containing chlorine (chlorine-based gas such as chlorine ($Cl_2$), boron chloride ($BCl_3$), silicon chloride ($SiCl_4$), or carbon tetrachloride ($CCl_4$)) is preferably used.

Alternatively, a gas containing fluorine (fluorine-based gas such as carbon tetrafluoride ($CF_4$), sulfur fluoride ($SF_6$), nitrogen fluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching method, a parallel plate RIE (reactive ion etching) method or an ICP (inductively coupled plasma) etching method can be used. In order to etch the oxide semiconductor layer into desired shapes, the etching condition (the amount of electric power applied to a coil-shaped electrode, the amount of electric power applied to an electrode on a substrate side, the temperature of the electrode on the substrate side, or the like) is adjusted as appropriate.

As an etchant used for wet etching, a mixed solution of phosphoric acid, acetic acid, and nitric acid, or the like can be used. Alternatively, ITO07N (produced by KANTO CHEMICAL CO., INC.) may be used.

The etchant used in the wet etching is removed by cleaning together with the material which is etched off. The waste liquid including the etchant and the material etched off may be purified and the material may be reused. When a material such as indium included in the oxide semiconductor layer is collected from the waste liquid after the etching and reused, the resources can be efficiently reused and the cost can be reduced.

The etching conditions (such as an etchant, etching time, and temperature) are appropriately adjusted depending on the material so that the oxide semiconductor layer can be etched into a desired shape.

Next, a metal conductive film is formed over the gate insulating layer 402 and the oxide semiconductor layers 431 and 432. The metal conductive film may be formed by a sputtering method or a vacuum evaporation method. As the material of the metal conductive film, there are an element selected from Al, Cr, Cu, Ta, Ti, Mo, or W; an alloy including any of the above elements, an alloy film containing a combination of any of these elements; and the like. Further, one or more materials selected from manganese, magnesium, zirconium, beryllium, and thorium may be used. The metal conductive film may have a single-layer structure or a stacked-layer structure of two or more layers. For example, a single-layer structure of an aluminum film including silicon, a two-layer structure in which a titanium film is stacked over an aluminum film, a three-layer structure in which a Ti film, an aluminum film, and a Ti film are stacked in the order presented, and the like can be given. Alternatively, a film, an alloy film, or a nitride film of a combination of Al and one or plurality of elements selected from the followings may be used: titanium (Ti), tantalum (Ta), tungsten (W), molybdenum (Mo), chromium (Cr), neodymium (Nd), and scandium (Sc).

If heat treatment is performed after formation of the metal conductive film, it is preferable that the metal conductive film have heat resistance enough to withstand the heat treatment.

A third photolithography step is performed. A resist mask is formed over the metal conductive film and selective etching is performed, so that a source electrode layer 415a, a drain electrode layer 415b, a source electrode layer 425a, and a drain electrode layer 425b are formed. Then, the resist mask is removed (see FIG. 4C).

Note that materials and etching conditions are adjusted as appropriate so that the oxide semiconductor layers 431 and 432 are not removed by etching of the metal conductive film.

In this embodiment, a Ti film is used as the metal conductive film, an In—Ga—Zn—O based oxide is used as the oxide semiconductor layers 431 and 432, and an ammonia peroxide mixture (31 wt % hydrogen peroxide in water:28 wt % ammonia water:water=5:2:2) is used as the etchant.

Note that in the third photolithography step, part of the oxide semiconductor layers 431 and 432 is etched, whereby oxide semiconductor layers each having a groove (a depressed portion) might be formed. The resist mask used for forming the source electrode layer 415a, the drain electrode layer 415b, the source electrode layer 425a, and the drain electrode layer 425b may be formed by an inkjet method. When the resist mask is formed by an inkjet method, a photomask is not used; therefore, manufacturing costs can be reduced.

In order to reduce the number of photomasks and steps in photolithography steps, etching may be performed with the use of a resist mask formed using a multi-tone mask which is a light-exposure mask through which light is transmitted so as to have a plurality of intensities. Since a resist mask formed with the use of a multi-tone mask has a plurality of film thicknesses and further can be changed in shape by performing etching on the resist mask, such a resist mask can be used in a plurality of etching steps for processing into different patterns. Therefore, a resist mask corresponding at least two or more kinds of different patterns can be formed by one multi-tone mask. Thus, the number of light-exposure masks can be reduced and the number of corresponding photolithography steps can be also reduced, whereby simplification of a process can be realized.

Then, plasma treatment with a gas such as $N_2O$, $N_2$, or Ar is performed. By the plasma treatment, water adsorbed to surfaces of exposed portions of the oxide semiconductor layers, and the like are removed. Alternatively, plasma treatment may be performed using a mixed gas of oxygen and argon.

After the plasma treatment, an oxide insulating layer 416 which serves as a protective insulating film and is in contact with parts of the oxide semiconductor layers 431 and 432 is formed without exposure to the air.

The oxide insulating layer 416, which has a thickness of 1 nm or more, can be formed as appropriate using a sputtering method or the like, that is, a method with which impurities such as water and hydrogen are not mixed into the oxide insulating layer 416. When hydrogen is contained in the oxide insulating layer 416, entry of the hydrogen to the oxide semiconductor layers 431 and 432 or abstraction of oxygen in the oxide semiconductor layers by the hydrogen is caused, thereby making the backchannels of the oxide semiconductor layers 431 and 432 have a lower resistance (have an n-type conductivity) and forming parasitic channels. Therefore, it is important that a formation method in which hydrogen is not used is employed in order to form the oxide insulating layer 416 containing as little hydrogen as possible.

In this embodiment, a silicon oxide film is formed to a thickness of 200 nm as the oxide insulating layer 416 by a sputtering method. The substrate temperature in deposition may be from a room temperature to 300° C. and is 100° C. in this embodiment. The silicon oxide film can be formed by a sputtering method in a rare gas (typically argon) atmosphere, an oxygen atmosphere, or an atmosphere including a rare gas (typically argon) and oxygen. As a target, a silicon oxide target or a silicon target can be used. For example, the silicon oxide film can be formed using a silicon target by a sputtering method in an oxygen atmosphere. For the oxide insulating layer 416 formed in contact with the oxide semiconductor layers 431 and 432 having reduced resistance, an inorganic insulating film that does not contain impurities such as moisture, a hydrogen ion, and $OH^-$ and blocks entry of these impurities from the outside is used. Typically, a silicon oxide film, a silicon nitride oxide film, an aluminum oxide film, an aluminum oxynitride film, or the like is used.

Next, second heat treatment (preferably from 200° C. to 400° C., for example, from 250° C. to 350° C.) is performed in an inert gas atmosphere or an oxygen gas atmosphere. For example, the second heat treatment is performed in a nitrogen atmosphere at 250° C. for one hour. In the second heat treatment, part of the oxide semiconductor layers 431 and 432 (the channel formation regions) is heated while in contact with the oxide insulating layer 416.

Through the above steps, the oxide semiconductor layers 431 and 432 are decreased in resistance by the heat treatment for dehydration or dehydrogenation, and then parts of the oxide semiconductor layers 431 and 432 are selectively changed to an oxygen excess state. As a result, the channel formation region 413 overlapping with the gate electrode layer 411 becomes i-type, and a high-resistance source region 414a which overlaps with the source electrode layer 415a and a high-resistance drain region 414b which overlaps with the drain electrode layer 415b are formed in a self-aligned manner. Through the above steps, the thin film transistor 410 is formed. Similarly, the channel formation region 423 overlapping with the gate electrode layer 421 becomes i-type, and the high-resistance source region 424a overlapping with the source electrode layer 425a and the high-resistance drain region 424b overlapping with the drain electrode layer 425b are formed in a self-aligned manner. Thus, the thin film transistor 420 is formed.

Further, heat treatment may be performed at 100° C. to 200° C. for from one hour to 30 hours in the air. In this embodiment, the heat treatment is performed at 150° C. for 10 hours. This heat treatment may be performed at a fixed heating temperature. Alternatively, the following temperature cycle may be applied plural times repeatedly: the temperature is increased from a room temperature to a temperature of 100° C. to 200° C. and then decreased to a room temperature. Further, this heat treatment may be performed before formation of the oxide insulating layer 416 under a reduced pressure. Under a reduced pressure, the heating time can be shortened. With such heat treatment, hydrogen is introduced from the oxide semiconductor layers 431 and 432 to the oxide insulating layer 416; thus, normally-off thin film transistors can be obtained. Therefore, reliability of the semiconductor device can be improved.

Note that by forming the high-resistance drain regions 414b and 424b (or the high-resistance source regions 414a and 424a) in the oxide semiconductor layers 431 and 432 overlapping with the drain electrode layers 415b and 425b (and the source electrode layers 415a and 425a), reliability of the thin film transistors 410 and 420 can be improved. Specifically, by forming the high-resistance drain regions 414b and 424b, the structure can be obtained in which conductivities of the drain electrode layers 415b and 425b, the high-resistance drain regions 414b and 424b, and the channel formation regions 413 and 423 vary stepwise. Therefore, in the case where the thin film transistors 410 and 420 operate with the drain electrode layers 415b and 425b connected to a wiring for supplying a high power supply potential VDD, the high-resistance drain regions 414b and 424b serve as a buffer and a high electric field is not applied locally even if the high electric field is applied between the gate electrode layer 411 and the drain electrode layer 415b and between the gate electrode layer 421 and the drain electrode layer 425b; thus, the withstand voltage of the thin film transistor can be increased.

Further, the high-resistance source regions 414a and 424a or the high-resistance drain regions 414b and 424b are formed in the entire thickness direction in the case where the thickness of the oxide semiconductor layers 431 and 432 is 15 nm or smaller. In the case where the thickness of the oxide semiconductor layer is 30 nm or larger and 50 nm or smaller, part of the oxide semiconductor layers 431 and 432, that is, regions contacting with the source electrode layers 415a and 425a or the drain electrode layers 415b and 425b and the vicinity thereof are reduced in resistance and become a high-resistance source regions 414a and 424a or a high-resistance drain regions 414b and 424b, while a region close to the gate insulating layer 402 can be made to be i-type.

A protective insulating layer 403 may be additionally formed over the oxide insulating layer 416. For example, a silicon nitride film is formed by an RF sputtering method. An RF sputtering method is preferable as a formation method of the protective insulating layer because of high productivity. The protective insulating layer 403 is formed using an inorganic insulating film which does not include impurities such as moisture, a hydrogen ion, and $OH^-$ and blocks entry of these from the outside; for example, a silicon nitride film, an aluminum nitride film, a silicon nitride oxide film, an aluminum oxynitride film, or the like is used. In this embodiment, the protective insulating layer 403 is formed using a silicon nitride film (see FIG. 4D).

Figure 4E:
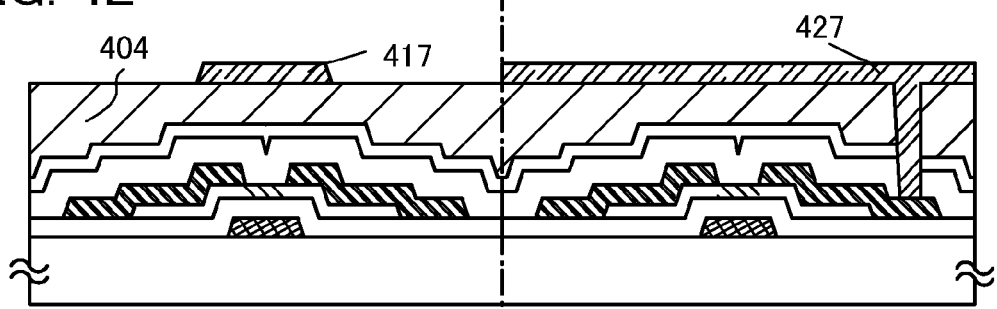

A planarizing insulating layer for planarization may be provided over the protective insulating layer 403. As illustrated in FIG. 4E, a planarization insulating layer 404 is formed.

The planarization insulating layer 404 can be formed using an organic material having heat resistance, such as a polyimide, an acrylic resin, a benzocyclobutene-based resin, a polyamide, or an epoxy resin. Other than such organic materials, it is also possible to use a low-dielectric constant material (a low-k material), a siloxane-based resin, PSG (phosphosilicate glass), BPSG (borophosphosilicate glass), or the like. The planarization insulating layer 404 may be formed by stacking plural insulating films formed using any of these materials.

Note that the siloxane-based resin corresponds to a resin including a Si—O—Si bond formed using a siloxane-based material as a starting material. The siloxane-based resin may include as a substituent an organic group (e.g., an alkyl group or an aryl group) or a fluoro group. In addition, the organic group may include a fluoro group.

There is no particular limitation on the method for forming the planarization insulating layer 404, and the planarization insulating layer 404 can be formed, depending on the material, by a method such as a sputtering method, an SOG method, spin coating, dip coating, spray coating, or a droplet discharge method (e.g., an inkjet method, screen printing, or offset printing), or a tool (equipment) such as a doctor knife, a roll coater, a curtain coater, or a knife coater.

Figure 11:
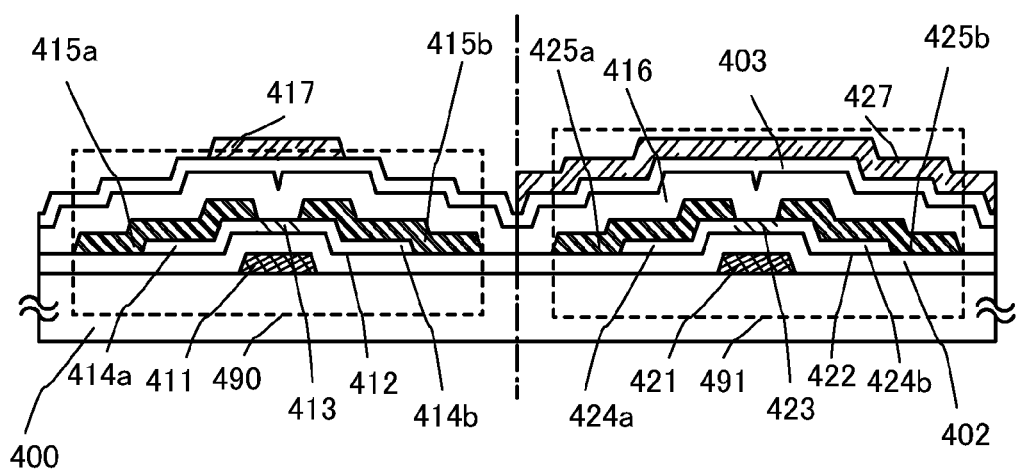
FIG. 11 illustrates a semiconductor device.

Further, as illustrated in FIG. 11, a conductive layer 417 and a pixel electrode layer 427 may be formed over the oxide insulating layer 416 and the protective insulating layer 403 without the formation of the planarization insulating layer 404.

A fourth photolithography step is performed. A resist mask is formed and selective etching is performed to remove parts of the oxide insulating layer 416, the protective insulating layer 403, and the planarization insulating layer 404, so that an opening reaching the drain electrode layer 425b is formed.

Next, a light-transmitting conductive film is formed. The light-transmitting conductive film is formed using indium oxide ($In_2O_3$), an indium oxide-tin oxide mixed oxide ($In_2O_3$—$SnO_2$, abbreviated as ITO), or the like by a sputtering method, a vacuum evaporation method, or the like. Alternatively, an Al—Zn—O-based non-single-crystal film including nitrogen, that is, an Al—Zn—O—N-based non-single-crystal film, a Zn—O-based non-single-crystal film including nitrogen, or a Sn—Zn—O-based non-single-crystal film including nitrogen may be used. Note that the composition (at %) of zinc in the Al—Zn—O—N-based non-single-crystal film is 47 at % or less and is higher than that of aluminum in the non-single-crystal film; the composition (at %) of aluminum in the non-single-crystal film is higher than that of nitrogen in the non-single-crystal film. Such a material is etched with a hydrochloric acid-based solution. However, since an etching residue is easily precipitated and left over the substrate particularly in etching ITO, an indium oxide-zinc oxide mixed oxide ($In_2O_3$—ZnO) may be used to improve etching processability.

Note that the unit of the composition of components in the light-transmitting conductive film is atomic percent (at %), and the composition of components is evaluated by analysis using an electron probe X-ray microanalyzer (EPMA).

Next, a fifth photolithography step is performed. A resist mask is formed, and an unnecessary portion of the light-transmitting conductive film is removed by etching to form the pixel electrode layer 427 and the conductive layer 417. Then, the resist mask is removed (see FIG. 4E).

In this embodiment, the step of forming the opening in the gate insulating layer is not illustrated in a drawing; however, the step of forming an opening in the gate insulating layer may be performed in either the same photolithography step as that of the oxide insulating layer and the protective insulating layer or another photolithography step. When the opening is formed in another photolithography step, the number of photolithography steps is six.

This embodiment can be implemented in appropriate combination with any of the other embodiments.

As described above, parasitic capacitance is reduced in the semiconductor device including a thin film transistor formed using an oxide semiconductor layer and thus, low power consumption of a semiconductor device can be achieved.

Further, the semiconductor device including a thin film transistor formed using an oxide semiconductor layer can have high reliability.

Embodiment 4

This embodiment describes another example of thin film transistors applicable to the semiconductor device disclosed in this specification. Thin film transistors 450 and 460 which are described in this embodiment can be used as the driver circuit thin film transistor 1223 and the pixel thin film transistor 1211 in Embodiment 1, and the thin film transistor 320 in Embodiment 2.

One embodiment of a semiconductor device and a manufacturing method of the semiconductor device is described with reference to FIGS. 5A to 5E.

FIGS. 5A to 5E illustrate cross-sectional structures of a semiconductor device. The thin film transistors 450 and 460 in FIGS. 5A to 5E each have one of the bottom-gate structures called a channel protection type (also referred to as a channel-stop type) and are also referred to as an inverted staggered thin film transistor.

Although description is given using single-gate thin film transistors as the thin film transistors 450 and 460, multi-gate thin film transistors each including a plurality of channel formation regions may be formed as needed.

A process of manufacturing the thin film transistors 450 and 460 over a substrate 400 is described below with reference to FIGS. 5A to 5E.

First, a conductive film is formed over the substrate 400 having an insulating surface, and then, gate electrode layers 451 and 461 are formed in a first photolithography step. Note that a resist mask may be formed by an inkjet method. When the resist mask is formed by an inkjet method, a photomask is not used; therefore, manufacturing costs can be reduced.

The gate electrode layers 451 and 461 can be formed with a single-layer structure or a stacked-layer structure using any of metal materials such as molybdenum, titanium, chromium, tantalum, tungsten, aluminum, copper, neodymium, and scandium; or an alloy material containing any of these metal materials as its main component.

Next, the gate insulating layer 402 is formed over the gate electrode layers 451 and 461.

In this embodiment, a silicon oxynitride layer is formed to a thickness of 100 nm by a plasma CVD method as the gate insulating layer 402.

Next, an oxide semiconductor layer is formed over the gate insulating layer 402 to have a thickness of from 2 nm to 200 nm and is processed into island-like oxide semiconductor layers in a second photolithography step. In this embodiment, the oxide semiconductor layer is formed using an In—Ga—Zn—O based metal oxide target by a sputtering method.

Figure 5A:
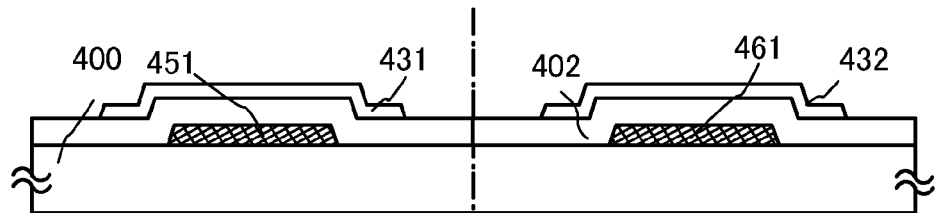
FIGS. 5A to 5E illustrate a method for manufacturing a semiconductor device.
Figure 5B:
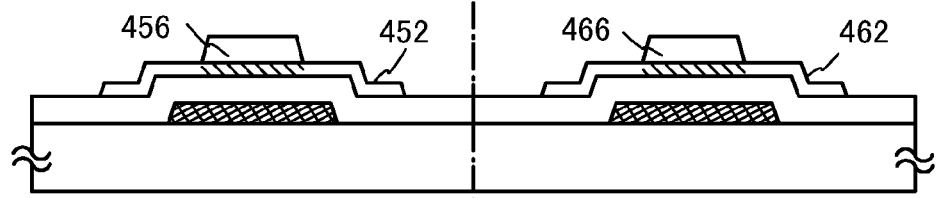
Figure 5C:
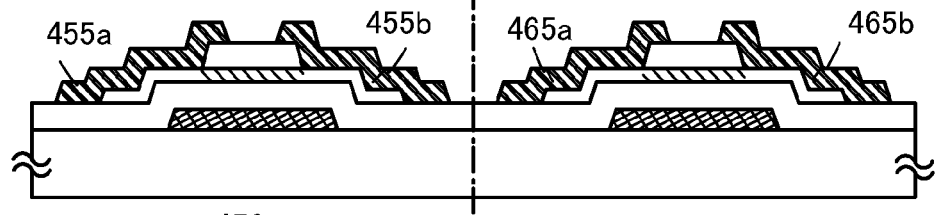
Figure 5D:
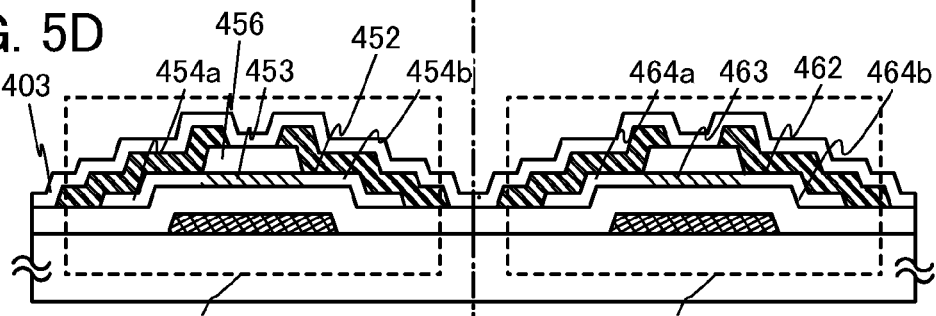
Figure 5E:
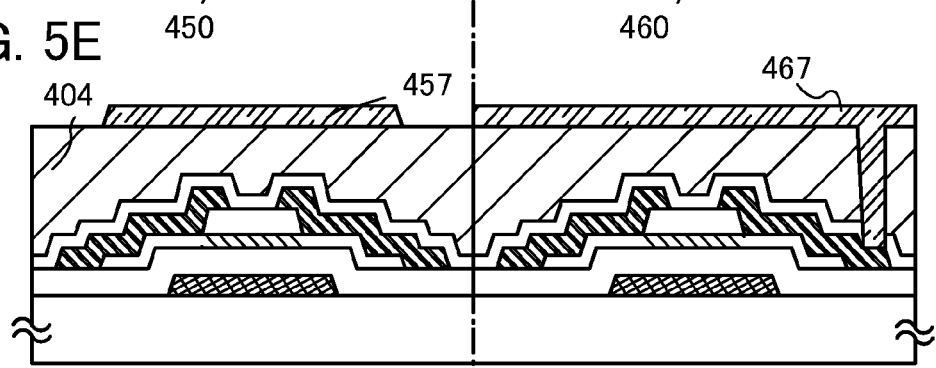

Next, the oxide semiconductor layers are subjected to dehydration or dehydrogenation. The temperature of the first heat treatment for dehydration or dehydrogenation is higher than or equal to 400° C. and lower than or equal to 750° C., preferably higher than or equal to 400° C. and lower than the strain point of the substrate. Here, the substrate is introduced into an electric furnace which is one of heat treatment apparatuses, heat treatment is performed on the oxide semiconductor layers in a nitrogen atmosphere at 450° C. for one hour, and then, the oxide semiconductor layer is not exposed to the air so that entry of water and hydrogen into the oxide semiconductor layer is prevented. Thus, oxide semiconductor layers 431 and 432 are obtained (FIG. 5A).

Then, plasma treatment with a gas such as $N_2O$, $N_2$, or Ar is performed. By this plasma treatment, water adsorbed to surfaces of exposed portions of the oxide semiconductor layers, and the like are removed. Alternatively, plasma treatment may be performed using a mixed gas of oxygen and argon.

Next, after an oxide insulating layer is formed over the gate insulating layer 402 and the oxide semiconductor layers 431 and 432, a third photolithography step is performed. A resist mask is formed and etching is performed selectively, whereby oxide insulating layers 456 and 466 are formed. After that, the resist mask is removed.

In this embodiment, a silicon oxide film is formed to a thickness of 200 nm for the oxide insulating layers 456 and 466 by a sputtering method. The substrate temperature in deposition may be from a room temperature to 300° C. and is 100° C. in this embodiment. The silicon oxide film can be formed by a sputtering method in a rare gas (typically argon) atmosphere, an oxygen atmosphere, or an atmosphere containing a rare gas (typically argon) and oxygen. As a target, a silicon oxide target or a silicon target can be used. For example, the silicon oxide film can be formed using a silicon target by a sputtering method in an oxygen atmosphere. For the oxide insulating layers 456 and 466 formed in contact with the oxide semiconductor layers 431 and 432 having reduced resistance, an inorganic insulating film that does not contain impurities such as moisture, a hydrogen ion, and OH⁻ and blocks entry of such impurities from the outside is used. Typically, a silicon oxide film, a silicon nitride oxide film, an aluminum oxide film, an aluminum oxynitride film, or the like is used.

Next, second heat treatment (preferably from 200° C. to 400° C., for example, from 250° C. to 350° C.) may be performed in an inert gas atmosphere or an oxygen atmosphere. For example, the second heat treatment is performed in a nitrogen atmosphere at 250° C. for one hour. In the second heat treatment, part of the oxide semiconductor layers (the channel formation regions) is heated while in contact with the oxide insulating layers 456 and 466.

In this embodiment, heat treatment is further performed on the oxide semiconductor layers 431 and 432 over which the oxide insulating layers 456 and 466 are provided and thus parts of the oxide semiconductor layers 431 and 432 are exposed in an inert gas atmosphere such as nitrogen or under reduced pressure. By performing heat treatment in an inert gas atmosphere such as nitrogen or under reduced pressure, regions of the oxide semiconductor layers 431 and 432, which are not covered with the oxide insulating layers 456 and 466 and are thus exposed, can be reduced in resistance. For example, heat treatment is performed in a nitrogen atmosphere at 250° C. for one hour.

With the heat treatment for the oxide semiconductor layers 431 and 432 provided with the oxide insulating layers 456 and 466, respectively, in a nitrogen atmosphere, the resistance of the exposed regions of the oxide semiconductor layers 431 and 432 is reduced. Thus, oxide semiconductor layers 452 and 462 each including regions with different resistances (indicated as shaded regions and white regions in FIG. 5B) are formed.

Next, after a metal conductive film is formed over the gate insulating layer 402, the oxide semiconductor layers 452 and 462, and the oxide insulating layers 456 and 466, a resist mask is formed in a fourth photolithography step and selective etching is performed, whereby source electrode layers 455a and 465a and drain electrode layers 455b and 465b are formed. After that, the resist mask is removed (see FIG. 5C). The source electrode layer 455a and the drain electrode layer 455b are in contact with part of the oxide insulating layer 456 and with part of the oxide semiconductor layer 452. Similarly, the source electrode layer 465a and the drain electrode layer 465b are in contact with part of the oxide insulating layer 456 and with part of the oxide semiconductor layer 452.

As the material of the source electrode layers 455a and 465a and the drain electrode layers 455b and 465b, there are an element selected from Al, Cr, Cu, Ta, Ti, Mo, and W; an alloy containing any of these elements as its component; an alloy film containing a combination of any of these elements; and the like. Further, the metal conductive film may have a single-layer structure or a stacked-layer structure of two or more layers.

Through the above steps, the oxide semiconductor layers 431 and 432 are decreased in resistance by the heat treatment for dehydration or dehydrogenation, and then parts of the oxide semiconductor layers 431 and 432 are selectively changed to an oxygen excess state. As a result, the channel formation regions 453 and 463 which overlap with the gate electrode layers 451 and 461, respectively, become i-type, and high-resistance source regions 454a and 464a which overlap with the source electrode layers 455a and 465a, respectively, and high-resistance drain regions 454b and 464b which overlap with the drain electrode layers 455b and 465b, respectively, are formed in a self-aligned manner. Thus, the thin film transistors 450 and 460 are formed.

Further, heat treatment may be performed at 100° C. to 200° C. for from one hour to 30 hours in the air. In this embodiment, the heat treatment is performed at 150° C. for 10 hours. This heat treatment may be performed at a fixed heating temperature. Alternatively, the following temperature cycle may be applied plural times repeatedly: the temperature is increased from a room temperature to a temperature of 100° C. to 200° C. and then decreased to a room temperature. Further, this heat treatment may be performed under a reduced pressure before formation of the oxide insulating layers 456 and 466. Under a reduced pressure, the heating time can be shortened. With such heat treatment, hydrogen is introduced from the oxide semiconductor layers 452 and 462 to the oxide insulating layers 456 and 466; thus, normally-off thin film transistors can be obtained. Therefore, reliability of the semiconductor device can be improved.

Note that by forming the high-resistance drain regions 454b and 464b (or the high-resistance source regions 454a and 464a) in the oxide semiconductor layers 452 and 462 overlapping with the drain electrode layers 455b and 465b (and the source electrode layers 455a and 465a), reliability of the thin film transistors 450 and 460 can be improved. Specifically, by forming the high-resistance drain regions 454b and 464b, the structure can be obtained in which conductivities of the drain electrode layers 455b and 465b, the high-resistance drain regions 454b and 464b, and the channel formation regions 453 and 463 vary stepwise. Therefore, in the case where operation is performed with the drain electrode layers 455b and 465b connected to a wiring for supplying a high power potential VDD, the high-resistance drain regions 454b and 464b serve as buffers and a high electric field is not applied locally even if the high electric field is applied between the gate electrode layer 451 and the drain electrode layer 455b and between the gate electrode layer 461 and the drain electrode layer 465b; thus, withstand voltage of the transistor can be increased.

A protective insulating layer 403 is formed over the source electrode layers 455a and 465a, the drain electrode layers 455b and 465b, and the oxide insulating layers 456 and 466. In this embodiment, the protective insulating layer 403 is formed using a silicon nitride film (see FIG. 5D).

Alternatively, an oxide insulating layer may be further formed over the source electrode layers 455a and 465a, the drain electrode layers 455b and 465b, and the oxide insulating layers 456 and 466, and the protective insulating layer 403 may be stacked over the oxide insulating layer. In this embodiment, the planarization insulating layer 404 is formed over the protective insulating layer 403.

Next, a fifth photolithography step is performed. A resist mask is formed and etching is performed selectively to remove parts of the planarization insulating layer 404 and the protective insulating layer 403, so that an opening reaching the drain electrode layer 465b is formed.

Next, a light-transmitting conductive film is formed, and a sixth photolithography step is performed. A resist mask is formed and unnecessary portions are removed by etching, whereby a pixel electrode layer 467 and a conductive layer 457 are formed. Then, the resist mask is removed (see FIG. 5E).

In this embodiment, the step of forming the opening in the gate insulating layer is not illustrated in a drawing; however, the step of forming an opening in the gate insulating layer may be performed in either the same photolithography step as that of the oxide insulating layer and the protective insulating layer or another photolithography step. When the opening is formed in another photolithography step, the number of photolithography steps is seven.

This embodiment can be implemented in appropriate combination with any of the other embodiments.

As described above, parasitic capacitance is reduced in the semiconductor device including a thin film transistor formed using an oxide semiconductor layer and thus, low power consumption of the semiconductor device can be achieved.

In addition, the semiconductor device including a thin film transistor formed using an oxide semiconductor layer can have high reliability.

Embodiment 5

This embodiment describes another example of thin film transistors applicable to the semiconductor device disclosed in this specification. Thin film transistors 240 and 260 which are described in this embodiment can be used as the driver circuit thin film transistor 1223 and the pixel thin film transistor 1211 in Embodiment 1, and the thin film transistor 320 in Embodiment 2.

One embodiment of a semiconductor device and a manufacturing method of the semiconductor device is described with reference to FIGS. 6A to 6E.

Although description is given using single-gate thin film transistors as the thin film transistors 240 and 260, multi-gate thin film transistors each including a plurality of channel formation regions may be formed as needed.

A process of manufacturing the thin film transistors 240 and 260 over a substrate 200 is described with reference to FIGS. 6A to 6E.

First, a conductive film is formed over the substrate 200 having an insulating surface, and then, gate electrode layers 241 and 261 are formed in a first photolithography step. In this embodiment, a tungsten film is formed to a thickness of 150 nm by a sputtering method, for the gate electrode layers 241 and 261.

Next, a gate insulating layer 292 is formed over the gate electrode layers 241 and 261. In this embodiment, a silicon oxynitride layer is formed to a thickness of 100 nm by a plasma CVD method as the gate insulating layer 292.

Next, a metal conductive film is formed over the gate insulating layer 292, and a second photolithography step is performed. A resist mask is formed over the metal conductive film and etching is performed selectively, whereby source electrode layers 245a and 265a and drain electrode layers 245b and 265b are formed. After that, the resist mask is removed (see FIG. 6A).

Figure 6A:
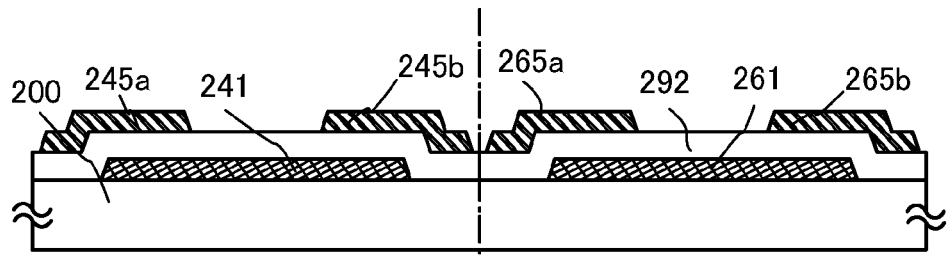
FIGS. 6A to 6E illustrate a method for manufacturing a semiconductor device.
Figure 6B:
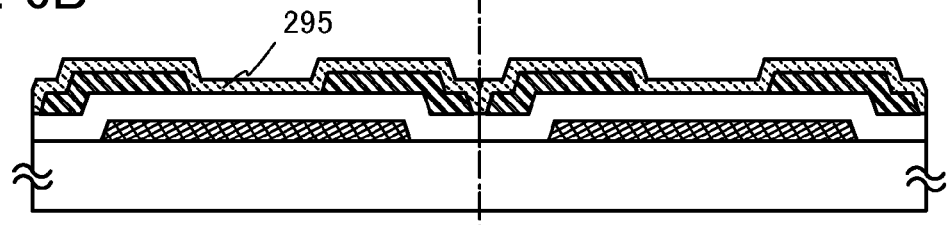

Next, an oxide semiconductor layer 295 is formed (see FIG. 6B). In this embodiment, the oxide semiconductor layer 295 is formed using an In—Ga—Zn—O based metal oxide target by a sputtering method. The oxide semiconductor layer 295 is processed into island-like oxide semiconductor layers in a third photolithography step.

Figure 6C:
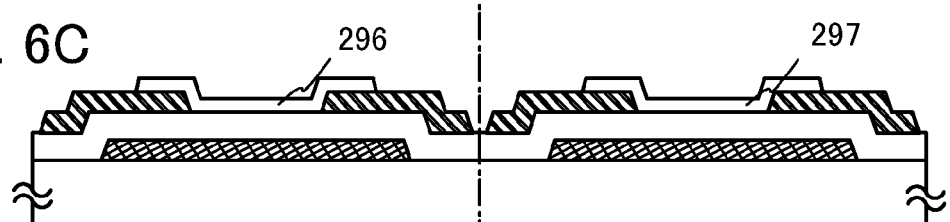
Figure 6D:
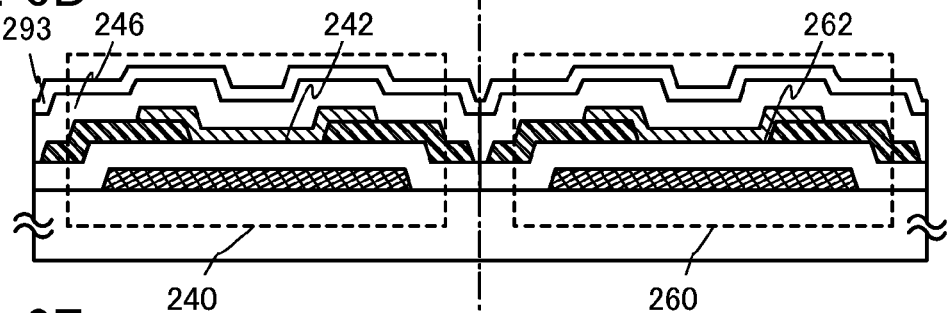
Figure 6E:
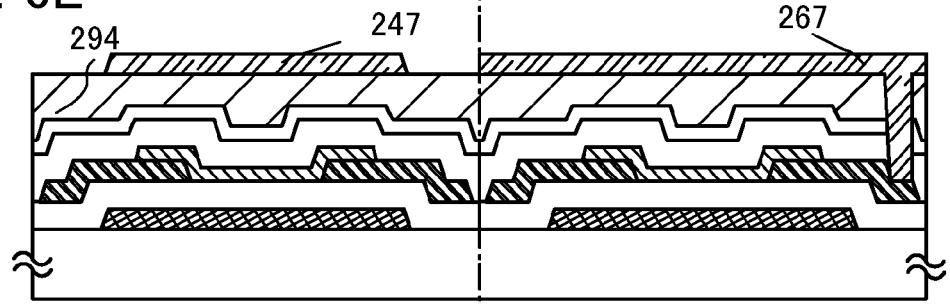

Next, the oxide semiconductor layers are subjected to dehydration or dehydrogenation. The temperature of the first heat treatment for dehydration or dehydrogenation is higher than or equal to 400° C. and lower than or equal to 750° C., preferably higher than or equal to 400° C. and lower than the strain point of the substrate. Here, the substrate is introduced into an electric furnace which is one of heat treatment apparatuses, heat treatment is performed on the oxide semiconductor layer in a nitrogen atmosphere at 450° C. for one hour, and then, the oxide semiconductor layer is not exposed to the air so that entry of water and hydrogen into the oxide semiconductor layer is prevented. Thus, oxide semiconductor layers 296 and 297 are obtained (FIG. 6C).

Alternatively, as the first heat treatment, GRTA may be performed as follows. The substrate is placed in an inert gas which has been heated to a high temperature of 650° C. to 700° C., heated for several minutes, and transferred and taken out from the inert gas which has been heated to a high temperature. GRTA makes it possible to perform heat treatment at a high temperature in a short time.

An oxide insulating layer 246 to be a protective insulating film is formed in contact with the oxide semiconductor layers 296 and 297.

The oxide insulating layer 246 can be formed to a thickness of at least 1 nm by a method in which impurities such as water and hydrogen do not enter the oxide insulating layer 246, such as a sputtering method. When hydrogen is contained in the oxide insulating layer 246, entry of the hydrogen to the oxide semiconductor layers 296 and 297 or abstraction of oxygen in the oxide semiconductor layers 296 and 297 by the hydrogen is caused, thereby making backchannels of the oxide semiconductor layers 296 and 297 have a lower resistance (have an n-type conductivity) and forming parasitic channels. Therefore, it is important that a film formation method in which hydrogen is not used be employed in order to form the oxide insulating layer 246 containing as little hydrogen as possible.

In this embodiment, a silicon oxide film is formed to a thickness of 200 nm as the oxide insulating layer 246 by a sputtering method. The substrate temperature in deposition may be from a room temperature to 300° C. and is 100° C. in this embodiment. The silicon oxide film can be formed by a sputtering method in a rare gas (typically argon) atmosphere, an oxygen atmosphere, or an atmosphere containing a rare gas (typically argon) and oxygen. As a target, a silicon oxide target or a silicon target can be used. For example, the silicon oxide film can be formed using a silicon target by a sputtering method in an atmosphere containing oxygen and nitrogen. For the oxide insulating layer 246 formed in contact with the oxide semiconductor layers 296 and 297 having reduced resistance, an inorganic insulating film that does not contain impurities such as moisture, a hydrogen ion, and OH⁻ and blocks entry of such impurities from the outside is used. Typically, a silicon oxide film, a silicon nitride oxide film, an aluminum oxide film, an aluminum oxynitride film, or the like is used.

Next, second heat treatment (preferably from 200° C. to 400° C., for example, from 250° C. to 350° C.) is performed in an inert gas atmosphere or an oxygen atmosphere. For example, the second heat treatment is performed in a nitrogen atmosphere at 250° C. for one hour. In the second heat treatment, part of the oxide semiconductor layers 296 and 297 (channel formation region) is heated while in contact with the oxide insulating layer 246.

Through the above steps, the oxide semiconductor layers 296 and 297 are decreased in resistance by the heat treatment for dehydration or dehydrogenation, and then the oxide semiconductor layers 296 and 297 are changed to an oxygen excess state. As a result, i-type oxide semiconductor layers 242 and 262 are formed. Thus, the thin film transistors 240 and 260 are formed.

Further, heat treatment may be performed at 100° C. to 200° C. for from one hour to 30 hours in the air. In this embodiment, the heat treatment is performed at 150° C. for 10 hours. This heat treatment may be performed at a fixed heating temperature. Alternatively, the following temperature cycle may be applied plural times repeatedly: the temperature is increased from a room temperature to a temperature of 100° C. to 200° C. and then decreased to a room temperature. Further, this heat treatment may be performed under a reduced pressure before formation of the oxide insulating film 246. Under a reduced pressure, the heating time can be shortened. With such heat treatment, hydrogen is introduced from the oxide semiconductor layers to the oxide insulating layers; thus, normally-off thin film transistors can be obtained. Therefore, reliability of the semiconductor device can be improved.

A protective insulating layer 293 may be further formed over the oxide insulating layer 246. For example, a silicon nitride film is formed by an RF sputtering method. In this embodiment, a protective insulating layer 293 is formed using a silicon nitride film (see FIG. 6D).

A planarization insulating layer 294 for planarization may be provided over the protective insulating layer 293. In this embodiment, a planarization insulating layer 294 is formed over the protective insulating layer 293.

Next, a fourth photolithography step is performed. A resist mask is formed and etching is performed selectively to remove parts of the planarization insulating layer 294, the protective insulating layer 293, and the oxide insulating layer 246, so that an opening reaching the drain electrode layer 265*b* is formed.

Next, a light-transmitting conductive film is formed, and a fifth photolithography step is performed. A resist mask is formed and unnecessary portions are removed by etching, so that a pixel electrode layer 267 and a conductive layer 247 are formed. Then, the resist mask is removed (see FIG. 6E).

In this embodiment, the step of forming the opening in the gate insulating layer is not illustrated in a drawing; however, the step of forming an opening in the gate insulating layer may be performed in either the same photolithography step as that of the oxide insulating layer and the protective insulating layer or another photolithography step. When the opening is formed in another photolithography step, the number of photolithography steps is six.

This embodiment can be implemented in appropriate combination with any of the other embodiments.

As described above, parasitic capacitance is reduced in the semiconductor device including a thin film transistor formed using an oxide semiconductor layer and thus, low power consumption of the semiconductor device can be achieved.

In addition, the semiconductor device including a thin film transistor formed using an oxide semiconductor layer can have high reliability.

Embodiment 6

This embodiment describes another example of thin film transistors applicable to the semiconductor device disclosed in this specification. Thin film transistors 210 and 220 which are described in this embodiment can be used as the driver circuit thin film transistor 1223 and the pixel thin film transistor 1211 in Embodiment 1, and the thin film transistor 320 in Embodiment 2.

In this embodiment, an example of a manufacturing process of a semiconductor device including a thin film transistor, part of which is different from that in Embodiment 3, is described with reference to FIGS. 10A to 10E. FIGS. 10A to 10E are the same as FIGS. 4A to 4E except that part of the process in FIGS. 10A to 10E is different from that in FIGS. 4A to 4E; thus, detailed description of the same portions as those in FIGS. 4A to 4E is omitted. In this embodiment, a mask layer formed using a multi-tone mask is used in photo-lithography steps.

Since a mask layer formed with the use of a multi-tone mask has a plurality of film thicknesses and further can be changed in shape by performing etching on the mask layer, the mask layer can be used in a plurality of etching steps of making different patterns. Therefore, a mask layer corresponding two or more kinds of different patterns can be formed using one multi-tone mask. Thus, the number of photomasks can be reduced and the number of corresponding photolithography steps can be also reduced, whereby simplification of a process can be realized.

In accordance with Embodiment 1, gate electrode layers 211 and 221 are formed over the substrate 200 in a first photolithography step and then, a gate insulating layer 202 is stacked thereover. An oxide semiconductor layer is formed over the gate insulating layer 202. In this embodiment, the oxide semiconductor layer is formed using an In—Ga—Zn—O based metal oxide target by a sputtering method.

In order to perform dehydration or dehydrogenation, the substrate is introduced into an electric furnace which is one of heat treatment apparatuses, and heat treatment is performed on the oxide semiconductor layer in a nitrogen atmosphere at 450° C. for one hour. Then, the oxide semiconductor layer is not exposed to the air so that entry of water and hydrogen into the oxide semiconductor layer is prevented. Thus, an oxide semiconductor layer 230 is obtained (FIG. 10A).

Figure 10A:
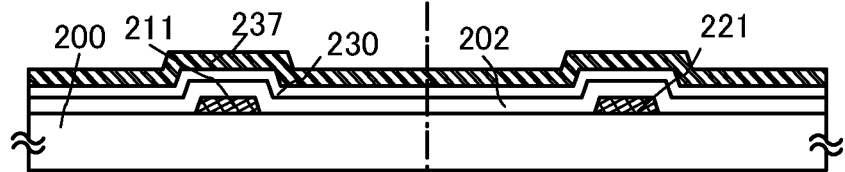
FIGS. 10A to 10E illustrate a method for manufacturing a semiconductor device.

Next, a metal conductive film 237 is formed over the oxide semiconductor layer 230 by a sputtering method or a vacuum evaporation method (see FIG. 10A).

The metal conductive film 237 is a conductive film to be source and drain electrode layers. As a material of the metal conductive film, there are an element selected from Al, Cr, Cu, Ta, Ti, Mo, and W; an alloy containing any of the above elements; an alloy film in which any of the above elements are combined; and the like. Alternatively, one or more materials selected from manganese, magnesium, zirconium, beryllium, and thorium may be used.

In a second photolithography step, resist masks 231a and 231b are formed over the oxide semiconductor layer 230 and the metal conductive film 237.

In this embodiment, an example is described in which light exposure is performed using a multi-tone (high-tone) mask for forming the resist masks 231a and 231b. First, a resist is formed in order to form the resist masks 231a and 231b. As the resist, a positive resist or a negative resist can be used. Here, a positive resist is used. The resist may be formed by a spin coating method or may be selectively formed by an inkjet method. When the resist is selectively formed by an inkjet method, a resist can be prevented from being formed in an unintended portion, which results in reduction of waste of the material.

Next, the resist is irradiated with light with the use of a multi-tone mask 81 as a light-exposure mask, so that the resist is exposed to light.

Here, light exposure using the multi-tone mask 81 is described with reference to FIGS. 20A to 20D.

A multi-tone mask is a mask capable of light exposure of three levels to provide an exposed region, a half-exposed region, and an unexposed region. A multi-tone mask is a light-exposure mask through which light is transmitted to have a plurality of intensities. One-time light exposure and development process allows a resist mask with plural thicknesses (typically, two kinds of thicknesses) to be formed. Therefore, with the use of a multi-tone mask, the number of light-exposure masks can be reduced.

Figure 20A:
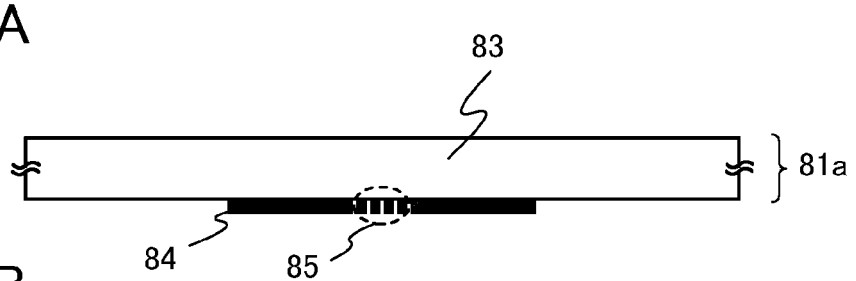
FIGS. 20A to 20D illustrate multi-tone masks.
Figure 20B:
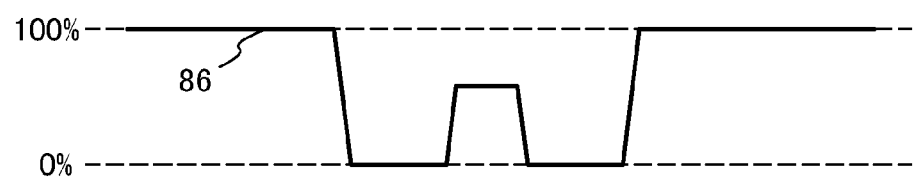
Figure 20C:
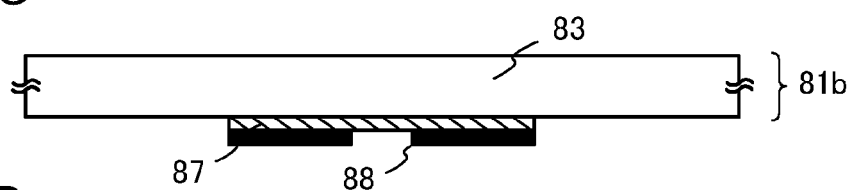

Typical examples of the multi-tone mask include a gray-tone mask 81a illustrated in FIG. 20A and a half-tone mask 81b illustrated in FIG. 20C.

As illustrated in FIG. 20A, the gray-tone mask 81a includes a light-transmitting substrate 83, and a light-blocking portion 84 and a diffraction grating 85 which are formed on the light-transmitting substrate 83. The light transmittance of the light-blocking portion 84 is 0%. Meanwhile, the diffraction grating 85 has a light-transmitting portion in a slit form, a dot form, a mesh form, or the like with intervals that are less than or equal to the resolution limit of light used for the exposure, whereby the light transmittance can be controlled. Note that the diffraction grating 85 can be in a slit form, a dot form, or a mesh form with regular intervals; or in a slit form, a dot form, or a mesh form with irregular intervals.

As the light-transmitting substrate 83, a light-transmitting substrate such as a quartz substrate can be used. The light-blocking portion 84 and the diffraction grating 85 can be formed using a light-blocking material that absorbs light, such as chromium or chromium oxide.

When the gray-tone mask 81a is irradiated with light for exposure, a light transmittance 86 of the light-blocking portion 84 is 0% and the light transmittance 86 of a region where neither the light-blocking portion 84 nor the diffraction grating 85 is provided is 100%, as illustrated in FIG. 20B. The light transmittance 86 of the diffraction grating 85 can be controlled in the range of 10% to 70%. The light transmittance of the diffraction grating 85 can be controlled by adjusting the interval or pitch of slits, dots, or meshes of the diffraction grating.

As illustrated in FIG. 20C, the half-tone mask 81b includes the light-transmitting substrate 83 provided with a semi-light-transmitting portion 87 and a light-blocking portion 88. The semi-light-transmitting portion 87 can be formed using MoSiN, MoSi, MoSiO, MoSiON, CrSi, or the like. The light-blocking portion 88 can be formed using a light-blocking material that absorbs light, such as chromium or chromium oxide.

Figure 20D:
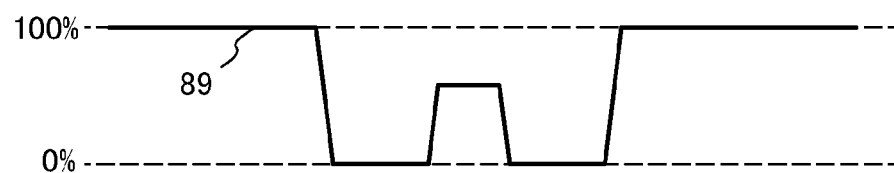

When the half-tone mask 81b is irradiated with light for exposure, a light transmittance 89 of the light-blocking portion 88 is 0% and the light transmittance 89 of a region where neither the light-blocking portion 88 nor the semi-light-transmitting portion 87 is provided is 100%, as illustrated in FIG. 20D. The light transmittance 89 of the semi-light-transmitting portion 87 can be controlled in the range of 10% to 70%. The light transmittance of the semi-light-transmitting portion 87 can be controlled with the material of the semi-light-transmitting portion 87.

Figure 10B:
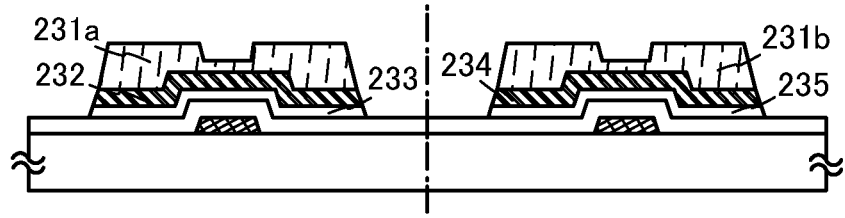

After the light exposure using the multi-tone mask, development is performed, whereby the resist masks 231a and 231b each with regions having different thicknesses can be formed as illustrated in FIG. 10B.

Next, a first etching step is performed using the resist masks 231a and 231b, so that the oxide semiconductor layer 230 and the metal conductive film 237 are etched to have island shapes. As a result, oxide semiconductor layers 233 and 235 and metal conductive layers 232 and 234 can be formed (see FIG. 10B).

Next, the resist masks 231a and 231b are subjected to ashing. Consequently, the areas (the volume, considering three dimensions) and the thicknesses of the resist masks are reduced. At that time, resists of the resist masks in regions with small thicknesses (a region overlapping with part of the gate electrode layer 211 and a region overlapping with part of the gate electrode layer 221) is removed so that separated resist masks 236a, 236b, 236c, and 236d can be formed.

Figure 10C:
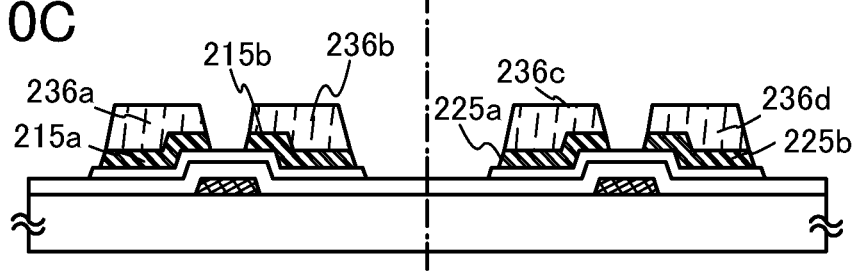
Figure 10D:
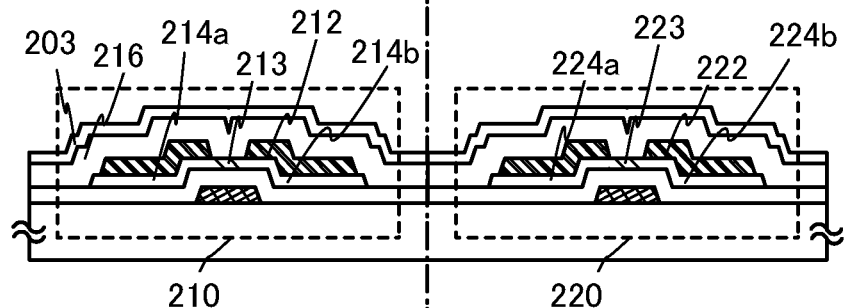
Figure 10E:
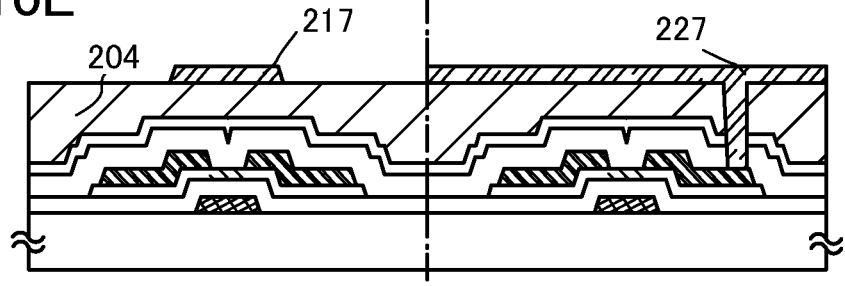

Unnecessary portions are removed by etching with the use of the resist masks 236a, 236b, 236c, and 236d, so that the source electrode layers 215a and 225a and the drain electrode layers 215b and 225b are formed (see FIG. 10C).

Note that materials and etching conditions are adjusted as appropriate so that the oxide semiconductor layers 233 and 235 are not removed by etching of the metal conductive layers 232 and 234.

In this embodiment, a Ti film is used for the metal conductive layers 232 and 234, an In—Ga—Zn—O-based oxide is used for the oxide semiconductor layers 233 and 235, and an ammonia hydrogen peroxide solution (a mixed solution of ammonia, water, and a hydrogen peroxide solution) is used as an etchant.

Note that the etching of the metal conductive layers and the oxide semiconductor layers may be dry etching, without being limited to wet etching.

As an etching gas for dry etching, a gas containing chlorine (chlorine-based gas such as chlorine ($Cl_2$), boron chloride ($BCl_3$), silicon chloride ($SiCl_4$), or carbon tetrachloride ($CCl_4$)) is preferably used.

Alternatively, a gas containing fluorine (fluorine-based gas such as carbon tetrafluoride ($CF_4$), sulfur fluoride ($SF_6$), nitrogen fluoride ($NF_3$), or trifluoromethane ($CHF_3$)); hydrogen bromide (HBr); oxygen ($O_2$); any of these gases to which a rare gas such as helium (He) or argon (Ar) is added; or the like may be used.

As the dry etching method, a parallel plate RIE (reactive ion etching) method or an ICP (inductively coupled plasma) etching method can be used. In order to etch the layers so that they have desired shapes, the etching conditions (the amount of power applied to a coil-shaped electrode, the amount of power applied to an electrode on the substrate side, the temperature of the electrode on the substrate side, and the like) are adjusted as appropriate.

As an etchant used for wet etching, a mixed solution of phosphoric acid, acetic acid, and nitric acid, or the like can be used. Alternatively, ITO07N (produced by Kanto Chemical Co., Inc.) may be used.

The etchant used in the wet etching is removed by cleaning together with the material which is etched off. The waste liquid containing the etchant and the material etched off may be purified and the etched material may be reused. When a material such as indium contained in the oxide semiconductor layer is collected from the waste liquid after the etching and reused, the resources can be efficiently used and the cost can be reduced.

The etching conditions (such as an etchant, etching time, and temperature) are adjusted as appropriate depending on the material so that the material can be etched to have a desired shape.

Next, the resist masks 236a, 236b, 236c, and 236d are removed and an oxide insulating layer 216 to be a protective insulating film is formed in contact with the oxide semiconductor layers 233 and 235. In this embodiment, a silicon oxide film is formed to a thickness of 200 nm by a sputtering method as the oxide insulating layer 216.

Next, second heat treatment (preferably from 200° C. to 400° C., for example, from 250° C. to 350° C.) is performed in an inert gas atmosphere or an oxygen atmosphere. For example, the second heat treatment is performed in a nitrogen atmosphere at 250° C. for one hour. In the second heat treatment, parts of the oxide semiconductor layers (channel formation regions) are heated while in contact with the oxide insulating layer 216.

Through the above steps, the oxide semiconductor layers 233 and 235 are decreased in resistance by the heat treatment for dehydration or dehydrogenation, and then parts of the oxide semiconductor layers 233 and 235 are selectively changed to an oxygen excess state. As a result, a channel formation region 213 which overlaps with the gate electrode layer 211 becomes i-type, and a high-resistance source region 214a which overlaps with the source electrode layer 215a and a high-resistance drain regions 214b which overlaps with the drain electrode layer 215b are formed in a self-aligned manner. Thus, the thin film transistor 210 is formed. In a similar manner, a channel formation region 223 which overlaps with the gate electrode layer 221 becomes i-type, and a high-resistance source region 224a which overlaps with the source electrode layer 225a and a high-resistance drain regions 224b which overlaps with the drain electrode layer 225b are formed in a self-aligned manner. Thus, the thin film transistor 220 is formed.

Further, heat treatment may be performed at 100° C. to 200° C. for from one hour to 30 hours in the air. In this embodiment, the heat treatment is performed at 150° C. for 10 hours. This heat treatment may be performed at a fixed heating temperature. Alternatively, the following temperature cycle may be applied plural times repeatedly: the temperature is increased from a room temperature to a temperature of 100° C. to 200° C. and then decreased to a room temperature. Further, this heat treatment may be performed under a reduced pressure before formation of the oxide insulating layer 216. Under a reduced pressure, the heating time can be shortened. With such heat treatment, hydrogen is introduced from the oxide semiconductor layers 233 and 235 to the oxide insulating layer 216; thus, normally-off thin film transistors can be obtained. Therefore, reliability of the semiconductor device can be improved.

A protective insulating layer 203 is formed over the oxide insulating layer 216. In this embodiment, the protective insulating layer 203 is formed using a silicon nitride film (see FIG. 10D).

A planarization insulating layer for planarization may be provided over the protective insulating layer 203. In this embodiment, a planarization insulating layer 204 is formed over the protective insulating layer 203.

Next, a third photolithography step is performed. A resist mask is formed and etching is performed selectively to remove parts of the planarization insulating layer 204, the protective insulating layer 203, and the oxide insulating layer 216, so that an opening reaching the drain electrode layer 225b is formed.

Next, a light-transmitting conductive film is formed, and a fourth photolithography step is performed. A resist mask is formed and unnecessary portions are removed by etching, whereby a pixel electrode layer 227 and a conductive layer 217 are formed. Then, the resist mask is removed (see FIG. 10E).

In this embodiment, the step of forming the opening in the gate insulating layer is not illustrated in a drawing; however, the step of forming an opening in the gate insulating layer may be performed in either the same photolithography step as that of the oxide insulating layer and the protective insulating layer or another photolithography step. When the opening is formed in another photolithography step, the number of photolithography steps is four.

This embodiment can be implemented in appropriate combination with any of the other embodiments.

As described above, parasitic capacitance is reduced in the semiconductor device including a thin film transistor formed using an oxide semiconductor layer and thus, low power consumption of the semiconductor device can be achieved.

In addition, the semiconductor device including a thin film transistor formed using an oxide semiconductor layer can have high reliability.

Embodiment 7

This embodiment describes another example of thin film transistors applicable to the semiconductor device disclosed in this specification. Thin film transistors 270 and 280 which are described in this embodiment can be used as the driver circuit thin film transistor 1223 and the pixel thin film transistor 1211 in Embodiment 1, and the thin film transistor 320 in Embodiment 2.

Figure 7:
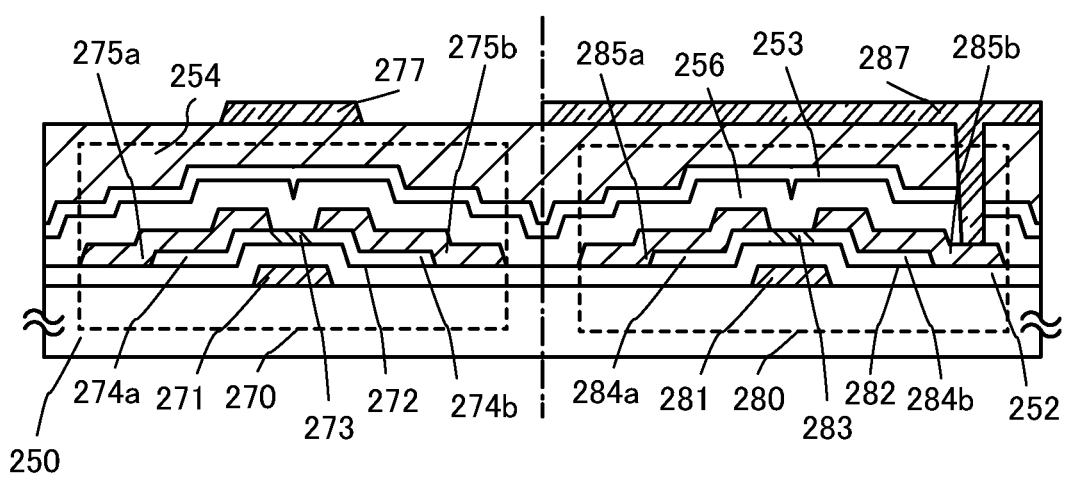
FIG. 7 illustrates a semiconductor device.

This embodiment describes an example in which a gate electrode layer, a source electrode layer, and a drain electrode layer are formed using a light-transmitting conductive material with reference to FIG. 7. Except the gate electrode layer, the source electrode layer, and the drain electrode layer, this embodiment can be implemented in a manner similar to those in the above embodiments; accordingly, repetitive description of the same portions as those of the above embodiments or portions having functions similar to those of the above embodiments and repetitive description of processes similar to those of the above embodiments are omitted.

The thin film transistors 270 and 280 illustrated in FIG. 7 are channel-etched thin film transistors and include, over a substrate 250 having an insulating surface, gate electrode layers 271 and 281; a gate insulating layer 252; an oxide semiconductor layer 272 including a channel formation region 273, a high-resistance source region 274a, and a high-resistance drain region 274b; an oxide semiconductor layer 282 including a channel formation region 283, a high-resistance source region 284a, and a high-resistance drain region 284b; and source and drain electrode layers 275a, 275b, 285a, and 285b. In addition, an oxide insulating layer 256 is provided so as to cover the thin film transistors 270 and 280 and be in contact with the channel formation regions 273 and 283. Moreover, a protective insulating layer 253 and a planarization insulating layer 254 are formed over the oxide insulating layer 256.

In a pixel portion, an opening (contact hole) reaching the source or drain electrode layer 285b is formed so as to penetrate the oxide insulating layer 256, the protective insulating layer 253, and the planarization insulating layer 254, and a pixel electrode layer 287 is formed in and over the opening. On the other hand, in a driver circuit portion, a conductive layer 277 is formed over the planarization insulating layer 254 so as to overlap with the gate electrode layer 271 and the oxide semiconductor layer 272.

In FIG. 7, light-transmitting conductive films are used for the gate electrode layers 271 and 281 and the source and drain electrode layers 275a, 275b, 285a, and 285b of the thin film transistors 270 and 280.

As materials of the gate electrode layers 271 and 281 and the source and drain electrode layers 275a, 275b, 285a, and 285b, any of the following conductive materials which transmit visible light can be used: for example, an In—Sn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, a Sn—Al—Zn—O-based metal oxide, an In—Zn—O-based metal oxide, a Sn—Zn—O-based metal oxide, an Al—Zn—O-based metal oxide, an In—O-based metal oxide, a Sn—O-based metal oxide, and a Zn—O-based metal oxide. The thicknesses of the gate electrode layers 271 and 281 and the source and drain electrode layers 275a, 275b, 285a, and 285b are set as appropriate in the range from 50 nm to 300 nm. As a deposition method of the light-transmitting conductive materials used for the gate electrode layers 271 and 281 and the source and drain electrode layers 275a, 275b, 285a, and 285b, a sputtering method, a vacuum evaporation method (such as an electron beam evaporation method), an arc discharge ion plating method, or a spray method is used. When a sputtering method is used, it is preferable that a target containing $SiO_2$ at from 2 wt % to 10 wt % is used for deposition and the light-transmitting conductive films are made to contain $SiO_x$ (x>0) which suppresses crystallization, so that crystallization by the heat treatment for dehydration or dehydrogenation performed in a later step is prevented.

Thus, the thin film transistors 270 and 280 can be light-transmitting thin film transistors.

In the pixel provided with the thin film transistor 280, a conductive film which transmits visible light is used for the pixel electrode layer 287, another electrode layer (such as a capacitor electrode layer), or a wiring layer (such as a capacitor wiring layer), whereby a display device having a high aperture ratio is realized. It is needless to say that the gate insulating layer 252, the oxide insulating layer 256, the protective insulating layer 253, and the planarization insulating layer 254 are each also preferably formed using a film which transmits visible light.

In this specification, a film which transmits visible light refers to a film with a visible light transmittance of 75% to 100%, and in the case where the film has a conductive property, it is also referred to as a transparent conductive film. Further, a conductive film which is semi-transparent to visible light may be used for a material used for the gate electrode layer, the source electrode layer, the drain electrode layer, the pixel electrode layer, any other electrode layer, or a wiring layer. Being semi-transparent to visible light means that a transmittance of visible light is 50% to 75%.

Since the thin film transistor 280 has a light transmitting property, the aperture ratio can be increased. For small liquid crystal display panels of 10 inches or smaller in particular, a high aperture ratio can be achieved even when the size of pixels is decreased in order to realize higher resolution of display images by increasing the number of gate wirings, for example. Moreover, wide viewing angle is realized by using a light-transmitting film for components in the thin film transistor 280, so that a high aperture ratio can be achieved even when one pixel is divided into a plurality of subpixels. That is, high aperture ratio can be maintained even when thin film transistors are densely arranged, and the display region can have a sufficient area. For example, even when one pixel includes two to four subpixels, the aperture ratio can be increased because the thin film transistor has a light transmitting property. When a storage capacitor is formed using the same steps and the same materials as those of the thin film transistor, the storage capacitor can also have a light-transmitting property; therefore, the aperture ratio can be further increased.

This embodiment can be implemented in appropriate combination with any of the other embodiments.

Embodiment 8

This embodiment describes another example of thin film transistors applicable to the semiconductor device disclosed in this specification. Thin film transistors 470 and 480 which are described in this embodiment can be used as the driver circuit thin film transistor 1223 and the pixel thin film transistor 1211 in Embodiment 1, and the thin film transistor 320 in Embodiment 2.

Figure 8:
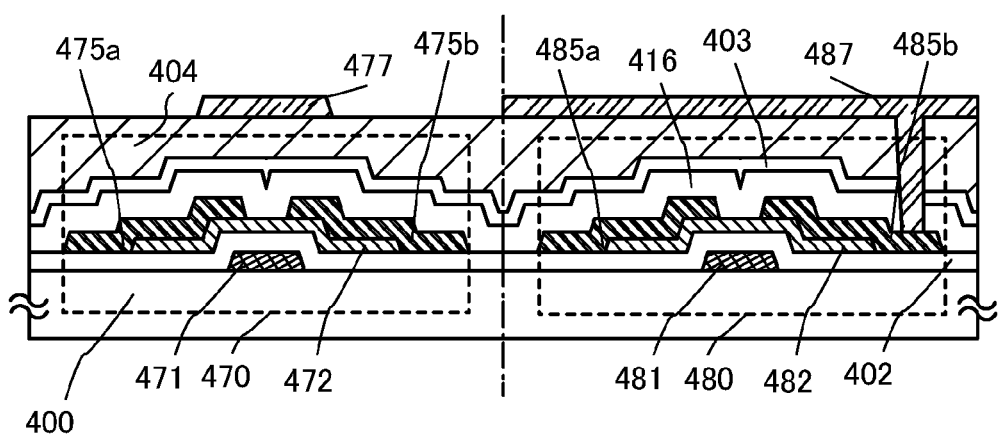
FIG. 8 illustrates a semiconductor device.

This embodiment describes an example which is different from Embodiment 1 in part of the manufacturing process of a thin film transistor with reference to FIG. 8. FIG. 8 is the same as FIGS. 4A to 4E except that part of the process in FIG. 8 is different from that in FIGS. 4A to 4E; thus, the same portions are denoted by common reference numerals, and detailed description of the same portions as those in FIGS. 4A to 4E is omitted.

In accordance with Embodiment 1, gate electrode layers 471 and 481 are formed over the substrate 400 and the gate insulating layer 402 is stacked thereover.

Next, an oxide semiconductor layer is formed and then processed into island-like oxide semiconductor layers in a photolithography step.

Next, the oxide semiconductor layers are subjected to dehydration or dehydrogenation. The temperature of first heat treatment for dehydration or dehydrogenation is higher than or equal to 400° C. and lower than or equal to 750° C., preferably higher than or equal to 425° C. Note that in the case of the temperature that is 425° C. or more, the heat treatment time may be one hour or less, whereas in the case of the temperature less than 425° C., the heat treatment time is longer than one hour. Here, the substrate is introduced into an electric furnace which is one of heat treatment apparatuses, heat treatment is performed on the oxide semiconductor layers in a nitrogen atmosphere, and then, the oxide semiconductor layers are not exposed to the air so that entry of water and hydrogen into the oxide semiconductor layers is prevented. Thus, the oxide semiconductor layers are obtained. After that, a high-purity oxygen gas, a high-purity $N_2O$ gas, or an ultra-dry air (with a dew point of −40° C. or less, preferably −60° C. or less) is introduced into the same furnace and cooling is performed. It is preferable that water, hydrogen, and the like be not contained in the oxygen gas or the $N_2O$ gas. Alternatively, the purity of the oxygen gas or the $N_2O$ gas which is introduced into the heat treatment apparatus is preferably 6N (99.9999%) or more, more preferably 7N (99.99999%) or more (i.e., the impurity concentration of the oxygen gas or the $N_2O$ gas is preferably 1 ppm or lower, more preferably 0.1 ppm or lower).

Note that the heat treatment apparatus is not limited to the electric furnace, and for example, may be an RTA (rapid thermal annealing) apparatus such as a GRTA (gas rapid thermal annealing) apparatus or an LRTA (lamp rapid thermal annealing) apparatus. An LRTA apparatus is an apparatus for heating an object to be processed by radiation of light (electromagnetic waves) emitted from a lamp such as a halogen lamp, a metal halide lamp, a xenon arc lamp, a carbon arc lamp, a high pressure sodium lamp, or a high pressure mercury lamp. An LRTA apparatus may be provided with not only a lamp but also a device for heating an object to be processed by heat conduction or heat radiation from a heater such as a resistance heater. GRTA is a method for performing heat treatment using a high-temperature gas. As the gas, an inert gas which does not react with an object to be processed with heat treatment, such as nitrogen or a rare gas such as argon is used. Alternatively, the heat treatment may be performed at 600° C. to 750° C. for several minutes by an RTA method.

Moreover, after the first heat treatment for dehydration or dehydrogenation, heat treatment may be performed at from 200° C. to 400° C., preferably from 200° C. to 300° C., in an oxygen gas atmosphere or a $N_2O$ gas atmosphere.

The first heat treatment of the oxide semiconductor layer may be performed before processing the oxide semiconductor layer into island-like oxide semiconductor layers. In that case, after the first heat treatment, the substrate is taken out of the heating apparatus and a photolithography step is performed.

Through the above process, an entire region of the oxide semiconductor layer is made to be in an oxygen excess state; thus, the oxide semiconductor layer has higher resistance, that is, the oxide semiconductor layer becomes i-type. Accordingly, oxide semiconductor layers 472 and 482 whose entire regions are i-type are formed.

Next, a metal conductive film is formed over the oxide semiconductor layers 472 and 482, a resist mask is formed by a photolithography step, and the metal conductive film is selectively etched to form source electrode layers 475a and 485a and drain electrode layers 475b and 485b. Then, an oxide insulating layer 416 is formed by a sputtering method. Thus, the thin film transistors 470 and 480 can be formed.

Next, in order to reduce variation in electric characteristics of the thin film transistors, heat treatment (preferably at 150° C. or higher and lower than 350° C.) may be performed in an inert gas atmosphere such as a nitrogen gas atmosphere. For example, the heat treatment is performed in a nitrogen atmosphere at 250° C. for one hour.

Further, heat treatment may be performed at 100° C. to 200° C. for from one hour to 30 hours in the air. In this embodiment, the heat treatment is performed at 150° C. for 10 hours. This heat treatment may be performed at a fixed heating temperature. Alternatively, the following temperature cycle may be applied plural times repeatedly: the temperature is increased from a room temperature to a temperature of 100° C. to 200° C. and then decreased to a room temperature. Further, this heat treatment may be performed under a reduced pressure before formation of the oxide insulating layer 416. Under a reduced pressure, the heating time can be shortened. With such heat treatment, hydrogen is introduced from the oxide semiconductor layers 472 and 482 to the oxide insulating layer 416; thus, normally-off thin film transistors can be obtained. Therefore, reliability of the semiconductor device can be improved.

A protective insulating layer 403 is formed over the oxide insulating layer 416. In this embodiment, the protective insulating layer 403 is formed using a silicon nitride film.

A planarization insulating layer for planarization may be provided over the protective insulating layer 403. In this embodiment, a planarization insulating layer 404 is formed over the protective insulating layer 403.

Next, a photolithography step is performed. A resist mask is formed and etching is performed selectively to remove parts of the planarization insulating layer 404, the protective insulating layer 403, and the oxide insulating layer 416, so that an opening reaching the drain electrode layer 485b is formed.

Next, a light-transmitting conductive film is formed, and a photolithography step is performed. A resist mask is formed and unnecessary portions are removed by etching, whereby a pixel electrode layer 487 and a conductive layer 477 are formed. Then, the resist mask is removed (see FIG. 8).

As described above, parasitic capacitance is reduced in the semiconductor device including a thin film transistor formed using an oxide semiconductor layer and thus, low power consumption of the semiconductor device can be achieved.

In addition, the semiconductor device including a thin film transistor formed using an oxide semiconductor layer can have high reliability.

This embodiment can be implemented in appropriate combination with any of the other embodiments.

Embodiment 9

This embodiment describes another example of thin film transistors applicable to the semiconductor device disclosed in this specification. Thin film transistors 490 and 491 which are described in this embodiment can be used as the driver circuit thin film transistor 1223 and the pixel thin film transistor 1211 in Embodiment 1, and the thin film transistor 320 in Embodiment 2.

Figure 9:
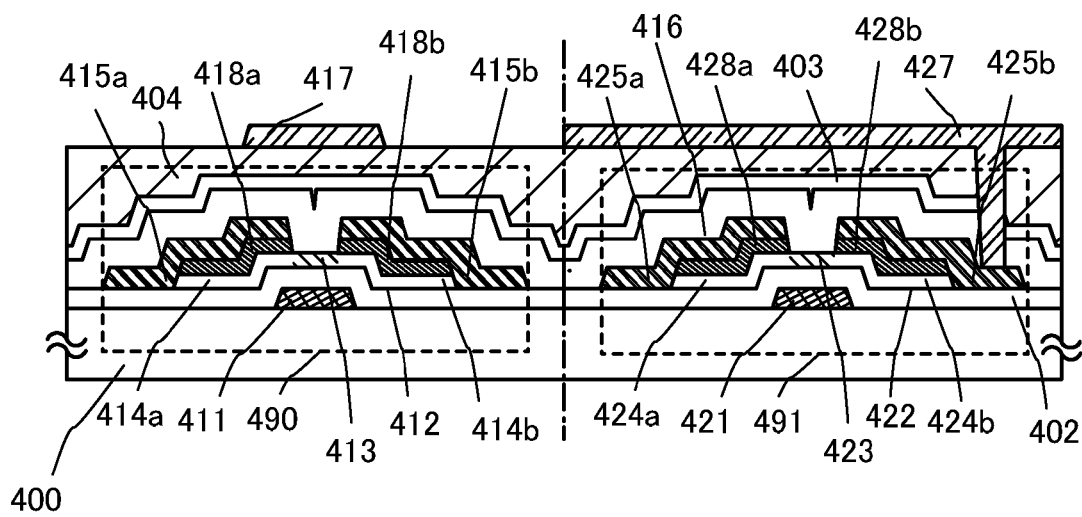
FIG. 9 illustrates a semiconductor device.

In this embodiment, an example in which oxide conductive layers are further provided as a source region and a drain region between the oxide semiconductor layer and the source and drain electrode layers of the thin film transistor of Embodiment 3 is described with reference to FIG. 9. Therefore, this embodiment can be implemented in a manner similar to that of Embodiment 1 other than the formation step of the oxide conductive layers as a source region and a drain region; accordingly, repetitive description of the same portions as those of Embodiment 1 or portions having functions similar to those of Embodiment 1 and repetitive description of steps similar to those of Embodiment 1 are omitted. FIG. 9 is the same as FIGS. 4A to 4E except that there is a difference in part of the process. Therefore, the same portions are denoted by common reference numerals, and specific description of the same portions is omitted.

The thin film transistors 490 and 491 illustrated in FIG. 9 are channel-etched thin film transistors and include, over the substrate 400 having an insulating surface, the gate electrode layers 411 and 421; the gate insulating layer 402; an oxide semiconductor layer 412 including at least the channel formation region 413, the high-resistance source region 414a, and the high-resistance drain region 414b; an oxide semiconductor layer 422 including at least the channel formation region 423, the high-resistance source region 424a, and the high-resistance drain region 424b; oxide conductive layers 418a, 418b, 428a, and 428b; the source electrode layers 415a and 425a; and the drain electrode layers 415b and 425b. In addition, the oxide insulating layer 416 is provided so as to cover the thin film transistors 490 and 491 and be in contact with the channel formation regions 413 and 423. Moreover, the protective insulating layer 403 and the planarization insulating layer 404 are formed over the oxide insulating layer 416.

In accordance with Embodiment 3, the gate electrode layers 411 and 421 are formed over the substrate 400 and the gate insulating layer 402 is stacked thereover. An oxide semiconductor layer is formed over the gate insulating layer 402 and the oxide semiconductor layer is subjected to dehydration or dehydrogenation.

The oxide conductive layers 418a, 418b, 428a, and 428b are formed over the dehydrated or dehydrogenated oxide semiconductor layer. This embodiment describes an example in which the oxide conductive layers 418a, 418b, 428a, and 428b are formed in the same photolithography step as the oxide semiconductor layers 412 and 422; however, the oxide conductive layers 418a, 418b, 428a, and 428b may be formed in the same photolithography step as the source and drain electrode layers 415a, 425a, 415b, and 425b.

As a formation method of the oxide conductive layers 418a, 418b, 428a, and 428b, a sputtering method, a vacuum evaporation method (such as an electron beam evaporation method), an arc discharge ion plating method, or a spray method is used. A material of the oxide conductive layers 418a, 418b, 428a, and 428b preferably contains zinc oxide as a component and preferably does not contain indium oxide. For the oxide conductive layers 418a, 418b, 428a, and 428b, zinc oxide, zinc aluminum oxide, zinc aluminum oxynitride, zinc gallium oxide, or the like can be used. The thicknesses of the oxide conductive layers 418a, 418b, 428a, and 428b are set as appropriate in the range from 50 nm to 300 nm. When a sputtering method is used, it is preferable that a target containing $SiO_2$ at from 2 wt % to 10 wt % is used for deposition and the oxide conductive layers are made to contain $SiO_x$ (x>0) which suppresses crystallization.

In this embodiment, after the oxide conductive layers 418a, 418b, 428a, and 428b are formed in the same photolithography step as the oxide semiconductor layer, the oxide conductive layers are further etched using the source electrode layers 415a and 425a and the drain electrode layers 415b and 425b as masks. Thus, the oxide conductive layers 418a, 418b, 428a, and 428b are formed. The oxide conductive layers 418a, 418b, 428a, and 428b containing zinc oxide as a component can be easily etched using an alkaline solution such as a resist stripping solution, for example.

Etching treatment for dividing the oxide conductive layers to form channel formation regions is performed by utilizing the difference in etching rate between the oxide semiconductor layers and the oxide conductive layers. The oxide conductive layers over the oxide semiconductor layers are selectively etched utilizing a higher etching rate of the oxide conductive layers as compared to that of the oxide semiconductor layers.

Therefore, a resist mask used for formation of the source electrode layers 415a and 425a and the drain electrode layers 415b and 425b is preferably removed in an ashing step. In the case of etching with a stripping solution, etching conditions (the kind of etchant, the concentration, and the etching time) are adjusted as appropriate so that the oxide conductive layers and the oxide semiconductor layers are not etched excessively.

The oxide conductive layers 418b and 428b which are provided between the oxide semiconductor layers 412 and 422 and the drain electrode layers 415b and 425b each also function as a low-resistance drain (LRD) region (also referred to as a low-resistance n-type conductivity (LRN) region). In a similar manner, the oxide conductive layers 418a and 428a which are provided between the oxide semiconductor layers 412 and 422 and the source electrode layers 415a and 425a formed using a metal material each also function as a low-resistance source (LRS) region (also referred to as a low-resistance n-type conductivity (LRN) region). With the structure of the oxide semiconductor layer, the low-resistance drain region, and the drain electrode layer formed using a metal material, withstand voltage of the transistor can be further increased. Specifically, the carrier concentration of the low-resistance drain region is higher than that of the high-resistance drain region (HRD region) and is preferably in the range from $1 \times 10^{20}/cm^3$ to $1 \times 10^{21}/cm^3$.

When the oxide conductive layers are provided as the source region and the drain region between the oxide semiconductor layer and the source and drain electrode layers, the source region and the drain region can have lower resistance and the transistor can operate at high speed. It is effective to use the oxide conductive layers for the source region and the drain region in order to improve frequency characteristics of a peripheral circuit (driver circuit). This is because the contact resistance between a metal electrode (e.g., Ti) and an oxide conductive layer is lower than that between a metal electrode (e.g., Ti) and an oxide semiconductor layer.

There has been a problem in that molybdenum (Mo) used as part of a wiring material (e.g., Mo/Al/Mo) in a semiconductor device has high contact resistance with an oxide semiconductor layer. This is because Mo is less likely to be oxidized and has a weaker effect of abstracting oxygen from the oxide semiconductor layer as compared to Ti, and a contact interface between Mo and the oxide semiconductor layer is not changed to have n-type conductivity. However, even in such a case, the contact resistance can be reduced by interposing an oxide conductive layer between the oxide semiconductor layer and source and drain electrode layers; accordingly, frequency characteristics of a peripheral circuit (driver circuit) can be improved.

The channel length of the thin film transistor is determined at the time of etching the oxide conductive layer; accordingly, the channel length can be further shortened. For example, the channel length (L) is set to a small length from 0.1 µm to 2 µm, so that operation speed can be increased.

Although description is given taking Embodiment 3 as an example, this embodiment can be implemented in appropriate combination with any of the other embodiments.

As described above, parasitic capacitance is reduced in the semiconductor device including a thin film transistor formed using an oxide semiconductor layer and thus, low power consumption of the semiconductor device can be achieved.

In addition, the semiconductor device including a thin film transistor formed using an oxide semiconductor layer can have high reliability.

Embodiment 10

In this embodiment, a liquid crystal display device is described as an example of a semiconductor devices disclosed in this specification.

There is no particular limitation on the semiconductor device disclosed in this specification, and a liquid crystal display device including a TN liquid crystal, an OCB liquid crystal, an STN liquid crystal, a VA liquid crystal, an ECB liquid crystal, a GH liquid crystal, a polymer dispersed liquid crystal, a discotic liquid crystal, or the like can be used. Among them, a normally black liquid crystal panel such as a transmissive liquid crystal display device utilizing a vertical alignment (VA) mode is preferable. Some examples are given as a vertical alignment mode. For example, an MVA (multi-domain vertical alignment) mode, a PVA (patterned vertical alignment) mode, an ASV mode, or the like can be employed.

An example of a VA liquid crystal display device is described below.

A vertical alignment (VA) is a mode for controlling alignment of liquid crystal molecules of a liquid crystal display panel. In the VA liquid crystal display device, liquid crystal molecules are aligned in a vertical direction with respect to a panel surface when no voltage is applied. In this embodiment, in particular, a pixel is divided into some regions (subpixels), and liquid crystal molecules are aligned in different directions in their respective regions. This is referred to as multi-domain or multi-domain design. Liquid crystal display devices of the multi-domain design are described below.

Figure 12:
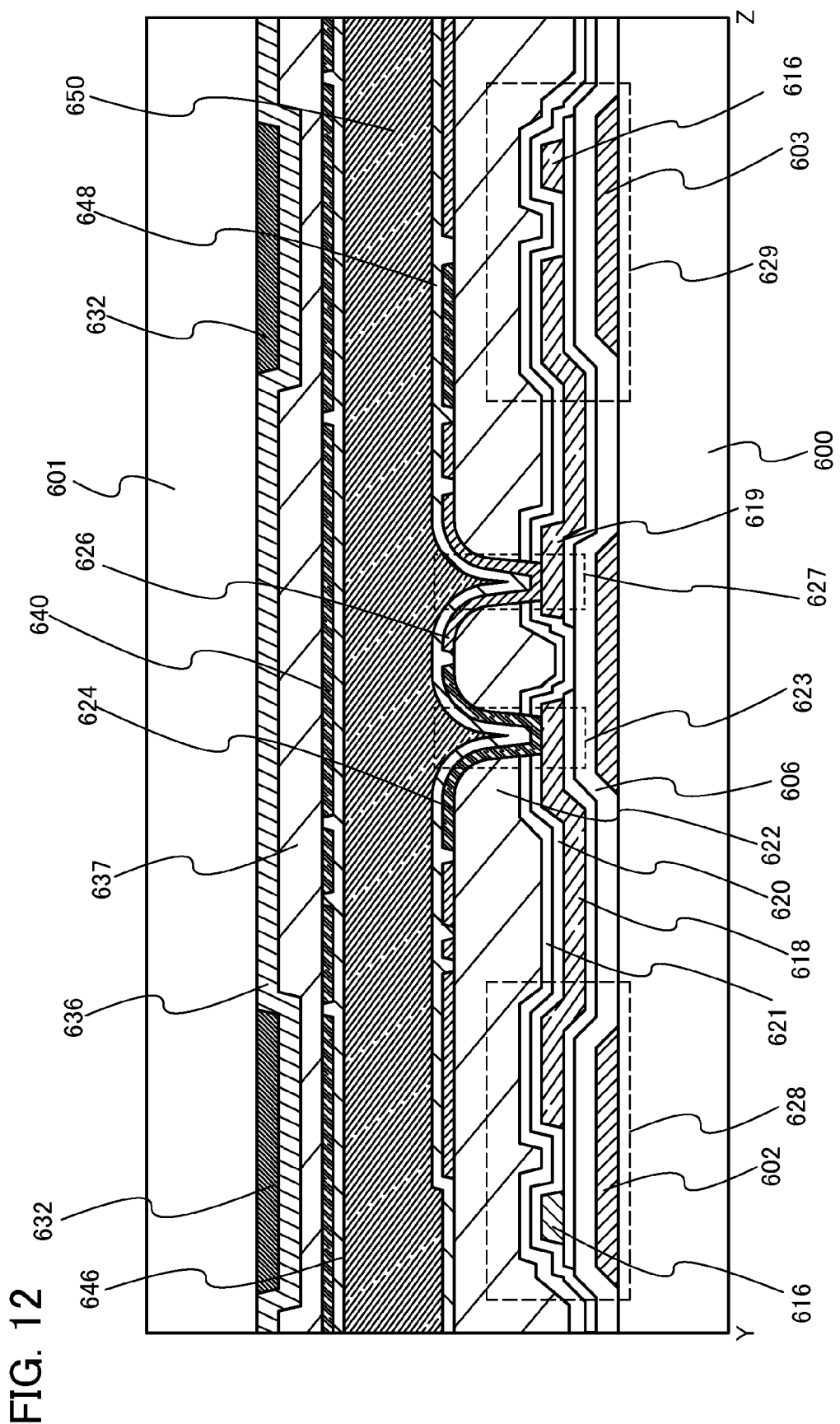
FIG. 12 illustrates a semiconductor device.
Figure 13:
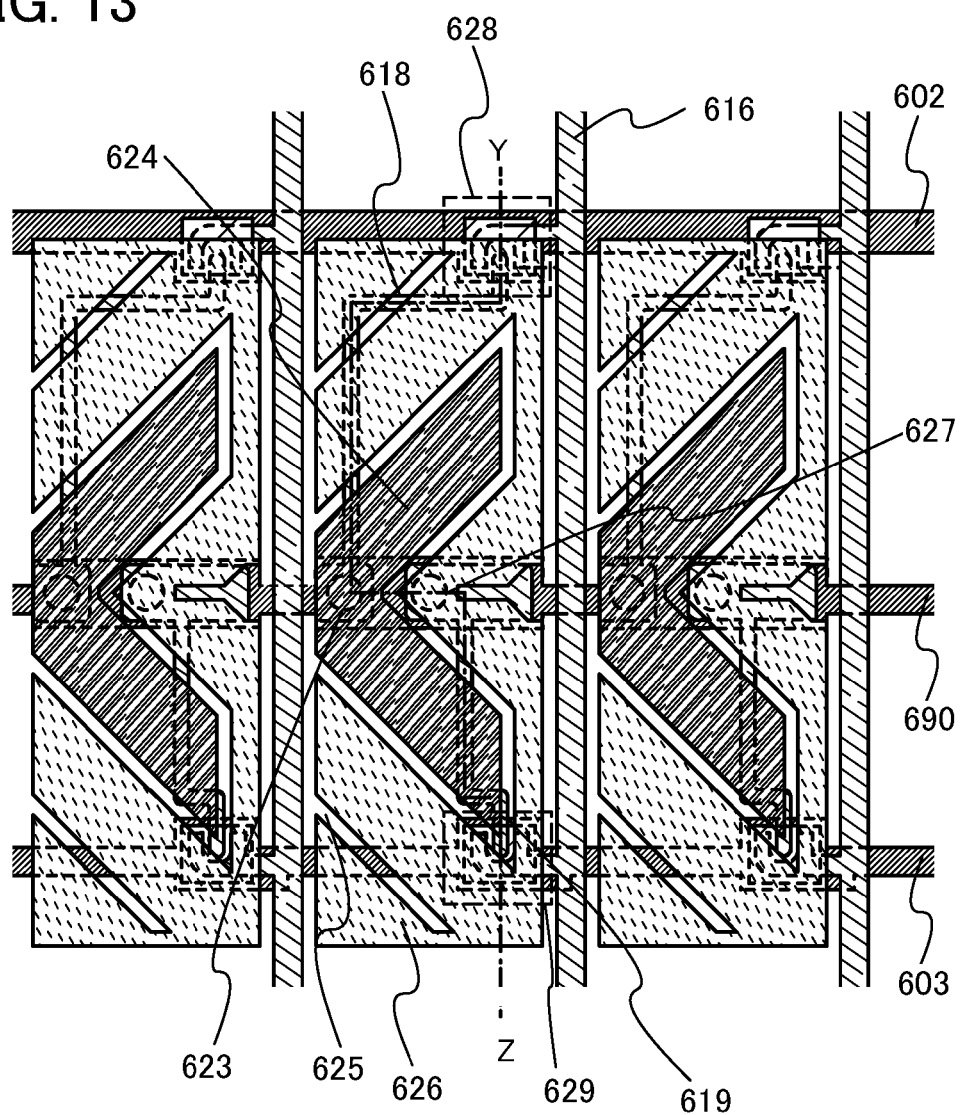
FIG. 13 illustrates a semiconductor device.

FIG. 12 and FIG. 13 illustrate a pixel structure of a VA liquid crystal display panel formed on a substrate 600. FIG. 13 is a plan view of the substrate 600. FIG. 12 illustrates a cross-sectional structure taken along section line Y-Z in FIG. 13.

In this pixel structure, a plurality of pixel electrode layers are provided in one pixel, and a TFT is connected to each of the pixel electrode layers. The plurality of TFTs are driven by different gate signals. In other words, signals applied to individual pixel electrode layers in a multi-domain pixel are controlled independently.

A pixel electrode layer 624 is connected to a source or drain electrode layer 618 of a TFT 628 through a contact hole 623. A pixel electrode layer 626 is connected to a source or drain electrode layer 619 of a TFT 629 through a contact hole 627 penetrating an insulating layer 620, an insulating layer 621 covering the insulating layer 620, and an insulating layer 622 covering the insulating layer 621. A gate wiring 602 of the TFT 628 is separated from a gate wiring 603 of the TFT 629 so that different gate signals can be supplied. On the other hand, a source or drain electrode layer 616 serving as a data line is shared by the TFTs 628 and 629. The thin film transistor described in any of Embodiments 3 to 9 can be used as appropriate as each of the TFTs 628 and 629.

Further, a storage capacitor is formed using a capacitor wiring 690, a gate insulating layer 606 as a dielectric, and a pixel electrode layer or a capacitor electrode electrically connected to the pixel electrode layer.

Figure 15:
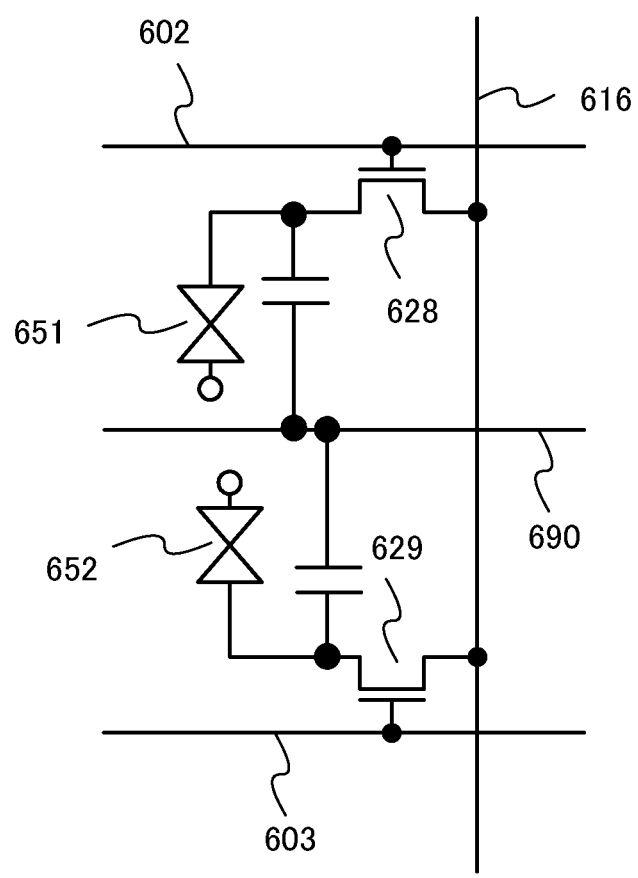
FIG. 15 illustrates a pixel equivalent circuit of a semiconductor device.

The shape of the pixel electrode layer 624 is different from that of the pixel electrode layer 626, and the pixel electrode layer 624 and the pixel electrode layer 626 are separated from each other by a slit 625. The pixel electrode layer 626 is formed so as to surround the external side of the pixel electrode layer 624 which spreads into a V shape. The timings at which voltages are applied to the pixel electrode layers 624 and 626 are made to be different in TFTs 628 and 629, whereby alignment of liquid crystals is controlled. FIG. 15 illustrates an equivalent circuit of this pixel structure. The TFT 628 is connected to the gate wiring 602, and the TFT 629 is connected to the gate wiring 603. When different gate signals are supplied to the gate wirings 602 and 603, the timings of the operations of the TFTs 628 and 629 can vary.

Figure 14:
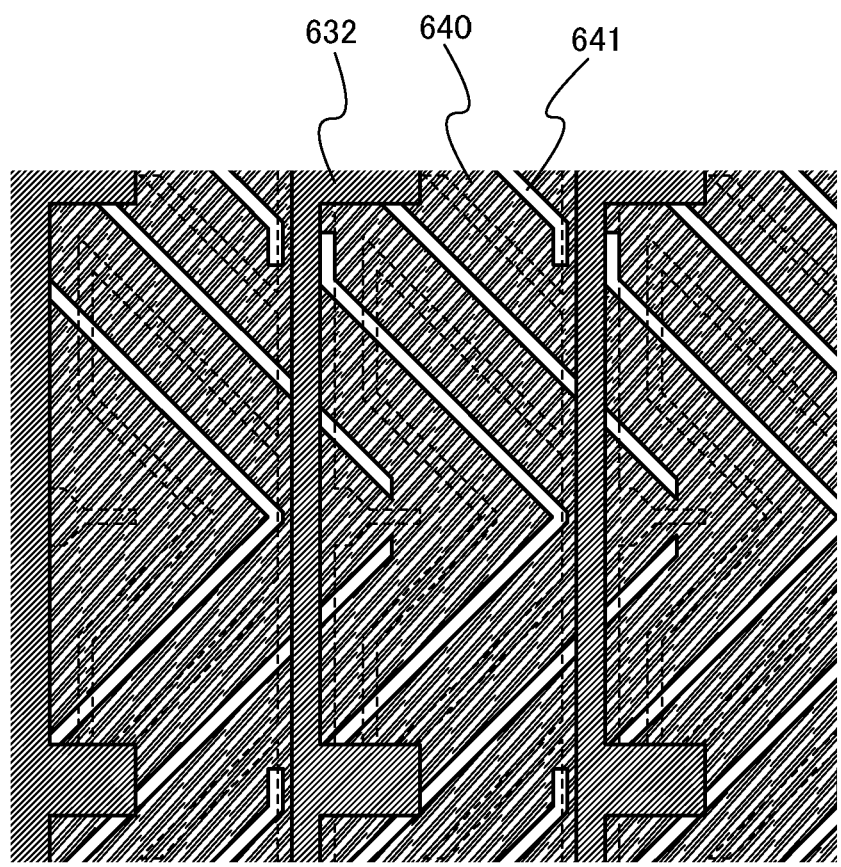
FIG. 14 illustrates a semiconductor device.

A counter substrate 601 is provided with a light-blocking film 632, a coloring film 636, and a counter electrode layer 640. A planarization film 637 which is also called an overcoat film is formed between the coloring film 636 and the counter electrode layer 640 to prevent alignment disorder of the liquid crystals. An alignment film 648 is formed over the pixel electrode layers 624 and 626, and an alignment film 646 is formed on the counter electrode layer 640. FIG. 14 illustrates a planar structure of the counter substrate side. The counter electrode layer 640 is an electrode shared by different pixels and slits 641 are formed. The slits 641 and the slits 625 on the pixel electrode layer 624 and 626 sides are arranged so as not to overlap with each other so that an oblique electric field is effectively generated, whereby the alignment of the liquid crystals can be controlled. Accordingly, the direction of the alignment of the liquid crystals can vary dependent on the location, which leads to a wider viewing angle.

The counter electrode layer 640 is a first counter electrode layer provided in a pixel portion and is at the same potential as a second counter electrode layer, which is provided in a driver circuit portion. By providing the second counter electrode layer over the driver circuit portion, highly reliable semiconductor device with low power consumption can be formed.

The pixel electrode layer 624, a liquid crystal layer 650, and the counter electrode layer 640 overlap with each other to form a first liquid crystal element 651. The pixel electrode layer 626, the liquid crystal layer 650, and the counter electrode layer 640 overlap with each other to form a second liquid crystal element 652. The pixel structure is a multi-domain structure in which the first liquid crystal element 651 and the second liquid crystal element 652 are provided in one pixel.

This embodiment can be implemented in appropriate combination with any of the other embodiments.

Embodiment 11

A semiconductor device disclosed in this specification can be applied to a variety of electronic devices (including game machines). Examples of such electronic devices are a television set (also referred to as a television or a television receiver), a monitor of a computer or the like, a camera such as a digital camera or a digital video camera, a digital photo frame, a mobile phone (also referred to as a mobile phone device), a portable game machine, a portable information terminal, an audio reproducing device, a large-sized game machine such as a pinball machine, and the like.

Figure 16A:
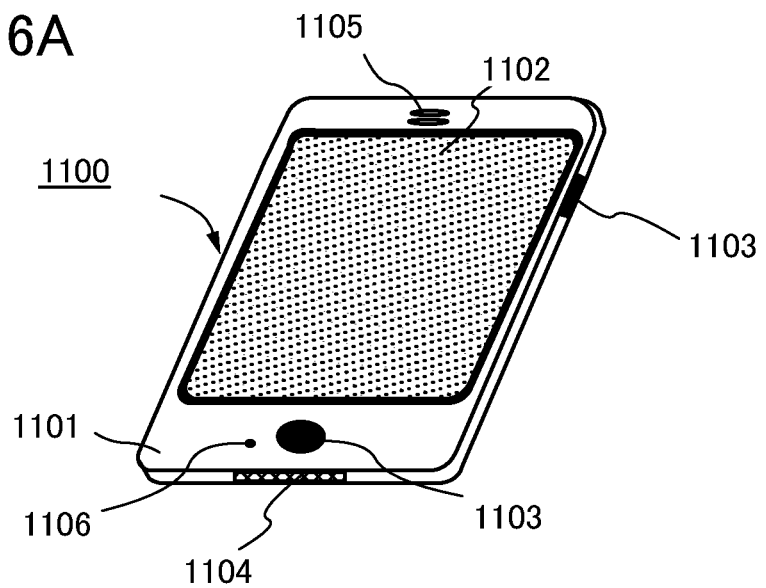
FIGS. 16A and 16B illustrate electronic devices.

FIG. 16A illustrates an example of a mobile phone. A mobile phone 1100 is provided with a display portion 1102 incorporated in a housing 1101, operation buttons 1103, an external connection port 1104, a speaker 1105, a microphone 1106, and the like.

When the display portion 1102 of the mobile phone 1100 illustrated in FIG. 16A is touched with a finger or the like, data can be input into the mobile phone 1100. Further, operations such as making calls and composing mails can be performed by touching the display portion 1102 with a finger or the like.

There are mainly three screen modes of the display portion 1102. The first mode is a display mode mainly for displaying an image. The second mode is an input mode mainly for inputting data such as text. The third mode is a display-and-input mode in which two modes of the display mode and the input mode are combined.

For example, in the case of making a call or composing a mail, a text input mode mainly for inputting text is selected for the display portion 1102 so that text displayed on a screen can be input. In this case, it is preferable to display a keyboard or number buttons on almost all area of the screen of the display portion 1102.

When a detection device including a sensor for detecting inclination, such as a gyroscope or an acceleration sensor, is provided inside the mobile phone 1100, display in the screen of the display portion 1102 can be automatically switched by determining the direction of the mobile phone 1100 (whether the mobile phone 1100 is placed horizontally or vertically for a landscape mode or a portrait mode).

The screen modes are switched by touching the display portion 1102 or operating the operation button 1103 of the housing 1101. Alternatively, the screen modes may be switched depending on the kind of the image displayed on the display portion 1102. For example, when a signal of an image displayed on the display portion is the one of moving image data, the screen mode is switched to the display mode. When the signal is the one of text data, the screen mode is switched to the input mode.

Further, in the input mode, when input by touching the display portion 1102 is not performed for a certain period while a signal detected by the optical sensor in the display portion 1102 is detected, the screen mode may be controlled so as to be switched from the input mode to the display mode.

The display portion 1102 may function as an image sensor. For example, an image of the palm print, the fingerprint, or the like is taken by touching the display portion 1102 with the palm or the finger, whereby personal authentication can be performed. Further, by providing a backlight or sensing light source emitting a near-infrared light for the display portion, an image of a finger vein, a palm vein, or the like can be taken.

In the display portion 1102, the plurality of thin film transistors described in any of the other embodiments are provided as switching elements of pixels.

Figure 16B:
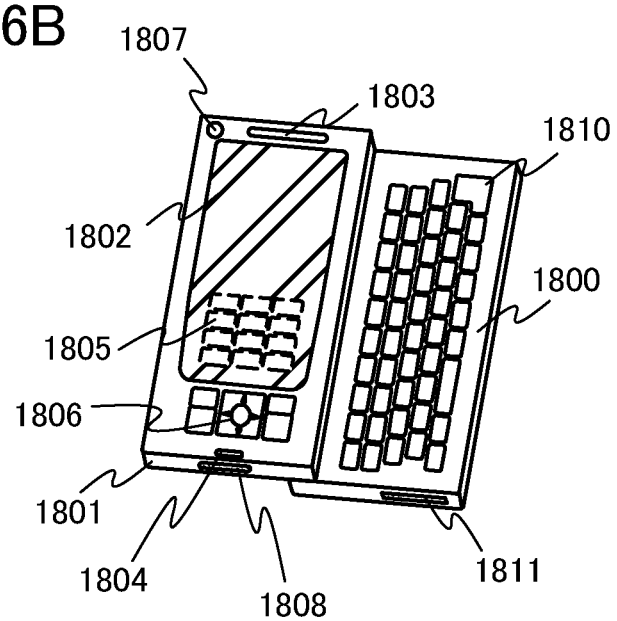

FIG. 16B also illustrates an example of a mobile phone. A portable information terminal whose example is illustrated in FIG. 16B can have a plurality of functions. For example, in addition to a telephone function, such a portable information terminal can have a function of processing a variety of pieces of data by incorporating a computer.

The portable information terminal illustrated in FIG. 16B includes a housing 1800 and a housing 1801. The housing 1801 includes a display panel 1802, a speaker 1803, a microphone 1804, a pointing device 1806, a camera lens 1807, an external connection terminal 1808, and the like. The housing 1800 includes a keyboard 1810, an external memory slot 1811, and the like. In addition, an antenna is incorporated in the housing 1801.

The display panel 1802 is provided with a touch panel. A plurality of operation keys 1805 displayed as images is indicated by dashed lines in FIG. 16B.

Further, in addition to the above structure, a contactless IC chip, a small memory device, or the like may be incorporated.

A light-emitting device can be used for the display panel 1802 and the direction of display is changed appropriately depending on an application mode. Further, the portable information terminal is provided with the camera lens 1807 on the same surface as the display panel 1802, and thus it can be used as a video phone. The speaker 1803 and the microphone 1804 can be used for videophone calls, recording, playing sound, etc. as well as voice calls. Moreover, the housings 1800 and 1801 in a state where they are developed as illustrated in FIG. 16B can be slid so that one is lapped over the other; therefore, the size of the portable information terminal can be reduced, which makes the portable information terminal suitable for being carried.

The external connection terminal 1808 can be connected to an AC adapter and various types of cables such as a USB cable, and charging and data communication with a personal computer are possible. Moreover, a storage medium can be inserted into the external memory slot 1811 so that a large amount of data can be stored and can be moved.

Further, in addition to the above functions, an infrared communication function, a television reception function, or the like may be provided.

Figure 17A:
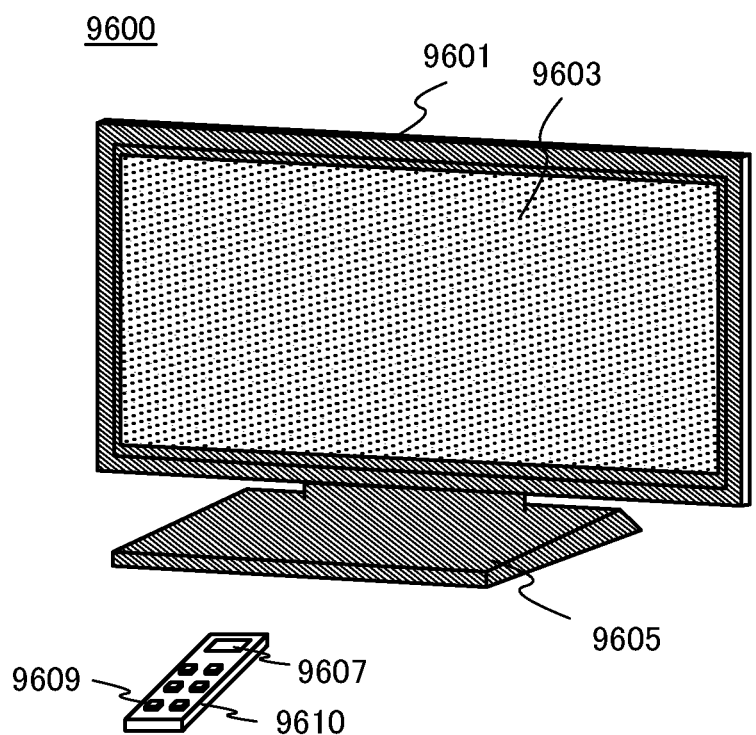
FIGS. 17A and 17B illustrate electronic devices.

FIG. 17A illustrates an example of a television set. In a television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels can be switched and volume can be controlled with operation keys 9609 of the remote controller 9610, whereby an image displayed on the display portion 9603 can be controlled. Moreover, the remote controller 9610 may be provided with a display portion 9607 for displaying data outputted from the remote controller 9610.

Note that the television set 9600 is provided with a receiver, a modem, and the like. With the use of the receiver, general TV broadcasts can be received. Moreover, when the display device is connected to a communication network with or without wires via the modem, one-way (from a sender to a receiver) or two-way (between a sender and a receiver or between receivers) information communication can be performed.

In the display portion 9603, the plurality of thin film transistors described in any of the other embodiments are provided as switching elements of pixels.

Figure 17B:
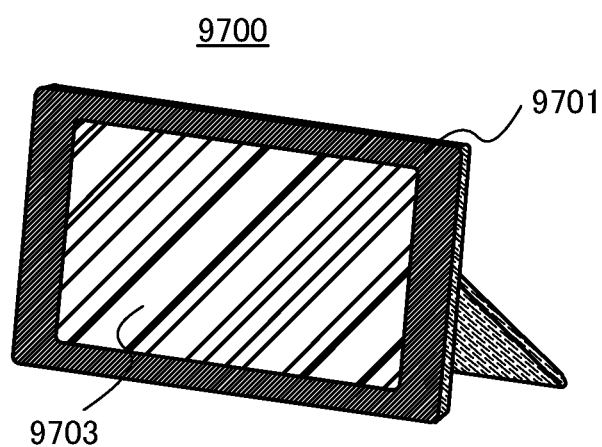

FIG. 17B illustrates an example of a digital photo frame. For example, in a digital photo frame 9700, a display portion 9703 is incorporated in a housing 9701. The display portion 9703 can display a variety of images. For example, the display portion 9703 can display data of an image taken with a digital camera or the like and function as a normal photo frame.

In the display portion 9703, the plurality of thin film transistors described in any of the other embodiments are provided as switching elements of pixels.

Note that the digital photo frame 9700 is provided with an operation portion, an external connection terminal (a USB terminal, a terminal connectable to a variety of cables such as a USB cable, or the like), a recording medium insertion portion, and the like. Although these components may be provided on the same surface as the display portion, it is preferable to provide them on the side surface or the back surface for design aesthetics. For example, a memory storing data of an image taken with a digital camera is inserted in the recording medium insertion portion of the digital photo frame 9700 and the data is loaded, whereby the image can be displayed on the display portion 9703.

The digital photo frame 9700 may be configured to transmit and receive data wirelessly. Through wireless communication, desired image data can be loaded to be displayed.

Figure 18:
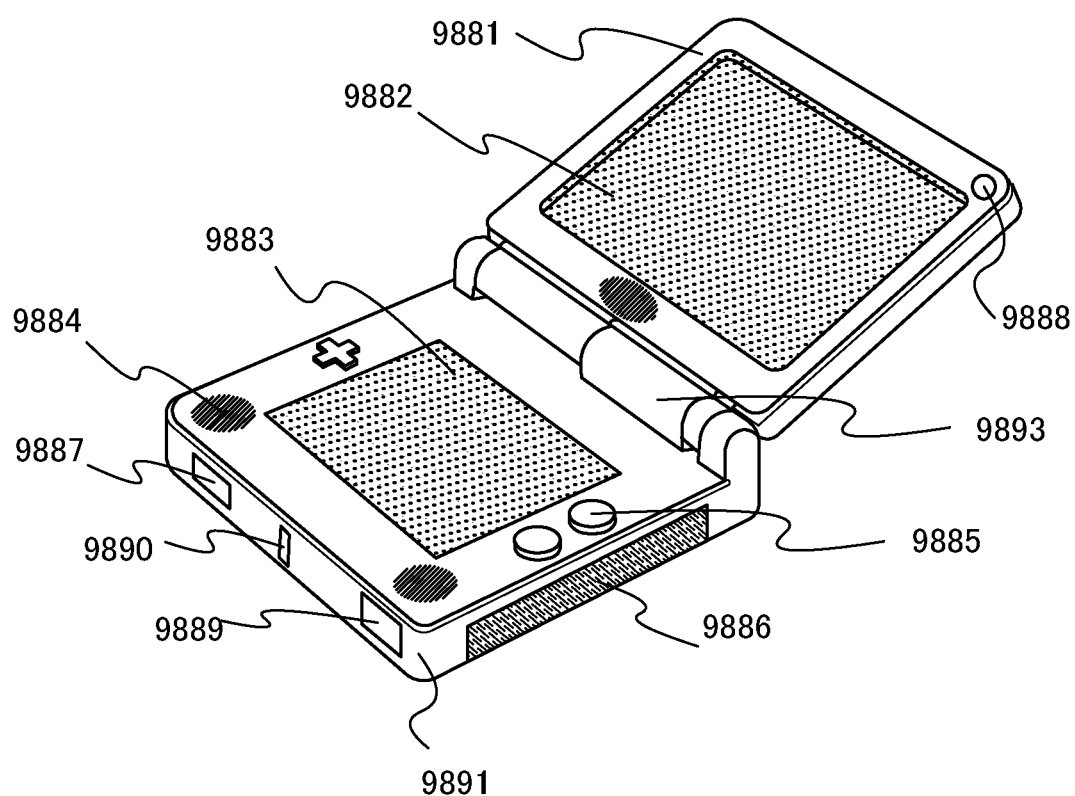
FIG. 18 illustrates an electronic device.

FIG. 18 is a portable game machine and is constituted by two housings of a housing 9881 and a housing 9891 which are connected with a joint portion 9893 so that the portable game machine can be opened or folded. A display portion 9882 and a display portion 9883 are incorporated in the housing 9881 and the housing 9891, respectively.

In the display portion 9883, the plurality of thin film transistors described in any of the other embodiments are provided as switching elements of pixels.

In addition, the portable game machine illustrated in FIG. 18 is provided with a speaker portion 9884, a recording medium insertion portion 9886, an LED lamp 9890, input means (operation keys 9885, a connection terminal 9887, a sensor 9888 (having a function of measuring force, displacement, position, speed, acceleration, angular velocity, rotation number, distance, light, liquid, magnetism, temperature, chemical substance, sound, time, hardness, electric field, current, voltage, electric power, radial ray, flow rate, humidity, gradient, vibration, smell, or infrared ray), and a microphone 9889), and the like. Needless to say, the structure of the portable game machine is not limited to the above and other structures provided with at least a semiconductor device disclosed in this specification can be employed. The portable game machine may include an additional accessory as appropriate. The portable game machine illustrated in FIG. 18 has a function of reading a program or data stored in the recording medium to display it on the display portion, and a function of sharing data with another portable game machine by wireless communication. Note that a function of the portable game machine illustrated in FIG. 18 is not limited to those described above, and the portable game machine can have a variety of functions.

As described above, the semiconductor device described in any one of Embodiments 1 to 10 can be applied to display panels of various electronic devices and thus, the electronic devices can have high reliability.

Embodiment 12

Figure 19:
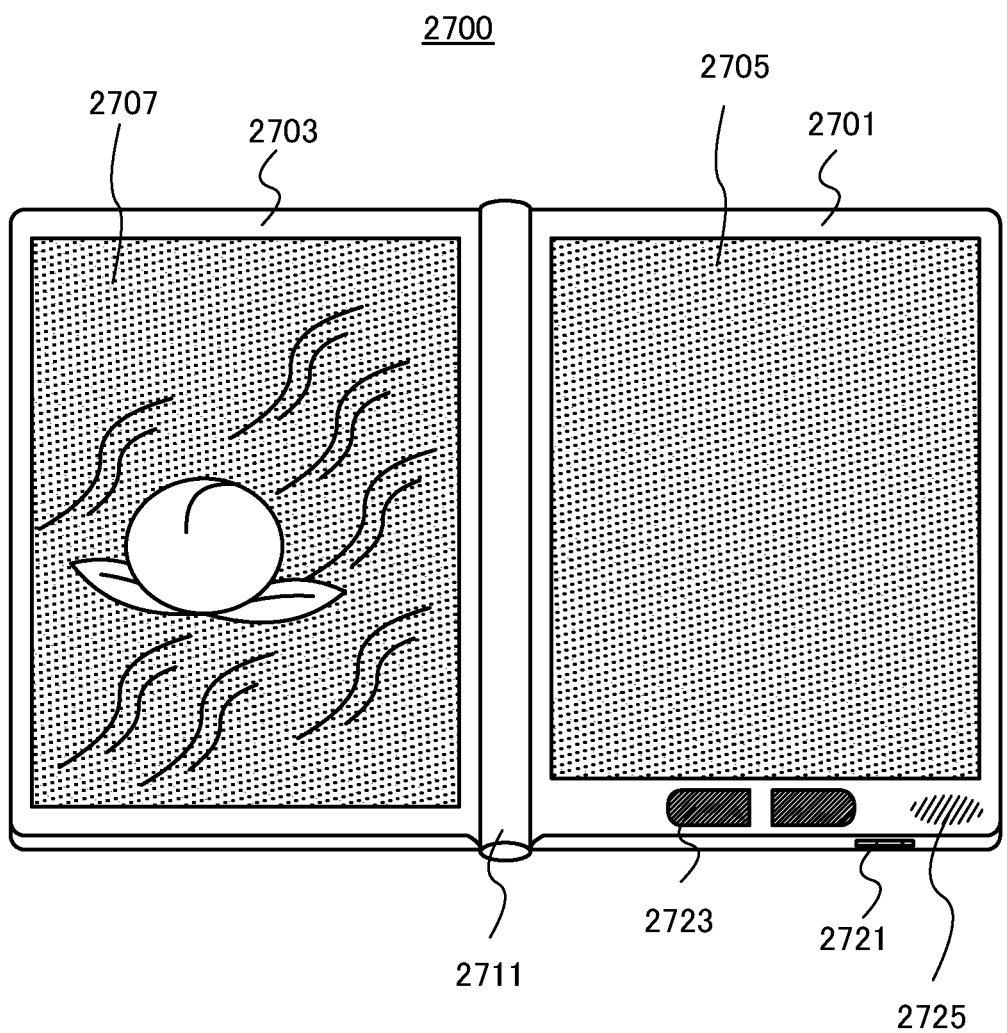
FIG. 19 illustrates an electronic device.

A semiconductor device disclosed in this specification can be applied to an e-book reader (an electronic book), a poster, an advertisement in a vehicle such as a train, or displays of a variety of cards such as a credit card. FIG. 19 illustrates an example of the electronic devices.

FIG. 19 illustrates an example of an e-book reader. For example, an e-book reader 2700 includes two housings of a housing 2701 and a housing 2703. The housing 2701 and the housing 2703 are combined with a hinge 2711 so that the e-book reader 2700 can be opened and closed with the hinge 2711 as an axis. Such a structure enables the e-book reader 2700 to operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right side (the display portion 2705 in FIG. 19) can display text and a display portion on the left side (the display portion 2707 in FIG. 19) can display graphics.

FIG. 19 illustrates an example in which the housing 2701 is provided with an operation portion and the like. For example, the housing 2701 is provided with a power switch 2721, operation keys 2723, a speaker 2725, and the like. Pages can be turned with the operation keys 2723. Note that a keyboard, a pointing device, and the like may be provided on the same surface as the display portion of the housing. Moreover, an external connection terminal (an earphone terminal, a USB terminal, a terminal connectable to a variety of cables such as an AC adapter and a USB cable, or the like), a recording medium insertion portion, and the like may be provided on the back surface or the side surface of the housing. Moreover, the e-book reader 2700 may have a function of an electronic dictionary.

The e-book reader 2700 may be configured to wirelessly transmit and receive data. Through wireless communication, desired book data or the like can be purchased and downloaded from an electronic book server.

This embodiment can be implemented in appropriate combination with any of the other embodiments.

This application is based on Japanese Patent Application serial no. 2009-218998 filed with Japan Patent Office on Sep. 24, 2009, the entire contents of which are hereby incorporated by reference.

REFERENCE NUMERALS

81: multi-tone mask, 81a: gray-tone mask, 81b: half-tone mask, 83: light-transmitting substrate, 84: light-blocking portion, 85: diffraction grating, 86: light transmittance, 87: semi-light-transmitting portion, 88: light-blocking portion, 89: light transmittance, 200: substrate, 202: gate insulating layer, 203: protective insulating layer, 204: planarization insulating layer, 210: thin film transistor, 211: gate electrode layer, 213: channel formation region, 214a: high-resistance source region, 214b: high-resistance drain region, 215a: source electrode layer, 215b: drain electrode layer, 216: oxide insulating layer; 217: conductive layer, 220: thin film transistor, 221: gate electrode layer, 223: channel formation region, 224a: high-resistance source region, 224b: high-resistance drain region, 225a: source electrode layer, 225b: drain electrode layer, 227: pixel electrode layer, 230: oxide semiconductor layer, 231a: resist mask, 231b: resist mask, 232: metal conductive layer, 233: oxide semiconductor layer, 236a: resist mask, 236b: resist mask, 236d: resist mask, 236e: resist mask, 237: metal conductive layer, 240: thin film transistor, 241: gate electrode layer, 242: oxide semiconductor layer, 245a: source electrode layer, 245b: drain electrode layer, 246: oxide insulating layer, 247: conductive layer, 250: substrate, 252: gate insulating layer, 253: protective insulating layer, 254: planarization insulating layer, 256: oxide insulating layer, 261: gate electrode layer, 265a: source electrode layer, 265b: drain electrode layer, 267: pixel electrode layer, 270: thin film transistor, 271: gate electrode layer, 272: oxide semiconductor layer, 273: channel formation region, 274a: high-resistance source region, 274b: high-resistance drain region, 275a: source electrode layer, 275b: drain electrode layer, 284a: high-resistance source region, 284b: high-resistance drain region, 285a: source electrode layer, 285b: drain electrode layer, 277: conductive layer, 280: thin film transistor, 282: oxide semiconductor layer, 283: channel formation region, 287: pixel electrode layer, 292: gate insulating layer, 293: protective insulating layer, 294: planarization insulating layer, 295: oxide semiconductor layer, 296: oxide semiconductor layer, 302: gate insulating layer, 303: protective insulating layer, 306: common electrode layer, 310: common potential line, 320: thin film transistor, 327: pixel electrode layer, 400: substrate, 402: gate insulating layer, 403: protective insulating layer, 404: planarization insulating layer, 410: thin film transistor, 411: gate electrode layer, 412: oxide semiconductor layer, 413: channel formation region, 414a: high-resistance source region, 414b: high-resistance drain region, 415a: source electrode layer, 415b: drain electrode layer, 418a: oxide conductive layer, 418b: oxide conductive layer, 424a: high-resistance source region, 424b: high-resistance drain region, 425a: source electrode layer, 425b: drain electrode layer, 428a: oxide conductive layer, 428b: oxide conductive layer, 454a: high-resistance source region, 454b: high-resistance drain region, 455a: source electrode layer, 455b: drain electrode layer, 465a: source electrode layer, 465b: drain electrode layer, 475a: source electrode layer, 475b: drain electrode layer, 485a: source electrode layer, 485b: drain electrode layer, 416: oxide insulating layer, 417: conductive layer, 420: thin film transistor, 421: gate electrode layer, 422: oxide semiconductor layer, 423: channel formation region, 427: pixel electrode layer, 430: oxide semiconductor layer, 431: oxide semiconductor layer, 450: thin film transistor, 451: gate electrode layer, 452: oxide semiconductor layer, 453: channel formation region, 456: oxide insulating layer, 457: conductive layer, 461: gate electrode layer, 466: oxide insulating layer, 467: pixel electrode layer, 470: thin film transistor, 471: gate electrode layer, 472: oxide semiconductor layer, 487: pixel electrode layer, 490: thin film transistor, 600: substrate, 601: counter substrate, 602: gate wiring, 603: gate wiring, 606: gate insulating layer, 616: drain electrode layer, 618: drain electrode layer, 619: drain electrode layer, 620: insulating layer, 621: insulating layer, 622: insulating layer, 623: contact hole, 624: pixel electrode layer, 625: slit, 626: pixel electrode layer, 627: contact hole, 628: TFT, 629: TFT, 632: light-blocking film, 636: coloring film, 637: planarization film, 640: counter electrode layer, 641: slit, 650: liquid crystal layer, 690: capacitor wiring, 1100: mobile phone, 1101: housing, 1102: display portion, 1103: operation button, 1104: external connection port, 1105: speaker, 1106: microphone, 1200: signal line driver circuit, 1201: scan line driver circuit, 1202: pixel portion, 1204 substrate, 1205: sealing material, 1206: alignment film, 1207: alignment film, 1208: connection wiring, 1210: substrate, 1211: pixel thin film transistor, 1214: insulating layer, 1223: driver circuit thin film transistor, 1235: resin layer, 1240: terminal portion, 1241: connection terminal, 1242: connection wiring, 1243: connection terminal, 1250: pixel electrode layer, 1255: columnar spacer, 1270: conductive particle, 1280: liquid crystal, 1290: polarizing plate, 1291: counter electrode layer, 1292: counter electrode layer, 1293: conductive layer, 1295: polarizing plate, 1501: gate electrode layer, 1502: source wiring layer, 1503: conductive layer, 1504: semiconductor layer, 1505a thin film transistor, 1800: housing, 1801: housing, 1802: display panel, 1803: speaker, 1804: microphone, 1805: operation key, 1806: pointing device, 1807: camera lens, 1808: external connection terminal, 1810: keyboard, 1811: external memory slot, 2700: e-book reader, 2701: housing, 2703: housing, 2705: display portion, 2707: display portion, 2711: hinge, 2721: power switch, 2723: operation key, 2725: speaker, 9600: television device, 9601: housing, 9603: display portion, 9605: stand, 9607: display portion, 9609: operation key, 9610: remote controller, 9700: digital photo frame, 9701: housing, 9703: display portion, 9881: housing, 9882: display portion, 9883: display portion, 9884: speaker portion, 9885: operation key, 9886: recording medium insert portion, 9887: connection terminal, 9888: sensor, 9889: microphone, 9890: LED lamp, 9891: housing, and 9893: joint portion.

The invention claimed is:

1. A semiconductor device comprising:
a substrate;
a driver circuit portion over the substrate, the driver circuit portion including a driver circuit thin film transistor;
a pixel portion over the substrate, the pixel portion including a pixel thin film transistor;
a first counter electrode layer over the pixel portion with a liquid crystal layer interposed between the pixel portion and the first counter electrode layer; and
a second counter electrode layer over the driver circuit portion with the liquid crystal layer interposed between the driver circuit portion and the second counter electrode layer,
wherein the pixel thin film transistor and the driver circuit thin film transistor each include:
a gate electrode layer;
a gate insulating layer over the gate electrode layer;
an oxide semiconductor layer over the gate insulating layer;
a source electrode layer and a drain electrode layer over the oxide semiconductor layer; and
an oxide insulating layer over the oxide semiconductor layer, the source electrode layer, and the drain electrode layer, the oxide insulating layer being in contact with part of the oxide semiconductor layer,
wherein the second counter electrode layer includes a branching comb-like shape, and
wherein the second counter electrode layer overlaps with the driver circuit thin film transistor.

2. The semiconductor device according to claim 1,
wherein the first counter electrode layer and the second counter electrode layer are electrically connected to each other.

3. The semiconductor device according to claim 1,
wherein the second counter electrode layer is at the same potential as the first counter electrode layer.

4. The semiconductor device according to claim 1,
wherein the oxide semiconductor layer comprises a metal oxide represented by a formula of $InMO_3(ZnO)_m$, where M is a metal element selected from Ga, Fe, Ni, Mn, and Co and m is larger than 0.

5. The semiconductor device according to claim 1,
wherein the pixel thin film transistor and the driver circuit thin film transistor further comprise a protective insulating layer over and in contact with the oxide insulating layer.

6. The semiconductor device according to claim 1,
wherein the pixel thin film transistor and the driver circuit thin film transistor further comprise a planarization insulating layer thereover.

7. The semiconductor device according to claim 1,
wherein the gate electrode layer, the source electrode layer, and the drain electrode layer each are transparent.

8. The semiconductor device according to claim 1,
wherein the pixel thin film transistor and the driver circuit thin film transistor further comprise an oxide conductive layer between the oxide semiconductor layer and the source and drain electrode layers.

9. The semiconductor device according to claim 1,
wherein the driver circuit portion further comprises, over the driver circuit thin film transistor, a conductive layer which overlaps with the gate electrode layer and the oxide semiconductor layer of the driver circuit thin film transistor, and
wherein the second counter electrode layer overlaps with the conductive layer.

10. The semiconductor device according to claim 9,
wherein the pixel portion further comprises a pixel electrode layer electrically connected to one of the source electrode layer and the drain electrode layer of the pixel thin film transistor, and
wherein the conductive layer and the pixel electrode layer are transparent.

11. A semiconductor device comprising:
a substrate;
a driver circuit portion over the substrate, the driver circuit portion including a driver circuit thin film transistor;
a pixel portion over the substrate, the pixel portion including a pixel thin film transistor;
a first counter electrode layer over the pixel portion with a liquid crystal layer interposed between the pixel portion and the first counter electrode layer; and
a second counter electrode layer over the driver circuit portion with the liquid crystal layer interposed between the driver circuit portion and the second counter electrode layer,
wherein the pixel thin film transistor and the driver circuit thin film transistor each include:
a gate electrode layer;
a gate insulating layer over the gate electrode layer;
an oxide semiconductor layer over the gate insulating layer;
an oxide insulating layer over and in contact with the oxide semiconductor layer; and
a source electrode layer and a drain electrode layer over the oxide semiconductor layer and the oxide insulating layer, wherein the source electrode layer and the drain electrode layer are in contact with the oxide semiconductor layer and the oxide insulating layer,
wherein the second counter electrode layer includes a branching comb-like shape, and
wherein the second counter electrode layer overlaps with the driver circuit thin film transistor.

12. The semiconductor device according to claim 11,
wherein the first counter electrode layer and the second counter electrode layer are electrically connected to each other.

13. The semiconductor device according to claim 11,
wherein the second counter electrode layer is at the same potential as the first counter electrode layer.

14. The semiconductor device according to claim 11,
wherein the oxide semiconductor layer comprises a metal oxide represented by a formula of $InMO_3(ZnO)_m$, where M is a metal element selected from Ga, Fe, Ni, Mn, and Co and m is larger than 0.

15. The semiconductor device according to claim 11,
wherein the pixel thin film transistor and the driver circuit thin film transistor further comprise a protective insulating layer over and in contact with the oxide insulating layer.

16. The semiconductor device according to claim 11,
wherein the pixel thin film transistor and the driver circuit thin film transistor further comprise a planarization insulating layer thereover.

17. The semiconductor device according to claim 11,
wherein the gate electrode layer, the source electrode layer, and the drain electrode layer each are transparent.

18. The semiconductor device according to claim 11,
wherein the pixel thin film transistor and the driver circuit thin film transistor further comprise an oxide conductive layer between the oxide semiconductor layer and the source and drain electrode layers.

19. The semiconductor device according to claim 11,
wherein the driver circuit portion further comprises, over the driver circuit thin film transistor, a conductive layer which overlaps with the gate electrode layer and the oxide semiconductor layer of the driver circuit thin film transistor, and
wherein the second counter electrode layer overlaps with the conductive layer.

20. The semiconductor device according to claim 19,
wherein the pixel portion further comprises a pixel electrode layer electrically connected to one of the source electrode layer and the drain electrode layer of the pixel thin film transistor, and
wherein the conductive layer and the pixel electrode layer are transparent.

21. A semiconductor device comprising:
a substrate;
a driver circuit portion over the substrate, the driver circuit portion including a driver circuit thin film transistor;
a pixel portion over the substrate, the pixel portion including a pixel thin film transistor;
a first counter electrode layer over the pixel portion with a liquid crystal layer interposed between the pixel portion and the first counter electrode layer; and
a second counter electrode layer over the driver circuit portion with the liquid crystal layer interposed between the driver circuit portion and the second counter electrode layer,
wherein the pixel thin film transistor and the driver circuit thin film transistor each include:
a gate electrode layer;
a gate insulating layer over the gate electrode layer;
a source electrode layer and a drain electrode layer over the gate insulating layer;
an oxide semiconductor layer over and in contact with the gate insulating layer, the source electrode layer, and the drain electrode layer; and
an oxide insulating layer over and in contact with the oxide semiconductor layer,
wherein the second counter electrode layer includes a branching comb-like shape, and
wherein the second counter electrode layer overlaps with the driver circuit thin film transistor.

22. The semiconductor device according to claim 21,
wherein the first counter electrode layer and the second counter electrode layer are electrically connected to each other.

23. The semiconductor device according to claim 21,
wherein the second counter electrode layer is at the same potential as the first counter electrode layer.

24. The semiconductor device according to claim 21,
wherein the oxide semiconductor layer comprises a metal oxide represented by a formula of $InMO_3(ZnO)_m$, where M is a metal element selected from Ga, Fe, Ni, Mn, and Co and m is larger than 0.

25. The semiconductor device according to claim 21,
wherein the pixel thin film transistor and the driver circuit thin film transistor further comprise a protective insulating layer over and in contact with the oxide insulating layer.

26. The semiconductor device according to claim 21,
wherein the pixel thin film transistor and the driver circuit thin film transistor further comprise a planarization insulating layer thereover.

27. The semiconductor device according to claim 21,
wherein the gate electrode layer, the source electrode layer, and the drain electrode layer each are transparent.

28. The semiconductor device according to claim 21,
wherein the driver circuit portion further comprises, over the driver circuit thin film transistor, a conductive layer which overlaps with the gate electrode layer and the oxide semiconductor layer of the driver circuit thin film transistor, and
wherein the second counter electrode layer overlaps with the conductive layer.

29. The semiconductor device according to claim 28,
wherein the pixel portion further comprises a pixel electrode layer electrically connected to one of the source electrode layer and the drain electrode layer of the pixel thin film transistor, and
wherein the conductive layer and the pixel electrode layer are transparent.

30. A semiconductor device comprising:
a first substrate;
a driver circuit portion over the first substrate, the driver circuit portion including a driver circuit thin film transistor;
a pixel portion over the first substrate, the pixel portion including a pixel thin film transistor;
a liquid crystal layer over the pixel portion and the driver circuit portion; and
a first counter electrode layer and a second counter electrode layer over the liquid crystal layer,
wherein the first counter electrode layer overlaps with the pixel portion,
wherein the second counter electrode layer overlaps with the driver circuit portion,
wherein the pixel thin film transistor and the driver circuit thin film transistor each include an oxide semiconductor layer as a channel formation region,
wherein the second counter electrode layer includes a branching comb-like shape, and
wherein the second counter electrode layer overlaps with the driver circuit thin film transistor.

31. The semiconductor device according to claim 30,
wherein the oxide semiconductor layer comprises a metal oxide represented by a formula of $InMO_3(ZnO)_m$, where M is a metal element selected from Ga, Fe, Ni, Mn, and Co and m is larger than 0.

32. The semiconductor device according to claim 30, further comprising a protective insulating layer over the pixel thin film transistor and the driver circuit thin film transistor.

33. The semiconductor device according to claim 30, further comprising a planarization insulating layer over the pixel thin film transistor and the driver circuit thin film transistor.

34. The semiconductor device according to claim 30, further comprising a conductive layer which overlaps with the driver circuit thin film transistor,
wherein the second counter electrode layer overlaps with the conductive layer.

35. The semiconductor device according to claim 34,
wherein the pixel portion further comprises a pixel electrode layer, and
wherein the conductive layer and the pixel electrode layer are transparent.

* * * * *